(12) United States Patent
Khanna et al.

(10) Patent No.: US 8,631,195 B1
(45) Date of Patent: Jan. 14, 2014

(54) CONTENT ADDRESSABLE MEMORY HAVING SELECTIVELY INTERCONNECTED SHIFT REGISTER CIRCUITS

(75) Inventors: Sandeep Khanna, Los Altos, CA (US); Maheshwaran Srinivasan, Santa Clara, CA (US); Mark Birman, Los Altos, CA (US)

(73) Assignee: NetLogic Microsystems, Inc., Irvine, CA (US)

( * ) Notice: Subject to any disclaimer, the term of this patent is extended or adjusted under 35 U.S.C. 154(b) by 1219 days.

(21) Appl. No.: 12/132,053

(22) Filed: Jun. 3, 2008

Related U.S. Application Data

(60) Provisional application No. 60/982,677, filed on Oct. 25, 2007.

(51) Int. Cl.
*G06F 12/00* (2006.01)

(52) U.S. Cl.
USPC .... 711/108; 711/109; 365/49.17; 365/189.02

(58) Field of Classification Search
None
See application file for complete search history.

(56) References Cited

U.S. PATENT DOCUMENTS

| | | | |
|---|---|---|---|
| 4,057,759 A * | 11/1977 | Genova et al. | 375/331 |
| 5,278,981 A | 1/1994 | Kawaguchi et al. | |
| 5,440,715 A | 8/1995 | Wyland | |
| 5,452,451 A | 9/1995 | Akizawa et al. | |
| 5,497,488 A | 3/1996 | Akizawa et al. | |
| 5,712,971 A | 1/1998 | Stanfill et al. | |
| 6,081,440 A | 6/2000 | Washburn et al. | |
| 6,237,061 B1 | 5/2001 | Srinivasan et al. | |
| 6,246,601 B1 | 6/2001 | Pereira | |
| 6,249,467 B1 | 6/2001 | Pereira et al. | |
| 6,252,789 B1 | 6/2001 | Pereira et al. | |
| 6,275,426 B1 | 8/2001 | Srinivasan et al. | |
| 6,460,112 B1 | 10/2002 | Srinivasan et al. | |
| 6,499,081 B1 | 12/2002 | Nataraj et al. | |
| 6,505,270 B1 * | 1/2003 | Voelkel et al. | 711/108 |
| 6,521,994 B1 | 2/2003 | Huse et al. | |
| 6,542,391 B2 | 4/2003 | Pereira et al. | |
| 6,560,670 B1 | 5/2003 | Ichiriu | |
| 6,751,701 B1 | 6/2004 | Pereira | |
| 6,751,755 B1 | 6/2004 | Sywyk et al. | |
| 6,785,677 B1 | 8/2004 | Fritchman | |
| 6,795,892 B1 | 9/2004 | Pereira et al. | |
| 6,799,243 B1 | 9/2004 | Pereira et al. | |
| 6,801,981 B1 | 10/2004 | Pereira et al. | |
| 6,813,680 B1 | 11/2004 | Pereira | |
| 6,865,098 B1 | 3/2005 | Ichiriu et al. | |

(Continued)

OTHER PUBLICATIONS

Shaaban, Lecture Slides for EECC341, Feb. 13, 2002.*

(Continued)

*Primary Examiner* — Sheng-Jen Tsai
*Assistant Examiner* — Ramon A Mercado
(74) *Attorney, Agent, or Firm* — Sterne, Kessler, Goldstein & Fox P.L.L.C.

(57) ABSTRACT

A search system for detecting whether one or more overlapping sequences of input characters match a regular expression including a prefix string preceding an intermediate expression having a quantified number m of characters belonging to a specified character class is disclosed. The search system includes a CAM array for storing the regular expression, a shift register for counting sequences of input characters that match the character class, and a control circuit that enables the shift register in response to a prefix match and increments the shift register in response to character class matches.

20 Claims, 34 Drawing Sheets

(56) References Cited

U.S. PATENT DOCUMENTS

| | | |
|---|---|---|
| 6,892,237 B1 | 5/2005 | Gai et al. |
| 6,892,272 B1 | 5/2005 | Srinivasan et al. |
| 7,050,317 B1 | 5/2006 | Lien et al. |
| 7,069,386 B2 | 6/2006 | Stefan et al. |
| 7,134,143 B2 | 11/2006 | Stellenberg et al. |
| 7,174,441 B2 | 2/2007 | Singh et al. |
| 7,225,188 B1 | 5/2007 | Gai et al. |
| 7,246,198 B2 | 7/2007 | Nataraj et al. |
| 7,353,332 B2 | 4/2008 | Miller et al. |
| 7,624,226 B1 | 11/2009 | Venkatachary et al. |
| 7,643,353 B1 | 1/2010 | Srinivasan et al. ......... 365/49.17 |
| 7,644,080 B2 | 1/2010 | Mammen et al. |
| 7,656,716 B1 | 2/2010 | Srinivasan et al. ......... 365/49.17 |
| 7,660,140 B1 | 2/2010 | Joshi et al. ................. 365/49.17 |
| 7,787,275 B1 | 8/2010 | Birman et al. ............... 365/49.1 |
| 7,821,844 B2 | 10/2010 | Srinivasan et al. |
| 7,826,242 B2 | 11/2010 | Joshi et al. |
| 7,876,590 B2 | 1/2011 | Joshi et al. |
| 7,881,125 B2 | 2/2011 | Srinivasan et al. |
| 7,924,589 B1 | 4/2011 | Srinivasan et al. |
| 2004/0177319 A1 | 9/2004 | Horn |
| 2005/0122972 A1 | 6/2005 | Gruner et al. |
| 2006/0215432 A1 | 9/2006 | Wickeraad et al. |
| 2008/0235792 A1* | 9/2008 | Xing et al. ...................... 726/22 |
| 2010/0054012 A1 | 3/2010 | Srinivasan et al. ......... 365/49.17 |
| 2010/0054013 A1 | 3/2010 | Joshi et al. ................. 365/49.17 |

OTHER PUBLICATIONS

John F. Wakerly. 2000. Digital Design: Principles and Practices (4th ed.). Prentice-Hall, Inc., Upper Saddle River, NJ, USA.*

Babb, J.; Tessier, R.; Dahl, M.; Hanono, S.Z.; Hoki, D.M.; Agarwal, A.; , "Logic emulation with virtual wires," Computer-Aided Design of Integrated Circuits and Systems, IEEE Transactions on , vol. 16, No. 6, pp. 609-626, Jun. 1997.*

A Versatile Data String-Search VLSI; Hirata et al.; IEEE Journal of Solid-State Circuits, vol. 23, No. 2, Apr. 1988, 7 pgs.

Efficient String Matching: An Aid to Bibliographic Search; Programming Techniques; A. Aho and M. Corasick; Bell Laboratories; 1975, 8 pgs.

Fast Routing Table Lookup Using CAMs; McAuley et al.; Morristown, NJ, USA; 1993; 10 pgs.

Gigabit Rate Packet Pattern-Matching Using TCAM; Fang Yu, Randy Katcz EECS Dept. UC Berkeley, T.V. Lakshman, Bell Laboratories; date at least earlier than Jun. 3, 2008; 10 pgs.

High Speed Pattern Matching for Network IDS/IPS; Alicherry et al.; Lucent Bell Laboratories; IEEE, 2006, 10 pgs.

Small Forwarding Tables for Fast Routing Lookups; Degermark et al.; Lulea University of Technology; Lulea, Sweden; 1997; 12 pgs.

Notice of Allowance Nov. 3, 2009 for U.S. Appl. No. 12/131,992, 12 pages.

Non-Final Office Action Sep. 10, 2010 for U.S. Appl. No. 12/352,528, 17 pages.

Notice of Allowance Sep. 8, 2010 for U.S. Appl. No. 12/619,607, 14 pages.

Notice of Allowance Nov. 19, 2009 for U.S. Appl. No. 12/341,754, 15 pages.

Co-pending, U.S. Appl. No. 12/832,862 inventor Starovoitov, filed Jul. 8, 2010 (Not Published).

* cited by examiner

REG1 = "ab(cd|ef|gh)uv"

CONTENT ADDRESSABLE MEMORY HAVING SELECTIVELY INTERCONNECTED SHIFT REGISTER CIRCUITS

CROSS-REFERENCE TO RELATED APPLICATIONS

This application claims the benefit under 35 USC 119(e) of the co-pending and commonly owned U.S. Provisional Application No. 60/982,677 entitled "Content Addressable Memory Device Having Programmable Interconnect Structure" filed on Oct. 25, 2007, which is incorporated by reference herein.

FIELD OF INVENTION

The present invention relates generally to content addressable memory (CAM) devices, and more particularly to CAM devices having an inter-row configurability feature that allows for the interconnection of any number of arbitrarily selected rows without regard to the physical locations of the rows relative to one another.

BACKGROUND OF RELATED ART

A content addressable memory (CAM) system is a storage system that can be instructed to compare a specific pattern of comparand data with data stored in its associative CAM array. The entire CAM array, or segments thereof, is searched in parallel for a match with the comparand data. The CAM device typically includes a priority encoder to translate the highest priority matching location into a match address or CAM index, which is sometimes referred to as the highest priority match (HPM).

The CAM array includes a plurality of rows of CAM cells, where bits stored in a row are typically referred to a data word. U.S. Pat. No. 5,440,715 describes a technique for expanding the width of the data words beyond that of a single row of CAM cells. Multiple data words can be width expanded together to form a data line. It appears, however, that the CAM system of the '715 patent will not always output the correct match address. For example, assume a first data line of two data words ZY is stored in data words 0 and 1, respectively, and a second data line of two data words WZ is stored in data words 2 and 3, respectively. When a comparand data line of WZ is provided for comparison, the first cycle compare with W will indicate a match with data word 2 only. The second cycle compare with Z will indicate a match with data words 0 and 3 and match lines ML0 and ML3 will be activated. When the priority encoder is enabled, it will output a match address of 0 instead of 3 since ML0 is the highest priority match line.

Additionally, it appears that the CAM system of the '715 patent will not always function correctly when each data line has different numbers of data words. For example, assume that a data line of 5 words VWXYZ is loaded into data word locations 0-4, and a data line of 4 words VWXY is loaded into data word locations 5-8. When a comparand data line of VWXY is provided to the CAM array, ML3 and ML8 will both be activated and the priority encoder will incorrectly output an address of three that stores the last word of a five word data line and not the last word of a four word entry.

U.S. Pat. No. 6,252,789 discloses an inter-row configurable CAM device that solves the above-mentioned disadvantages of the CAM system of the '715 patent by including a word expansion logic (WEL) circuit in each row of CAM cells. The WEL controls whether one or more consecutive rows of CAM cells are sequentially connected in a chain to form a data word chain that spans across multiple rows of the CAM array. More specifically, the WELs in all CAM rows that store the data words of the chain are configured to logically combine (e.g., AND) the match signals of the current CAM row and the previous adjacent CAM row and to forward the combined match signals to the next adjacent CAM row, and the WEL in the CAM row that stores the last data word outputs the match signals to the priority encoder. In this manner, the CAM device of the '789 can be configured to perform string match operations on words having very large lengths.

Unfortunately, because the WEL in a CAM row can combine the row's match state only with the match state of an adjacent CAM row to generate an output match signal, and then can route the row's output match signal to only another adjacent CAM row, the row output match states can only be shifted sequentially across the array one row at a time.

Further, because data word chains must be stored in contiguous rows of the '789 CAM array, there may be many available (e.g., un-occupied) rows scattered across the array that cannot be used to store data word chains because the available rows are not contiguous, thereby resulting in unutilized memory area. For example, if there 30 available non-contiguous rows in the '789 CAM array, the only way to store chains having more than one data word is to re-arrange the stored entries to free a block of contiguous rows. Unfortunately, table management tools that re-arrange able contents are burdensome and time consuming.

Further, because match signals from a CAM row in the '789 patent can be routed to only one adjacent row at a time, it is not feasible to store large numbers of regular expressions in the CAM device of the '789 patent. For example, to store the regular expression REG1="ab(cd|ef|gh)uv" in the '789 CAM device, the REG1 must first be unrolled to generate all possible strings that can match REG1, which includes S1="abcduv," S2="abefuv," and S3="abghuv." Then, the individual strings must be stored separately as 3 data word chains in 3 corresponding sets of contiguous CAM rows. Thus, for example, if each CAM row includes 8 CAM cells to store an 8-bit ASCII encoded character, then a first set of 6 contiguous CAM rows of the '789 patent are required to store S1="abcduv," a second set of 6 contiguous CAM rows are required to store S2="abefuv," and a third set of 6 contiguous CAM rows are required to store S3="abghuv," thereby requiring 18 contiguous rows in the '789 patent to store a regular expression that, in its original (e.g., rolled) form, includes only 10 characters.

Thus, there is a need for a device to have the capability to selectively connect any number of arbitrarily selected CAM rows together in a chain so that data words spanning multiple CAM rows can be stored in any available CAM rows in the array, without regard to their physical locations relative to one another. Further, there is a need for a device to have the capability to route the match signals from each CAM row to any number of other arbitrarily selected or located CAM rows at the same time so that regular expressions having logical operators can be stored in the CAM array in their unrolled form, thereby minimizing the amount of CAM rows required to store regular expressions.

BRIEF DESCRIPTION OF THE DRAWINGS

Embodiments of the present invention are illustrated by way of example and not intended to be limited by the figures of the accompanying drawings, where.

Like reference numerals refer to corresponding parts throughout the drawing figures.

DETAILED DESCRIPTION

Figure 1A:
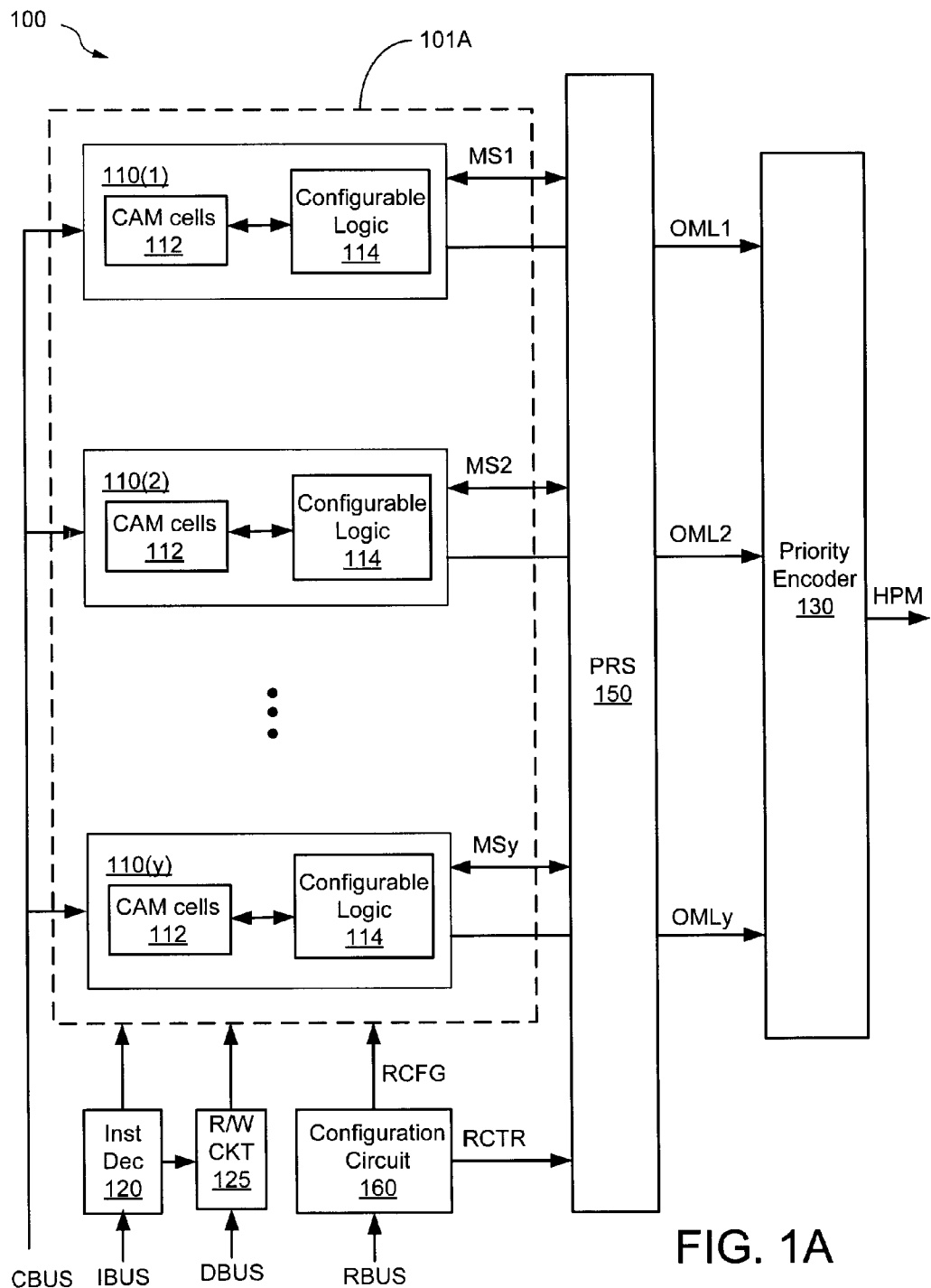
FIG. 1A shows a simplified block diagram of a content addressable memory (CAM) device having a programmable interconnect structure (PRS) connected to CAM rows in accordance with some embodiments of the present invention.

In the following description, numerous specific details are set forth such as examples of specific components, circuits, and processes to provide a thorough understanding of the present invention. In the following description, for purposes of explanation, specific nomenclature is set forth to provide a thorough understanding of the present invention. However, it will be apparent to one skilled in the art that these specific details may not be required to practice the present invention. In other instances, well-known circuits and devices are shown in block diagram form to avoid obscuring the present invention unnecessarily. It should be noted that the steps and operations discussed herein (e.g., the loading of registers) can be performed either synchronously or asynchronously. The term "coupled" as used herein means connected directly to or connected through one or more intervening components or circuits. Any of the signals provided over various buses described herein may be time multiplexed with other signals and provided over one or more common buses. Additionally, the interconnection between circuit elements or blocks may be shown as buses or as single signal lines. Each of the buses may alternatively be a single signal line, and each of the single signal lines may alternatively be buses. Additionally, the prefix symbol "/" or the suffix "B" attached to signal names indicates that the signal is an active low signal. Each of the active low signals may be changed to active high signals as generally known in the art.

A CAM device having a plurality of CAM rows and a programmable interconnect structure (PRS) that can be configured to selectively connect each CAM row to any number of other arbitrarily selected CAM rows is disclosed. The PRS allows data words spanning multiple CAM rows to be stored in any available CAM rows in the array, without regard to their physical locations relative to one another. In this manner, new CAM words spanning multiple CAM rows can be stored in the CAM array without using expensive and time consuming table management tools to re-arrange previously stored data to free a contiguous block of CAM rows. This is in contrast to prior CAM devices having inter-row configurability features that require a data word chain spanning across multiple CAM rows to be stored in a contiguous group of CAM rows.

In addition, because the PRS can be configured to route the match signals from each CAM row to any number of other arbitrarily selected or located CAM rows at the same time (e.g., without having to propagate match signals through adjacent CAM rows in a sequential manner to reach a desired CAM row), CAM arrays of the present invention can store regular expressions having logical operators in their unrolled form, which can significantly minimize the number of CAM rows required to store such regular expressions.

Further, CAM devices in accordance with some embodiments of the present invention include counter circuits embedded in the CAM array and selectively connected to one or more of the CAM rows using the PRS. In this manner, match signals from any number of arbitrarily selected CAM rows can be provided as input signals to the counter circuits, and output signals from the counter circuits can be provided as match input signals to any number of arbitrarily selected CAM rows, thereby allowing CAM devices of the present invention to store and implement search operations for regular expressions that include quantifier values. For other embodiments, shift register circuits configured in accordance with the present invention can be used instead of the counter circuits.

More specifically, because one or more regular expressions can be embodied in hardware as a configurable circuit by programming the CAM rows, counter circuits, and the PRS of the CAM array, embodiments of the present invention can perform regular expression search operations faster than software solutions employing microprocessors that execute microcode embodying the regular expressions. Further, because the PRS provided within CAM arrays of the present invention is dynamically configurable by a user, the user can easily add, delete, and/or modify the regular expressions stored in and searched by CAM devices of the present invention by re-programming the rows of CAM cells and re-configuring the PRS.

FIG. 1A is a functional block diagram of a CAM device 100 according to some embodiments of the present invention. CAM device 100 includes a CAM array 101A, an instruction decoder 120, a read/write circuit 125, a priority encoder 130, a programmable interconnect structure (PRS) 150, and a configuration circuit 160. Other well-known components and control signals, for example, such as an address decoder, comparand register, and clock signals, are not shown for simplicity.

CAM array 101A includes a plurality of rows 110(1)-110(y), each having a number of CAM cells 112 and a configurable logic circuit 114. Each CAM row 110 is coupled to a comparand bus CBUS via a well-known comparand register (not shown for simplicity), and is coupled to the PRS 150 via match signal (MS) lines and to the priority encoder 130 via output match lines (OML). CAM cells 112 can be any suitable type of CAM cells including, for example, binary CAM cells, ternary CAM cells, and/or quaternary CAM cells. For each CAM row 110, the CAM cells 112 are coupled to the configurable logic circuit 114 via match lines (not shown in FIG. 1A for simplicity), which can provide match signals from CAM cells 112 to configurable logic circuit 114, and for some embodiments can also provide match signals from configurable logic circuit 114 as enable signals to CAM cells 112. The configurable logic circuits 114 can be programmed or configured using row configuration data (RCFG) to selectively route match signals to priority encoder 130 via the output match lines (OML), to route the match signals to the PRS 150 via the MS lines, and/or to selectively combine the row match signals with match signals from one or more other CAM rows provided on the MS lines by the PRS 150.

Priority encoder 130, which is well-known, has inputs coupled to the output match lines (OML) from the CAM rows 110, and has an output to generate the index of the highest priority matching CAM row 110 (e.g., the HPM index). Although not shown for simplicity, each row of CAM cells 112 can include a validity bit (V-bit) that indicates whether valid data is stored in the CAM row, and the V-bits can be provided to the priority encoder 130 to determine the next free address in the CAM array for storing new data.

Instruction decoder 120 decodes instructions provided on the instruction bus IBUS, and provides control signals to CAM cells 112 and to read/write circuit 125 that control read, write, and compare operations in CAM array 101A. For other embodiments, instruction decoder 120 can decode the instructions and provide configuration information to configurable logic circuits 114.

Read/write circuit 125, which is well-known, controls read and write operations for CAM array 101A. For example, during write operations, data is provided to read/write circuit 125 via a data bus (DBUS), or alternately from CBUS, and in response to control signals provided by instruction decoder 120, read/write circuit 125 writes the data into the CAM cells 112 of the row or rows selected for the write operation. During read operations, data is output in a well-known manner from one or more selected CAM rows 110 to read/write circuit 125, which in turn provides the data onto DBUS.

The PRS 150 includes a plurality of signal routing lines (not shown individually in FIG. 1A for simplicity) extending across the rows 110 of CAM cells 112 and programmably connected to the match signal (MS) lines in each CAM row 110 in response to routing control signals (RCTR). As explained in more detail below, the RCTR signals control the configuration of a plurality of programmable switch matrixes (not shown in FIG. 1A for simplicity) that selectively connect the MS lines of the various CAM rows 110 to the signal routing lines within the PRS 150. The PRS 150 can be implemented using any suitable circuits and/or logic (e.g., switch matrixes, crossbar circuits, programmable switches, and so on) that selectively routes the row match signals from each CAM row to any number of arbitrarily selected CAM rows (e.g., regardless of whether the selected CAM rows are adjacent to one another) at the same time.

Configuration circuit 160 includes an input coupled to a regular expression bus (RBUS), first outputs coupled to CAM array 101A, and second outputs coupled to the PRS 150. For some embodiments, configuration information (e.g., which can embody one or more regular expressions) can be provided to configuration circuit 160 via RBUS, and in response thereto configuration circuit 160 provides the row configuration information (RCFG) to configurable logic circuits 114 and provides the routing control signals (RCTR) to the PRS 150. For one embodiment, configuration circuit 160 includes a configuration memory (not shown for simplicity in FIG. 1A) for storing RCFG and RCTR information received from RBUS. Together, the RCFG and RCTR information form configuration data that can be used to program the CAM device 100 to implement search operations for one or more regular expressions, as described below.

For other embodiments, RCFG can be provided to row configurable logic circuits 114 using other techniques. For example, for another embodiment, RCFG can be provided to configurable logic circuits 114 using the instruction decoder 120 and/or stored in memory elements (not shown for simplicity) within the CAM rows 110. Similarly, for other embodiments, the RCTR signals can be provided to the PRS 150 using other techniques. For example, for another embodiment, the RCTR signals can be provided to the PRS using the instruction decoder 120 and/or stored in memory elements (not shown for simplicity) within the PRS 150.

In accordance with the present invention, the PRS 150 can be selectively configured to route the match signals from any CAM row 110 as an input match signal to any number of other arbitrarily selected or located CAM rows 110 at the same time, regardless of whether the other selected CAM rows are contiguous with one another. Further, for some embodiments, the PRS 150 can be configured to route match signals from one CAM row as the input match signal to the same row. The input match signals can be used as row enable or trigger signals to selectively enable the CAM rows for subsequent compare operations, and can therefore be used to logically connect a number of arbitrarily selected CAM rows together. As described below, CAM devices employing CAM arrays configured in accordance with present embodiments provide numerous functional and performance advantages over conventional CAM devices.

First, because the PRS can route the match signals from any CAM row 110 in CAM array 101A to any number of arbitrarily selected CAM rows 110 in the array 101A, a data word chain spanning a multiple number N of CAM rows can be stored in any available N CAM rows 110 of CAM array 101A, even if none of the available CAM rows are contiguous or adjacent to each other, by configuring the PRS 150 to logically connect the available CAM rows together to form a data word chain. Thus, for example, if CAM array 101A of FIG. 1A includes 5 available but non-contiguous CAM rows 110, then the PRS 150 can be programmed to logically connect the 5 available CAM rows 110 into a chain that can store a data word chain spanning 5 CAM rows. In contrast, to store a new 5 data word chain (e.g., spanning 5 CAM rows) in the CAM device of U.S. Pat. No. 6,252,789, a block of 5 available and contiguous CAM rows are needed. Thus, if there are 5 available but non-contiguous CAM rows in the CAM device of the '789 patent, the new 5 data word chain can be stored therein only if the existing contents of the CAM array are re-arranged to create a block of 5 available contiguous CAM rows, which as mentioned above requires burdensome and time-consuming table management tools.

Second, by allowing match signals from one CAM row to be routed to any number of selected CAM rows (e.g., including the same CAM row) as input match signals at the same time, embodiments of the present invention can store many regular expressions using significantly fewer numbers of CAM rows than conventional CAM devices. More specifically, because the PRS 150 can simultaneously and independently route the match signals from any CAM row 110 to any number of other CAM rows 110 at the same time, embodiments of CAM device 100 can store a regular expression in its rolled format (e.g., its original form), for example, because each common portion of all the different strings that can match the regular expression can be stored in a corresponding single location (e.g., in one CAM row or one group of CAM rows), and their match signals can be simultaneously routed to multiple other locations that store other non-common portions of the possible matching strings. In contrast, storing a regular expression in CAM devices such as those disclosed in U.S. Pat. No. 6,252,789 requires unrolling the regular expression to generate all possible matching strings of the regular expression, and then storing each of the possible matching strings in a corresponding group of contiguous CAM rows.

Figure 2B:
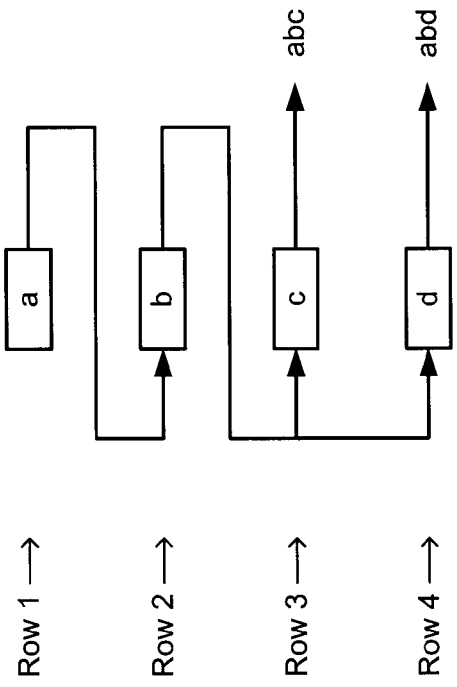
FIG. 2B depicts an exemplary CAM device configured in accordance with present embodiments to store REG2="ab(c|d)" using only 4 CAM rows.
Figure 2A:
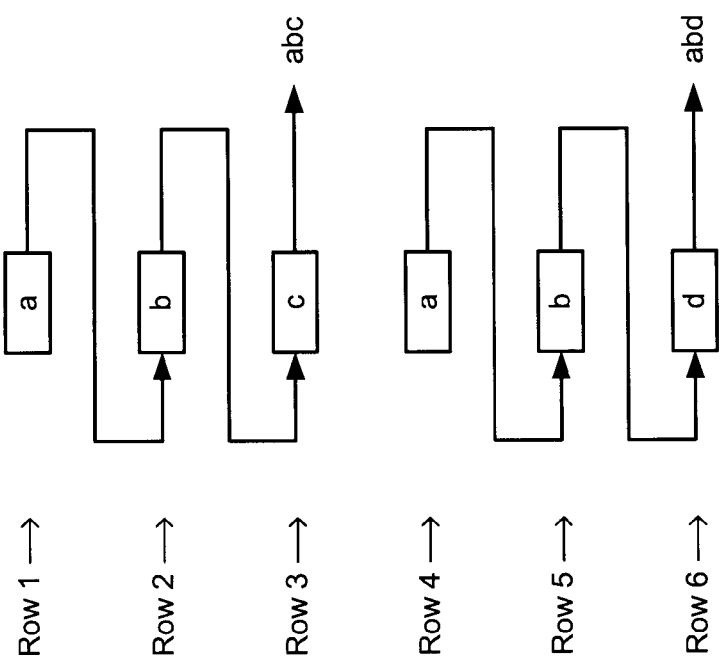
FIG. 2A depicts a prior art CAM device requiring 6 CAM rows to store the regular expression REG2="ab(c|d)"

For example, assuming each CAM row stores one 8-bit ASCII encoded character, the CAM device of the '789 patent requires 6 CAM rows to store the regular expression REG2="ab(c|d)." More specifically, to store REG2="ab(c|d)" in the CAM device of the '789 patent, REG2 is unrolled to generate the 2 possible matching strings "abc" and "abd," which are then stored as 2 separate data word chains each spanning 3 contiguous CAM rows, as depicted in FIG. 2A, where contiguous CAM rows 1-3 are cascade connected to form a first data word chain that stores the string "abc," and contiguous CAM rows 4-6 are cascade connected to form a second data chain that stores the string "abd."

In contrast, the dynamic configurability of PRS 150 allows CAM device 100 to store REG2="ab(c|d)" in its rolled format using only 4 CAM rows because the common portion "ab" of the two possible matching strings "abc" and "abd" can be stored in only one group of CAM rows and their match signals can be simultaneously routed to other CAM rows that store "c" and "d". For example, referring to FIG. 2B, the characters "a," "b," "c," and "d" can be stored in CAM rows 1-4, respectively, of CAM device 100, and the match signal of the common data word chain "ab" ending at row 2 can be simultaneously routed as input match signals to both CAM rows 3 and 4 so that CAM row 3 can detect a match with "abc" concurrently and independently of CAM row 4 detecting a match with "abd."

Figure 2C:
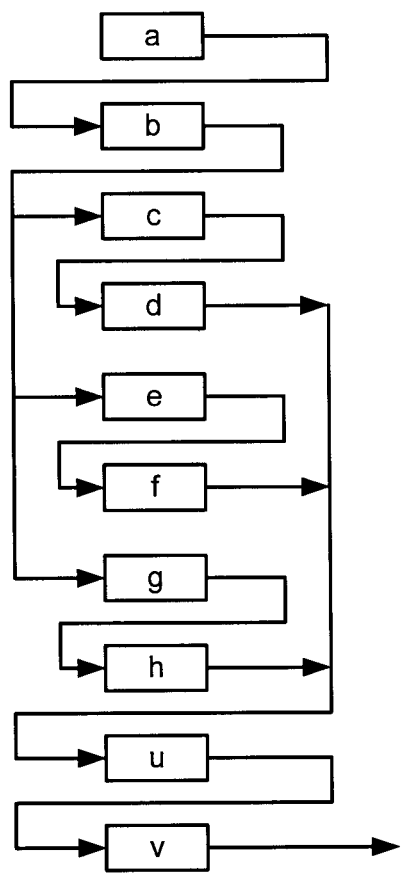
FIG. 2C depicts an exemplary CAM device configured in accordance with present embodiments to store the regular expression REG1="ab(cd|ef|gh)uv" using only 10 CAM rows.

Note that as the number of possible matching strings of a regular expression increases, the reduction in memory area (e.g., the number of CAM rows) achieved by embodiments of the present invention also increases (e.g., as compared to the '789 patent). For example, as described above, the CAM device of the '789 patent requires 18 CAM rows to store the regular expression REG1="ab(cd|ef|gh)uv" because REG1 needs to be unrolled to generate all possible matching strings (i.e., S1="abcduv," S2="abefuv," and S3="abghuv"), which are then stored separately in 3 groups of 6 contiguous and sequentially connected CAM rows. However, because embodiments of CAM device 100 can selectively, simultaneously, and independently route the match signals from any CAM row to any number of other arbitrarily located CAM rows, REG1 does not need to be unrolled for storage in CAM device 100. Rather, each common portion of the possible matching strings of REG1 can be stored in only one location in the CAM array 101A, and the PRS 150 can be programmed to route the match signals of the common portion to the other non-common portions at the same time according to the logical operators specified in REG1. In other words, the strings appearing between logical operators as expressed using the unrolled form of the regular expression can be stored in corresponding groups of CAM rows of the CAM device, and the PRS can be programmed to logically connect the groups of CAM rows according to the logical operators. In this manner, embodiments of CAM device 100 require only 10 CAM rows to store REG1="ab(cd|ef|gh)uv," as depicted in FIG. 2C.

Further, the ability of the PRS 150 to selectively route the match signal from each CAM row 110 in CAM array 101A to itself and/or to any number of other arbitrarily selected CAM rows 110 at the same time allows embodiments of CAM device 100 to implement search operations for regular expressions that include the logical operator "*." The logic operator "*," which is commonly known as the Kleene star, denotes zero or more instances of the preceding character in the regular expression. For example, to match the regular expression REG8="abc*de," an input string must include zero or more instances of the "Kleene" character "c" appearing between the prefix string "ab" and the suffix string "de." Thus, while the input strings "abde," abcde," and "abccde" all match REG8="abc*de," an input string including thousands, millions, or even an infinite number of instances of "c" between the prefix "ab" and the suffix "de" will also match REG8="abc*de."

Figure 2D:
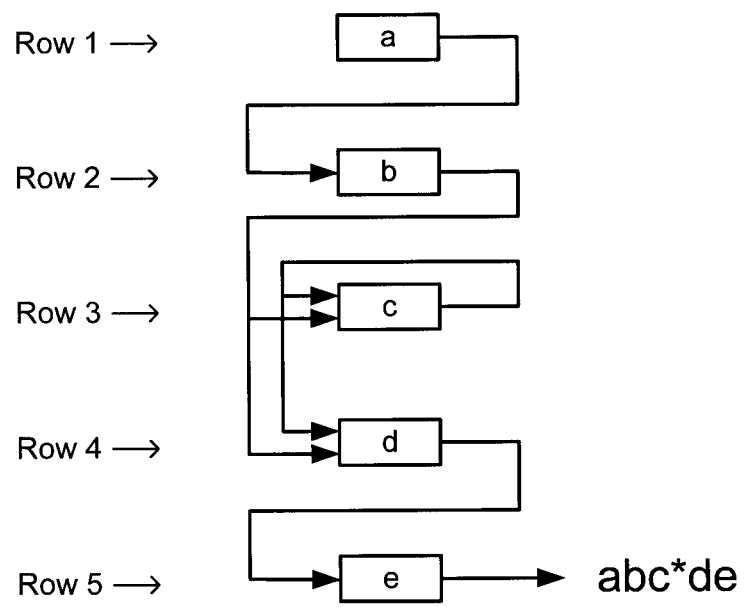
FIG. 2D depicts an exemplary CAM device configured in accordance with present embodiments to store the regular expression REG8="abc*de" using only 5 rows.

Regular expressions that include the logical operator "k" can be efficiently stored in embodiments of CAM device 100 by configuring the PRS 150 to form a match signal loop for the Kleene character and to route the match signals of the prefix string and the Kleene character as an enable or trigger signal for matching the suffix string. For example, FIG. 2D depicts an embodiment of CAM device 100 configured to store and implement search operations for REG8="abc*de." The characters "a," "b," "c," "d," and "e" are stored in CAM rows 1-5, respectively, of CAM device 100. The PRS 150 is configured to route the match signal from "a" in row 1 as an input match or enable signal to "b" in row 2 to form the prefix string "ab," and to route the match signal from "d" in row 4 as an input match or enable signal to "e" in row 5 to form the suffix string "de." Further, the PRS 150 is configured to route the match signal from the prefix string "ab" as an input match or enable signal to both "c" and the suffix string "de" so that a matching prefix "ab" in the input string triggers a search for both the Kleene character "c" and the suffix string "de," and to route the match signal from "c" as an input match or enable signal to both itself and to the suffix string "de" so that a matching character "c" in the input string triggers a search for another occurrence of "c" and for the suffix string "de" at the same time. In this manner, after the embodiment of CAM device 100 depicted in FIG. 2D detects the prefix string "ab" in the input string, if the next input characters are "de" or any number of the character "c" followed by the characters "de," a match condition can be indicated. Thus, as depicted in FIG. 2D, embodiments of CAM device 100 can be configured to store and implement search operations for REG8="abc*de" using only 5 CAM rows 110 (e.g., where each CAM row 110 stores one character) by using the PRS 150 to simultaneously trigger multiple sub-searches in response to a prefix match (e.g., routing the "ab" match signal to "c" and "d") and to implement a search loop of infinite repetitions (e.g., routing the "c" match signal back to "c").

In contrast, conventional CAM devices (e.g., such as those disclosed in U.S. Pat. No. 6,252,789) cannot implement search operations for regular expressions that include the Kleene star "*" because of the infinite number of different input patterns that can generate a match condition. As discussed above, to store a regular expression in the '789 CAM device, the regular expression is unrolled to generate all possible matching strings, which are then stored in corresponding groups of rows in the CAM device. Thus, to store and implement search operations for REG8="abc*de" in the '789 CAM device, every pattern that includes zero or more instances of "c" between the prefix "ab" and the suffix "de" must be stored therein, which is impossible because there are an infinite number of different input strings that can match REG8="abc*de."

Figure 1B:
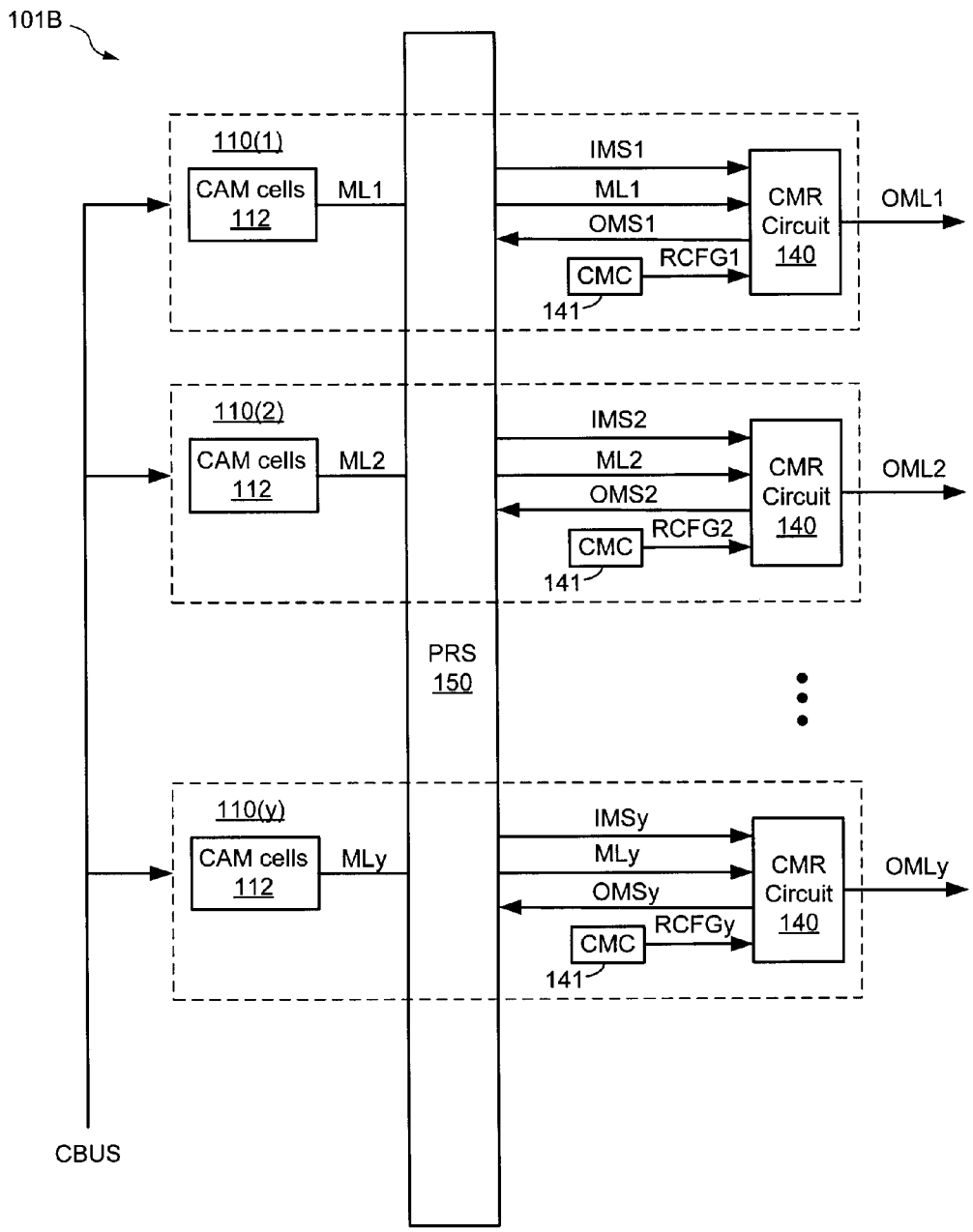
FIG. 1B shows a simplified block diagram of one embodiment of the CAM array of FIG. 1A.

FIG. 1B shows a CAM array 101B that is one embodiment of CAM array 101A of FIG. 1A. For the exemplary embodiment of FIG. 1B, each CAM row 110 includes a number of CAM cells 112 and a configurable match result (CMR) circuit 140. The CMR circuit 140, which is one embodiment of the configurable logic circuit 114 of FIG. 1A, includes a first match input coupled to the row's match line ML, second match inputs coupled to one or more input match signal (IMS) lines, a first match output coupled to an output match signal (OMS) line, a second match output coupled to the output match line (OML), and a control terminal coupled to a configuration memory cell (CMC) 141. The IMS lines are selectively connected to PRS 150, and can provide match signals from one or more other arbitrarily selected CAM rows as input match signals to CMR circuit 140. The OMS line is selectively connected to PRS 150, and can selectively provide match signals generated in CMR circuit 140 to any number of other arbitrarily selected CAM rows at the same time via PRS 150. Together, the ML, IMS and OMS lines of FIG. 1B are one embodiment of the match signal (MS) lines shown in FIG. 1A.

The output match line OML can selectively provide match signals generated in CMR circuit 140 to the priority encoder 130 (see also FIG. 1A), which as described above generates the HPM in response to match signals on OML(1)-OML(y) during compare operations. The CMC cell 141 stores the row configuration (RCFG) information, which in turn controls how the selected input match signals received from the IMS lines and/or match signals provided on the row's match line ML are logically combined in CMR circuit 140 to produce output match signals for the row. The RCFG information also controls whether the row output match signals are provided to the priority encoder 130 via OML, and controls whether the row output match signals are provided via the OMS lines to PRS 150 (e.g., to be routed as input match signals to any number of other arbitrarily selected and/or located CAM rows). As explained in more detail below, the PRS 150 and the CMR circuits 140 can be selectively configured to logically connect any number of CAM rows together, regardless of the relative physical locations of the CAM rows, and to route match signals from one CAM row 110 to multiple other CAM rows at the same time, even if the multiple other CAM rows are not adjacent to each other.

The configuration memory cells 141 can be any suitable type of memory cell including, for example, an SRAM or DRAM cell, an EEPROM cell, flash memory cells, a fuse, and so on. Further, although depicted in FIG. 1B as being separate memory elements associated with corresponding CAM rows 110, for other embodiments, the memory cells 141 can be formed as an addressable array of configuration memory cells, which can be located either within the CAM rows 110 or external to CAM array 101B.

Figure 3:
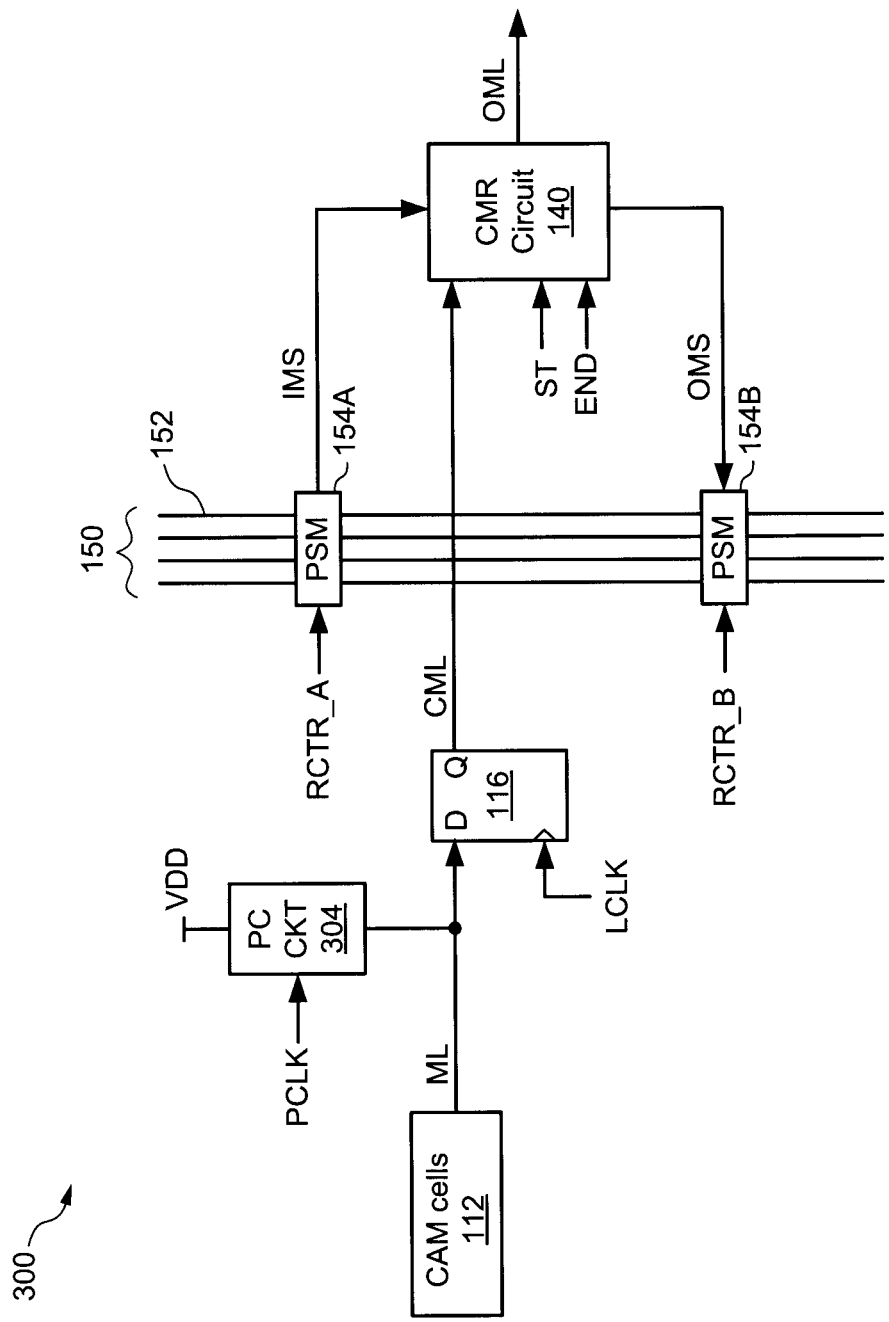
FIG. 3 shows a block diagram of one embodiment of the CAM rows of the CAM array of FIG. 1B.

FIG. 3 shows a CAM row 300 that is one embodiment of the CAM row 110 of the CAM array 101B of FIG. 1B. CAM row 300 includes a number of CAM cells 112, a match signal latch 116, and CMR circuit 140, and is selectively connected to the signal routing lines 152 of the PRS 150 via programmable switch matrixes (PSM) 154A-154B. CAM cells 112, which can be any suitable CAM cells for storing a data word and comparing the data word with a search key, can include binary CAM cells, ternary CAM cells, and/or quaternary CAM cells. CAM cells 112 receive a search key or comparand word from the comparand bus CBUS (not shown for simplicity in FIG. 3), and are coupled to a match line ML which indicates match results between data stored in the CAM cells 112 and the search key.

Latch 116, which can be any suitable latch or register circuit, includes a data input (D) coupled to ML, a clock input "<" to receive a latch clock signal (LCLK), and an output (Q) coupled to a clocked match line (CML). In response to triggering edges (e.g., rising or falling edge) of LCLK, latch 116 latches the logic signal provided to its D input via ML, thereby generating a clocked match signal at its Q output. The clocked match signal is provided to the first inputs of CMR circuit 140 via CML.

The second inputs of CMR circuit 140 are connected to PSM 154A via the IMS lines, the first outputs of CMR circuit 140 are connected to PSM 154B via the OMS lines, and the second output of CMR circuit 140 is connected to priority encoder 130 (see also FIG. 1A) via OML. Further, the CMR circuit 140 and includes control terminals to receive a start bit (ST) and an end bit (END). Together, the ST and END bits, which together form one embodiment of the row information (RCFG) shown in FIG. 1B, control the logical operations and the routing functions of CMR circuit 140.

As shown in FIG. 3, many embodiments of CAM row 300 include a conventional pre-charge circuit 304 coupled to ML and configured to pre-charge ML to logic high prior to compare operations in CAM cells 112. More specifically, conventional match line pre-charge circuits typically include a single input terminal to receive a pre-charge signal, and include power terminals connected to a supply voltage (e.g., VDD) and ML. Prior to compare operations, the pre-charge signal is asserted and causes the pre-charge circuit to charge ML high towards VDD. Then, during compare operations, the pre-charge signal is de-asserted to turn off the pre-charge circuit, thereby allowing ML to indicate the match results generated by CAM cells 112.

PRS 150 is shown in FIG. 3 to include four signal routing lines 152 that can be selectively connected to the IMS lines via PSM 154A and/or to the OMS lines via PSM 154B. More specifically, PSM 154A includes a control terminal to receive a routing control signal RCTR_A that controls which signal routing lines 152 are connected to which (if any) IMS lines, and PSM 154B includes a control terminal to receive a routing control signal RCTR_B that controls which signal routing lines 152 are connected to which (if any) OMS lines. Thus, the routing control signals RCTR_A and RCTR_B, which can be stored in configuration circuit 160 (see also FIG. 1A) or provided by the instruction decoder 120, control which match signals from other CAM rows can be selected as IMS signals to CMR circuit 140 of CAM row 300, and control which match signals provided from CAM row 300 via OMS lines can be selectively routed as IMS signals to other CAM rows of the CAM device. In this manner, PRS 150 provides a programmable interconnect structure that can be dynamically configured to route match signals from any CAM row to any other numbers of arbitrarily selected CAM rows at the same time.

Although an exemplary embodiment of PRS 150 is depicted in FIG. 3 as having 4 signal routing lines 152, for other embodiments, PRS 150 can have any number of signal routing lines sufficient for independently and simultaneously routing match signals from each CAM row to a number of other arbitrarily selected CAM rows to enable CAM array 101B to store a given number of regular expressions.

As mentioned above, for embodiments of FIG. 3, the RCFG information is provided to CMR circuit 140 as the start bit (ST) and the end bit (END). The start bit (ST) indicates whether the data word stored in the corresponding CAM row 300 is the first data word of a data word chain. The end bit (END) indicates whether the data word stored in the corresponding CAM row 300 is the last data word of a data word chain. The start bit and end bit can be further encoded, as shown below in Table 1, to indicate that the corresponding data word is a continuing data word or a default data word. A continuing data word is an intermediate data word between the first and last data words in a data word chain that spans multiple CAM rows. A default data word corresponds to a data word chain that has only one data word. Other encodings may be used including treating each default word as the last data word of a single word data word chain, and using separate control bits (e.g., 3 or 4) for each data word type.

TABLE 1

| ST | END | Function |
|----|-----|----------|
| 0 | 0 | continuing word |
| 0 | 1 | last word |
| 1 | 0 | first word |
| 1 | 1 | default word |

As mentioned above, the row configuration information (RCFG) embodied by ST and END instructs the CMR circuit 140 when and how to combine match signals for the row with input match signals from one or more other CAM rows to generate the row output match signals, and also instructs CMR circuit 140 whether to forward the row output match signals to the priority encoder 130 and/or to one or more other CAM rows via the PRS 150. In this manner, any number of CAM words stored in arbitrarily selected or located CAM rows can be connected together to form a data word chain that spans multiple CAM rows.

For some embodiments of CAM row 300 of FIG. 3, if the start bit ST is asserted, which indicates that the CAM row 300 stores the first data word in a chain, the asserted state of ST causes CMR circuit 140 to forward the match state on ML (e.g., generated by comparison of comparand data with the CAM word stored in the row's CAM cells 112) as the output match signal for the row, and ignores any input match signals on the input match signal (IMS) lines. Conversely, if ST is de-asserted, which indicates that the CAM row 300 stores either an intermediate word or the last word in the data word chain, then the de-asserted state of ST causes CMR circuit 140 to logically combine the row's match state on CML with the input match signals on the IMS lines (e.g., generated by comparison of comparand data with the CAM word stored in another arbitrarily located row's CAM cells 112) to generate output match signals for the row.

If the end bit END for CAM row 300 is asserted, which indicates that CAM row 300 stores the last data word in the chain, the asserted state of END causes CMR circuit 140 to pass the row's output match signal to the priority encoder 130 via the OML line, which serves as an accept flag for a corresponding string, data word, or, data word chain ending in the CAM row. Conversely, if END for CAM row 300 is de-asserted, which indicates that CAM row 300 does not store the last data word in the data word chain, the de-asserted state of END causes CMR circuit 140 to pass the row's output match signal to PRS 150 via the OMS lines, thereby allowing the PRS 150 to simultaneously route the row's output match signal as an input match or enable signal to any number of selected CAM rows in the array 101B, including the originating CAM row 300. For some embodiments, the de-asserted state of END also causes CMR circuit 140 to not pass the row's generated match signal to the priority encoder 130 via the OML lines.

The logic functions and output results provided by the CMR circuit 140 of FIG. 3 are summarized below in Table 2.

TABLE 2

| ST | END | OMS | OML |
|---|---|---|---|
| 0 | 0 | CML * IMS | 0 |
| 0 | 1 | CML * IMS | CML * IMS |
| 1 | 0 | CML | 0 |
| 1 | 1 | 0 | CML |

Thus, in accordance with embodiments of the present invention, the CAM cells 112, the CMR circuits 140, and the PRS 150 of CAM array 101B can be programmed in a manner that configures CAM array 101B to embody one or more regular expressions in hardware using configurable circuit elements. Thus, the regular expressions embodied in CAM arrays of the present invention are defined by the characters (e.g., 8-bit ASCII encoded characters) stored in the rows of CAM cells 112 and by the configuration data that defines the selective interconnections between CAM rows 110 provided by the programmed PRS 150. As described in more detail below, the ability to configure CAM array 101B to embody one or more regular expressions as a hardware solution allows embodiments of the present invention to implement matching of the regular expressions in a more efficient manner than prior CAM devices, and in a faster manner than software solutions that rely upon microprocessors executing code to perform search operations.

For some embodiments, CMR circuits 140 can be selectively configured to perform other logical functions on the match signals provided from the current row via the CML and the match signals provided from other rows via the PRS 150 and the IMS lines such as, for example, logical OR, exclusive OR (XOR), and logical inversion (NOT) functions.

Figure 1C:
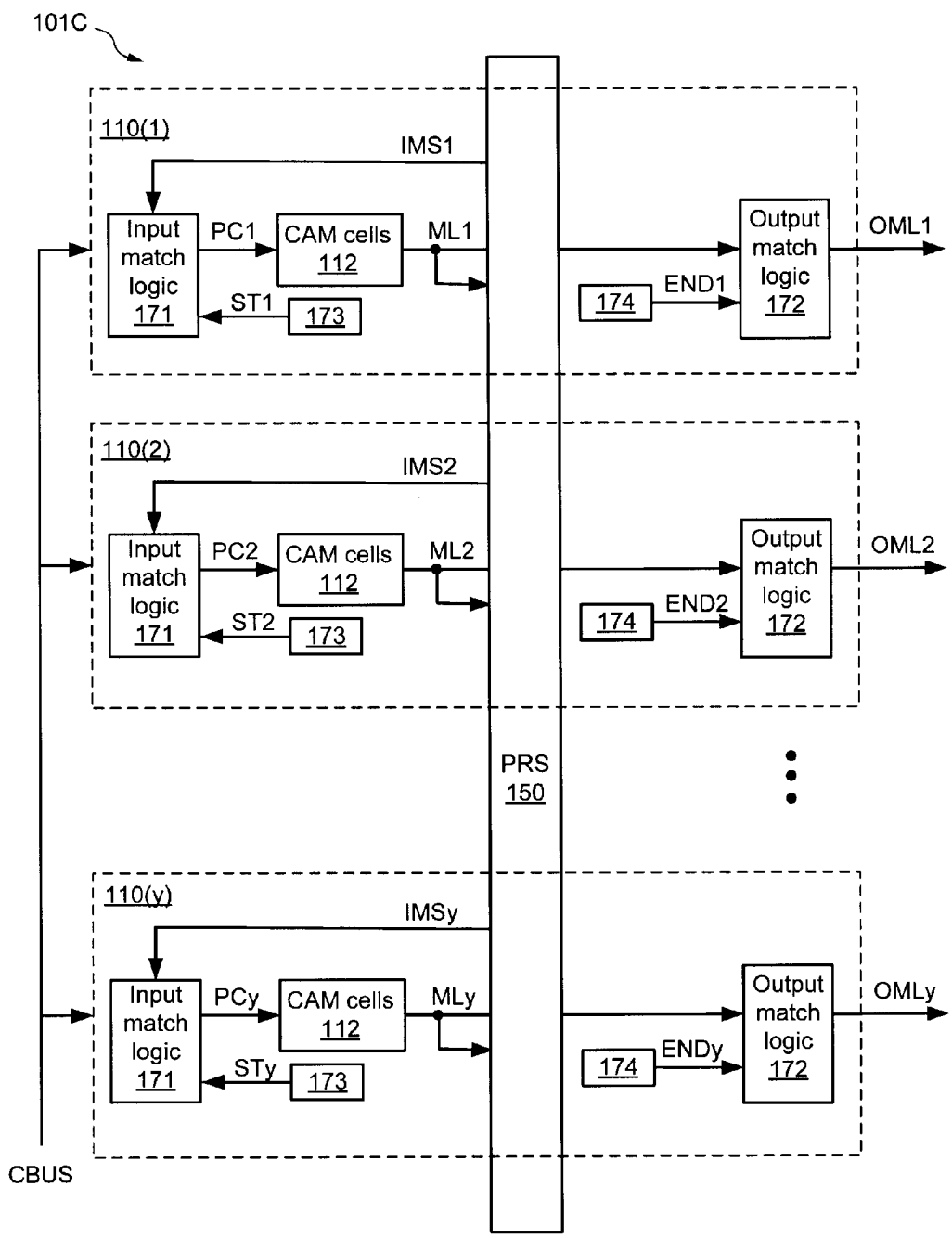
FIG. 1C shows a simplified block diagram of another embodiment of the CAM array of FIG. 1A.

Referring again to FIG. 1A, for other embodiments of the present invention, the CAM cells 112 in each CAM row 110 can be selectively enabled to participate in compare operations in response to match signals from a number of other arbitrarily selected CAM rows generated during previous compare operations, which as described in detail below can result in significant power savings by pre-charging the match lines of only those CAM rows that are necessary for each compare operation associated with a string search operation. For example, FIG. 1C shows a CAM array 101C that is another embodiment of CAM array 101A of FIG. 1A. For the exemplary embodiment of FIG. 1C, each CAM row 110 includes a number of CAM cells 112, input match logic 171, output match logic 172, and configuration memory cells 173-174, and each CAM row is selectively connected to the PRS 150, which as described above can route match signals from any CAM row to one or more arbitrarily selected CAM rows at the same time. Input match logic 171 includes a data input to receive match signals from a number of other CAM rows 110 via the IMS lines, a control input to receive the start bit (ST) from configuration memory cell 173, and an output to provide a pre-charge signal PC to the CAM cells 112. Output match logic 172 includes a data input to receive match signals from the CAM cells 112 via the match lines ML, a control input to receive the end bit (END) from configuration memory cell 174, and an output coupled to priority encoder 130 via the output match line OML. Together, input match logic 171 and output match logic 172 form another embodiment of the configurable logic circuit 114 of FIG. 1A.

The configuration memory cells 173-174 can be any suitable type of memory cells including, for example, an SRAM or DRAM cells, EEPROM cells, flash memory cells, fuses, and so on. Further, although depicted in FIG. 1C as being separate memory elements associated with corresponding CAM rows 110, for other embodiments, the memory cells 173-174 can be formed as an addressable array of configuration memory cells.

The IMS line and the match line ML of each CAM row 110 are selectively connected to signal routing lines (not shown in FIG. 1C for simplicity) provided within the PRS 150. In response to configuration data, the PRS 150 can route the match signals from any CAM row 110 to any other arbitrarily selected CAM row 110, for example, to form data word chains spanning multiple contiguous and/or non-contiguous CAM rows, and can route the match signals from a first CAM row 110 to any number of arbitrarily selected CAM rows 110 at the same time, for example, to store and implement search operations for regular expressions that include the logic operators AND ("."), OR ("|"), and the Kleene star ("*"). As mentioned above, for embodiments of FIG. 1C, the PRS 150 can provide match signals from a first CAM row as row enable signals to a number of arbitrarily selected CAM rows so that the selected CAM rows are selectively enabled for a next compare operation in response to match signals generated by the first CAM row during a previous compare operation. Further, for such embodiments, the PRS 150 can route the match signals from a selected CAM row back to the selected CAM row (i.e., to the same CAM row) as a row enable signal, for example, so that a match condition in the selected CAM row enables the selected CAM row for the next compare operation, and conversely so that a mismatch condition in the selected CAM row disables the selected CAM row for the next compare operation. This feature is advantageous when performing looped search operations (e.g., for regular expressions that include the Kleene star "*").

In operation, input match logic 171 selectively enables CAM cells 112 for compare operations in response to ST and the input match signals provided on the IMS lines, and output match logic 172 selectively provides the row match signals from CAM cells 112 on ML to the priority encoder 130 via OML in response to END. As explained in more detail below, by selectively enabling the CAM row 110 in response to ST and the IMS signals during compare operations, input match logic 171 can not only combine match signals from multiple CAM rows but also minimize power consumption by pre-charging the match lines ML of only those CAM rows 110 that need to participate in a given compare operation; all other CAM rows can be disabled.

Figure 4A:
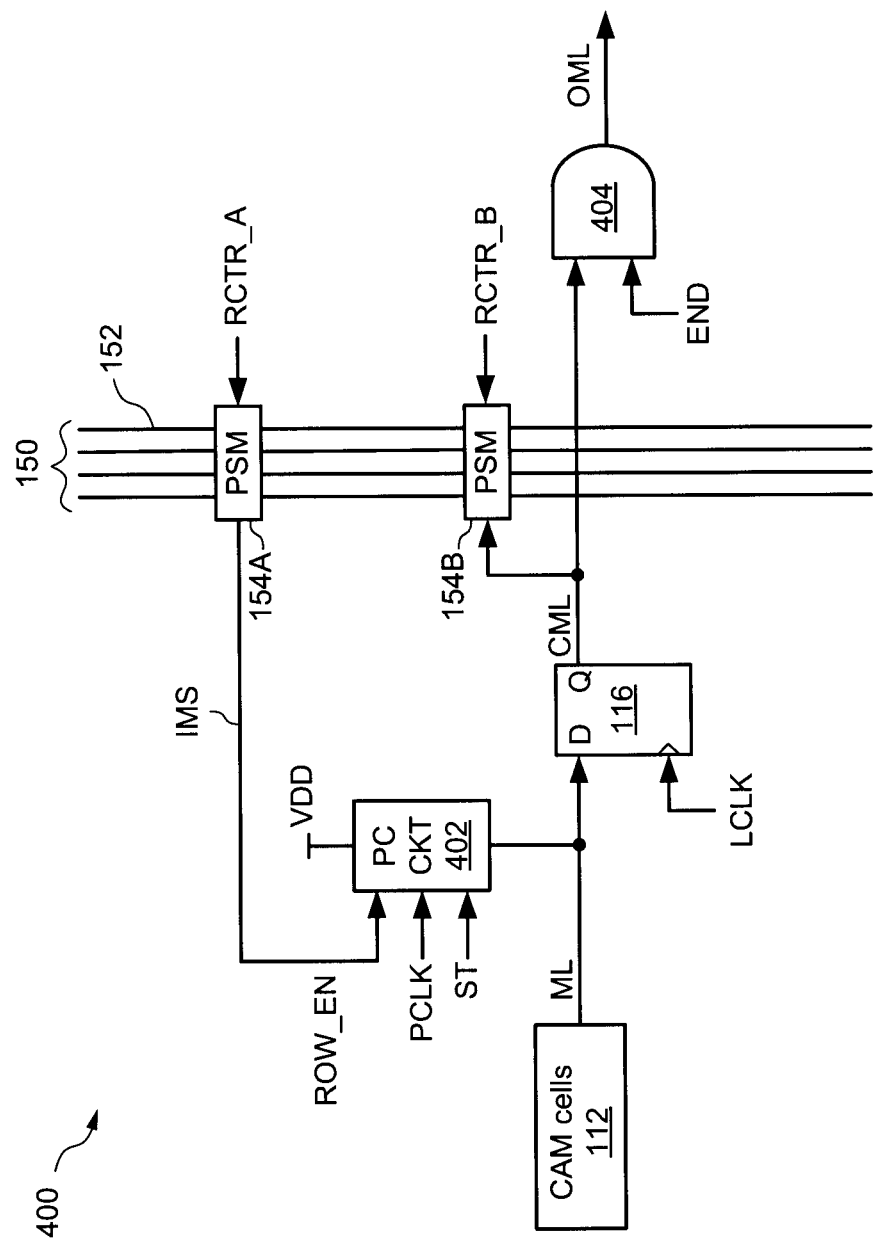
FIG. 4A shows a block diagram of one embodiment of the CAM rows of the CAM array of FIG. 1C.

FIG. 4A shows a CAM row 400 that is one embodiment of CAM row 110 of CAM array 101C of FIG. 1C. CAM row 400, which includes a number of CAM cells 112, a match signal latch 116, a match line pre-charge circuit (PC CKT) 402, and an AND gate 404, is selectively connected to PRS 150 via programmable switch matrixes (PSM) 154A-154B. CAM cells 112, which can be any suitable CAM cell for storing a data word and comparing the data word with a search key, can include binary CAM cells, ternary CAM cells, and/or quaternary CAM cells. CAM cells 112 receive a search key or comparand word from the comparand bus CBUS (not shown for simplicity in FIG. 4A), and are coupled to match line ML.

Latch 116 includes a data input (D) coupled to ML, a clock input "<" to receive a latch clock signal (LCLK), and an output (Q) to provide clocked match signals on the clocked match line (CML) in response to LCLK. Latch 116, which can be any suitable latch or register circuit, latches the current match signals from CAM cells 112 onto CML. Although not shown for simplicity in FIG. 4A, latch 116 also includes a terminal coupled to ground potential (VSS). The CML line is coupled to AND gate 404, and is also selectively connected as to the signal routing lines 152 of PRS 150 via PSM 154B.

AND gate 404 also includes a second input to receive the END bit for the row, and includes an output to provide the row output match signals to priority encoder 130 via the OML line. Thus, AND gate 404, which selectively forwards the match signal on CML to priority encoder 130 in response to END, is one embodiment of output match logic 172 of FIG. 1C. For some embodiments, if END is asserted (e.g., to logic high), AND gate 404 forwards to the match signals on CML to the priority encoder via OML. Conversely, if END is de-asserted (e.g., to logic low), then AND gate 404 does not forward the match signals on CML to the priority encoder.

Match line pre-charge circuit 402 has a first power terminal coupled to VDD, a second power terminal coupled to ML, a first input to receive ST for the row, a second input to receive a pre-charge clock signal PCLK, and a third input to selectively receive match signals from another CAM row via PRS 150 on the IMS line as a row enable signal (ROW_EN). Match line pre-charge circuit 402, which is one embodiment of input match logic 171 of FIG. 1C, can be any suitable circuit that selectively pre-charges ML upon assertion of PCLK in response to ROW_EN and ST, as explained in more detail below. Together, match line pre-charge circuit 402 and AND gate 404 of CAM row 400 form another embodiment of configurable logic circuit 114 of FIG. 1A.

PRS 150 is shown in FIG. 4A to include four signal routing lines 152 that can be selectively connected to the row's IMS lines via PSM 154A and/or to the row's CML line via PSM 154B. PSM 154A includes a control terminal to receive RCTR_A, which controls which signal routing lines 152 of the PRS 150 are connected to which (if any) IMS lines of row 400. PSM 154B includes a control terminal to receive RCTR_B, which controls which signal routing lines 152 are connected to the CML line of row 400. Thus, the routing control signals RCTR_A and RCTR_B, which can be stored in the configuration circuit 160, (see also FIG. 1A) or provided by the instruction decoder 120, control which match signals from other CAM rows are selected as IMS or row enable signals to ML pre-charge circuit 402 of CAM row 400, and also control whether row match signals generated on CML are provided to the PRS 150 for use as IMS signals by other arbitrarily selected CAM rows. In this manner, PRS 150 provides a programmable interconnect structure that can be dynamically configured to route match signals from any CAM row to one or more other arbitrarily selected CAM rows at the same time and independently of each other.

A general operation of the pre-charge circuit 402 is as follows. If ST is asserted to logic high, which indicates that row 400 of CAM cells 112 stores a first word in a data word chain, pre-charge circuit 402 turns on and, upon assertion of PCLK, pulls ML high toward VDD, thereby pre-charging ML and enabling the CAM row 400 for comparison operations, irrespective of the state of the row enable signal (ROW_EN) on the IMS line. Once ML is pre-charged, the data stored in CAM cells 112 of row 400 can be compared with input data (e.g., a search key), and the match signals are provided on ML.

If ST is de-asserted to logic low, which indicates that row 400 of CAM cells 112 stores either an intermediate word or the last word in a data word chain, then the logic state of ROW_EN on the IMS line controls the match line pre-charge operation. More specifically, if the state of ROW_EN on the IMS line received from the PRS 150 is asserted to indicate a match condition in another selected CAM row (e.g., that stores a previous word in the data word chain), the pre-charge circuit 402 turns on and pulls the match line ML high toward VDD, thereby pre-charging ML and enabling the CAM row 400 for comparison operations. Conversely, if the state of ROW_EN on the IMS line received from the PRS 150 is de-asserted to indicate a mismatch condition in the other CAM row, then pre-charge circuit 402 does not pre-charge the match line ML of the row 400, thereby disabling the CAM row 400 for the compare operation.

For one example, if array 101C stores a data word chain (e.g., a string) spanning N CAM rows 400, the start bit ST can be selected so that only the first CAM row which stores the first word in the chain is enabled for the initial compare operation, thereby minimizing power consumption during the initial compare operation by not pre-charging the match lines of the other logically connected rows that store the word chain. In this manner, embodiments of CAM array 101C can significantly minimize power consumption associated with match line pre-charging when storing data word chains or strings that span multiple CAM rows by enabling (e.g., pre-charging the match lines of) only those CAM rows that need to participate in each compare operation. This is in contrast to prior CAM devices that automatically pre-charge the match lines of all the CAM rows that store a data word chain or string.

For other embodiments, the match line ML of CAM row 400 can be discharged to ground potential to enable the row for compare operations, in which case the CAM cells charge ML to logic high (VDD) if there is a mismatch condition and do not charge ML if there is a match condition.

Figure 4B:
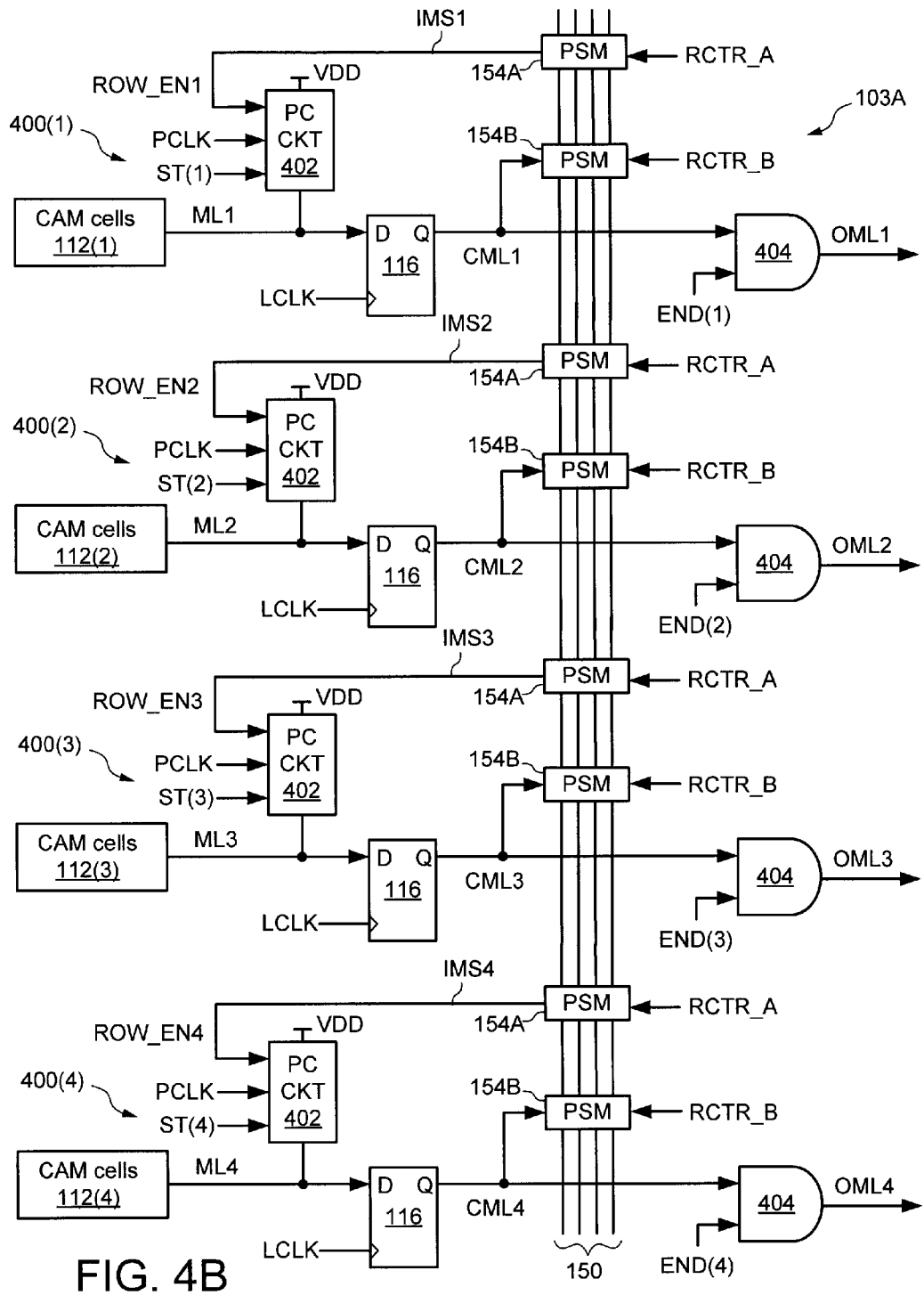
FIG. 4B shows a simplified embodiment of a CAM array including four of the CAM rows of FIG. 4A connected to the PRS.
Figure 4C:
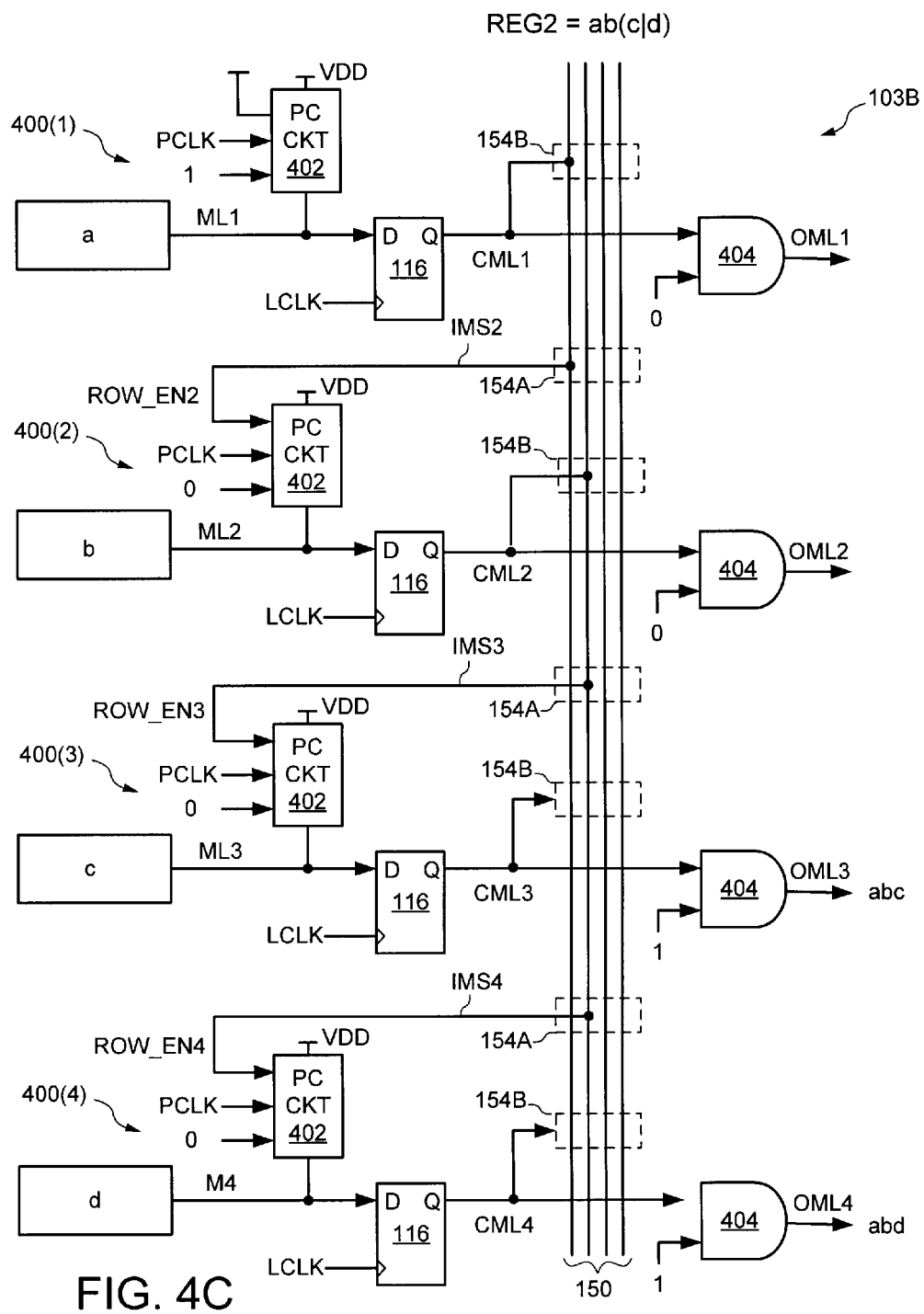
FIG. 4C shows an exemplary embodiment of the CAM array of FIG. 4B configured to store and implement string search operations for the regular expression REG2="ab(c|d);"

As described above, any number of CAM rows 400 can be selectively connected to each other using the signal lines 152 of PRS 150. More specifically, FIG. 4B shows an exemplary embodiment of CAM array 101C of FIG. 1C as including 4 CAM rows 400(1)-400(4) that can be selectively connected to each other using the signal routing lines 152 of PRS 150 to store regular expressions. For example, the CAM cells 112 and PRS 150 of FIG. 4B can be programmed to store and implement search operations for REG2="ab(c|d)" by programming CAM cells 112 of rows 400(1)-400(4) to store character data "a," "b," "c," and "d," respectively, by configuring PRS 150 to route the match signals on ML1 from row 400(1) as the row enable signal via IMS2 to row 400(2), to route the match signals on ML2 from row 400(2) as ROW_EN simultaneously to rows 400(3) and 400(4) via IMS3 and IMS4, respectively, and by setting the row configuration bits ST and EN to appropriate values, as depicted in FIG. 4C. The resulting configuration of the exemplary CAM array 101C depicted in FIG. 4C provides a match signal for the string "abc" on OML3 and provides a match signal for the string "abd" on OML4, thereby implementing search operations for the regular expression REG="ab(c|d)" in a manner similar to that depicted in FIG. 2B.

As described above with respect to FIGS. 4A-4C, embodiments of CAM array 101C allow match signals from any CAM row to be propagated simultaneously to any number of arbitrarily selected CAM rows in the array as row enable signals, and therefore not only provide functional advantages over conventional CAM devices that can logically connect only adjacent CAM rows together but also allow for significant reductions in power consumption during compare operations over conventional CAM devices that enable (e.g., and pre-charge the match lines of) all CAM rows employed to store data strings.

Figure 4D:
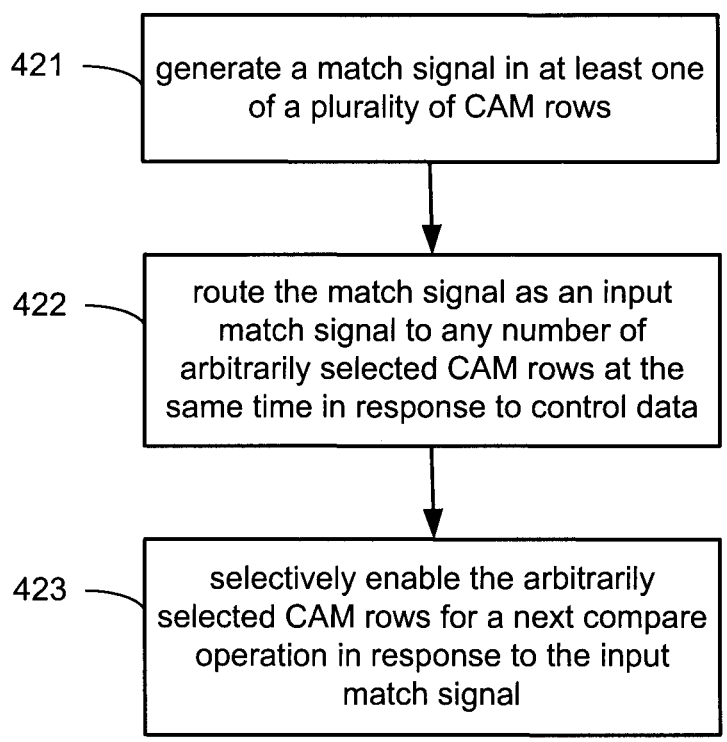
FIG. 4D is an illustrative flow chart depicting an exemplary operation for propagating match signals from one row to multiple other rows at the same time.

An exemplary operation of present embodiments for propagating match signals between multiple rows at the same time is briefly described below with respect to the illustrative flow chart of FIG. 4D. First, a search key or comparand word is compared with the data words stored in the CAM rows 110 of the array to produce match signals in at least one of the CAM rows (421). Then, the programmable interconnect structure 150 selectively routes the match signal from each CAM row as an input match signal to any number of other arbitrarily selected CAM rows 110 at the same time in response to the configuration or control data (422). As described above, the configuration data can include row configuration data (e.g., the start and end bits for each row), the PRS's control signals (e.g., the values for SW for each of the programmable interconnect's switches), and other applicable signals. The input match signals then selectively enable the other selected CAM rows 110 for a next compare operation (423). For some embodiments, the input match signal determines whether the match line pre-charge circuits 402 in the selected CAM rows 110 pre-charge their match lines for the next compare operation. For example, if the input match signal is asserted to indicate a match condition, the pre-charge circuit 402 enables the selected CAM row for the next compare operation by pre-charging the selected CAM row's match line. Otherwise, if the input match signal is de-asserted to indicate a mismatch condition, the pre-charge circuit 402 disables the selected CAM row for the next compare operation by not pre-charging the selected CAM row's match line.

More specifically, because the PRS 150 is a dynamic interconnection structure that can be programmed to interconnect the inputs and outputs of one, a selected few, or even all of the CAM rows together in a myriad of different configurations, CAM devices employing row architectures and embodiments of the PRS can achieve many significant advantages over prior art CAM devices. For one example, by allowing match results from one row to be provided as an input match or row enable signal to any number of arbitrarily selected rows, embodiments of the present invention can store a new data word chain spanning across many rows that are not adjacent or contiguous to each other, thereby allowing long data word chains to be stored in any available CAM rows in the array without having to re-order existing CAM entries to free up a block of contiguous CAM rows to store the new CAM word.

Figure 11A:
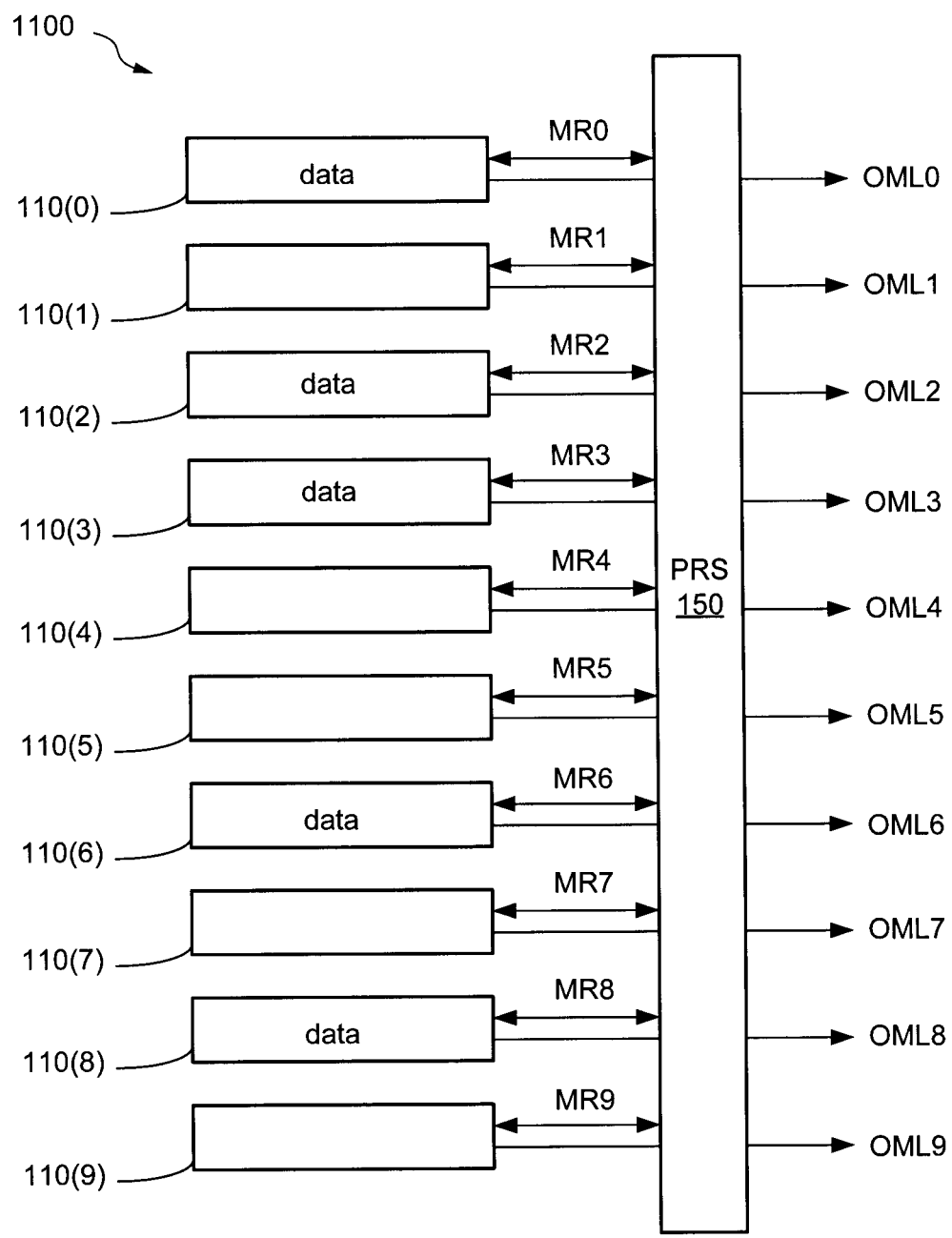
FIG. 11A depicts an exemplary embodiment of the CAM array of FIG. 11A storing data words in 5 selected CAM rows.
Figure 11B:
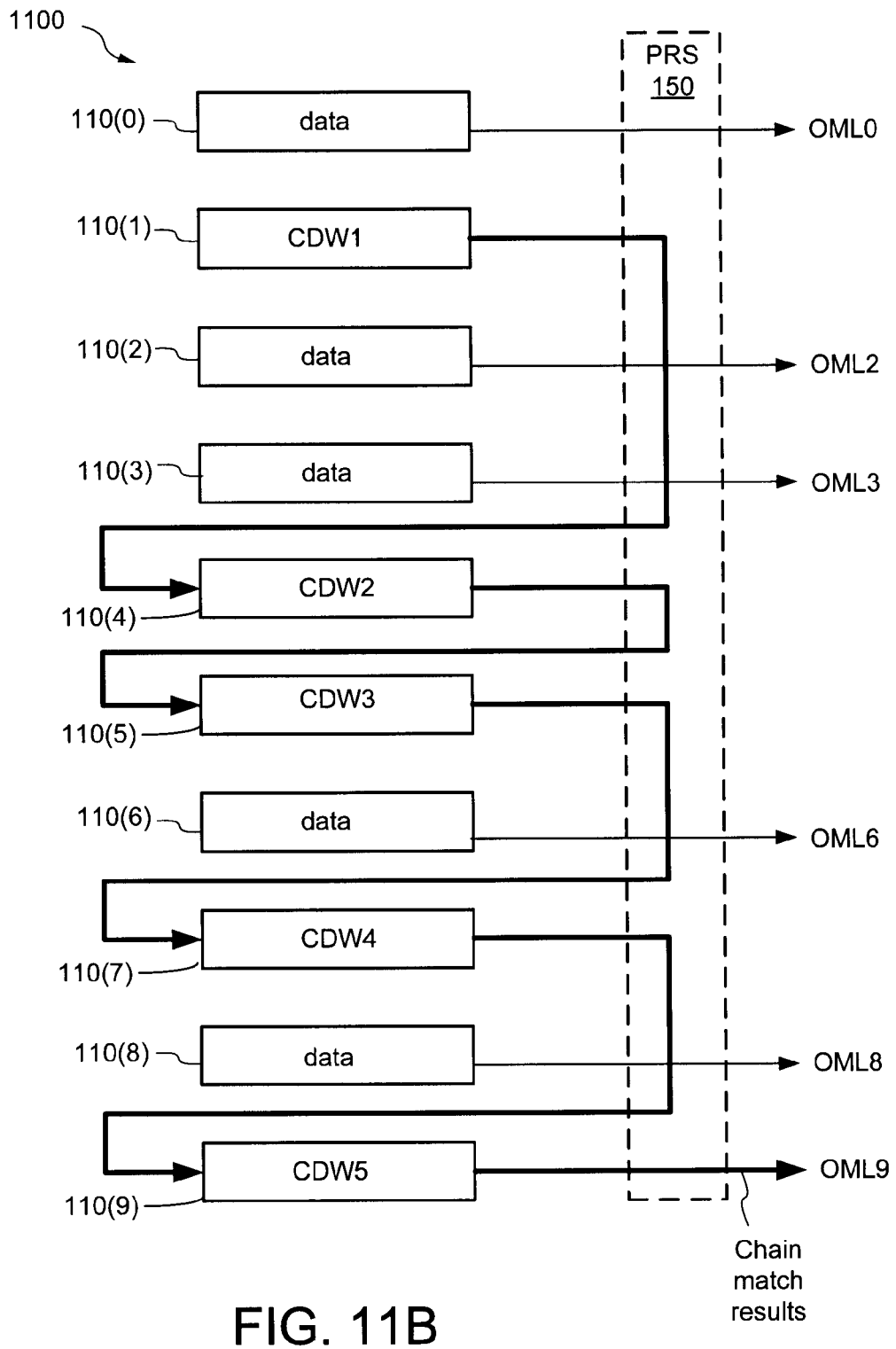
FIG. 11B depicts the exemplary embodiment of FIG. 11A storing data words in 5 the selected CAM rows and configured to a store a 5-word data word chain in 5 available non-contiguous CAM rows.

For example, FIG. 11A depicts a configuration 1100 of CAM array 101 having 10 CAM rows 0-9, where CAM rows 0, 2, 3, 6, and 8 each store valid data, and CAM rows 1, 4, 5, 7, and 9 are available to store new data. Although CAM rows 1, 4, 5, 7, and 9 are not contiguous, a data chain including 5 chain data words (CDW1-CDW5) can be stored in the five non-contiguous available CAM rows 1, 4, 5, 7, and 9 by configuring the PRS to logically connect the available CAM rows 1, 4, 5, 7, and 9 together in a chain, as depicted in FIG. 11B. Thus, as depicted in FIG. 11B, the PRS 150 of FIG. 11B propagates the match signal of each data word in the chain as an input enable signal to the next data word in the chain, and each of CAM rows 1, 4, 5, 7, and 9 is configured to logically AND its match signal with its input enable signal(s). Thus, the match signal for CDW1 in row 1 is provided as an input enable signal to row 4, which logically ANDs CDW1's match signal with CDW2's match signal to generate a match signal on row 110(4). The match signal on row 110(4) is provided as an input enable signal to row 5, and so on, until the match signal generated by CAM row 9 on OML9 indicates a match condition for the data word chain "CDW1-CDW5" stored in CAM rows 1, 4, 5, 7, and 9. In this manner, the data word chain "CDW1-CDW5" can be stored in any available rows in CAM arrays of the present invention without having to re-arrange existing CAM entries to free a block a contiguous rows that are available.

For another example, by allowing the match signal of one CAM row to be routed as input enable or row enable signals to multiple other CAM rows at the same time, without regard to their relative physical locations, regular expressions can be stored in their original "rolled" format in embodiments of CAM device 100, as described above with respect to FIG. 2B. In contrast, conventional CAM devices that do not employ the programmable interconnect structure of the present embodiments cannot store and implement search operations for regular expressions that include the logical operator "*" (i.e., the Kleene star). Further, although it is possible to store relatively simple regular expressions that include only the logical operators AND (".") or OR ("|") in conventional CAM devices, these relatively simple regular expressions must be stored therein in their "unrolled" form, as depicted above in FIG. 2A, thereby requiring significantly more storage locations than CAM devices of the present embodiments.

In addition, by routing match signals generated in one CAM row during a first compare operation as a row enable signal that selectively enables a number of other arbitrarily selected CAM rows for a next compare operation, power consumption can be significantly reduced during string search operations by pre-charging only the match lines of CAM rows storing data that is relevant to (e.g., that must participate in) each compare operation. For example, referring again to the exemplary CAM array of FIG. 4C, which is configured to store and implement search operations for REG2="ab(c|d)," row 400(2) is enabled for compare operations only if there is a match condition in row 400(1), and rows 400(3)-400(4) are enabled for compare operations only if there is a match condition in row 400(2), respectively. Thus, when searching an input string of characters for REG2 using CAM array 101C, only the match line ML1 for the first CAM row 400(1) is pre-charged for the initial compare operation. The match line of CAM row 400(2) is not pre-charged for subsequent compare operations until first CAM row 400(1) detects an "a" in the input string and generates a match condition on ML1, and the match lines of CAM rows 400(3)-400(4) are not pre-charged for subsequent compare operations until second CAM row 400(2) detects a "b" in the input string and generates a match condition on ML2. In this manner, for all compare operations with the input string prior to detection of an "a," only the match line ML1 of the first CAM row 400(1) is pre-charged, thereby reducing power consumption by not pre-charging the match lines of the other CAM rows 400(2)-400(4) during such compare operations.

Figure 4E:
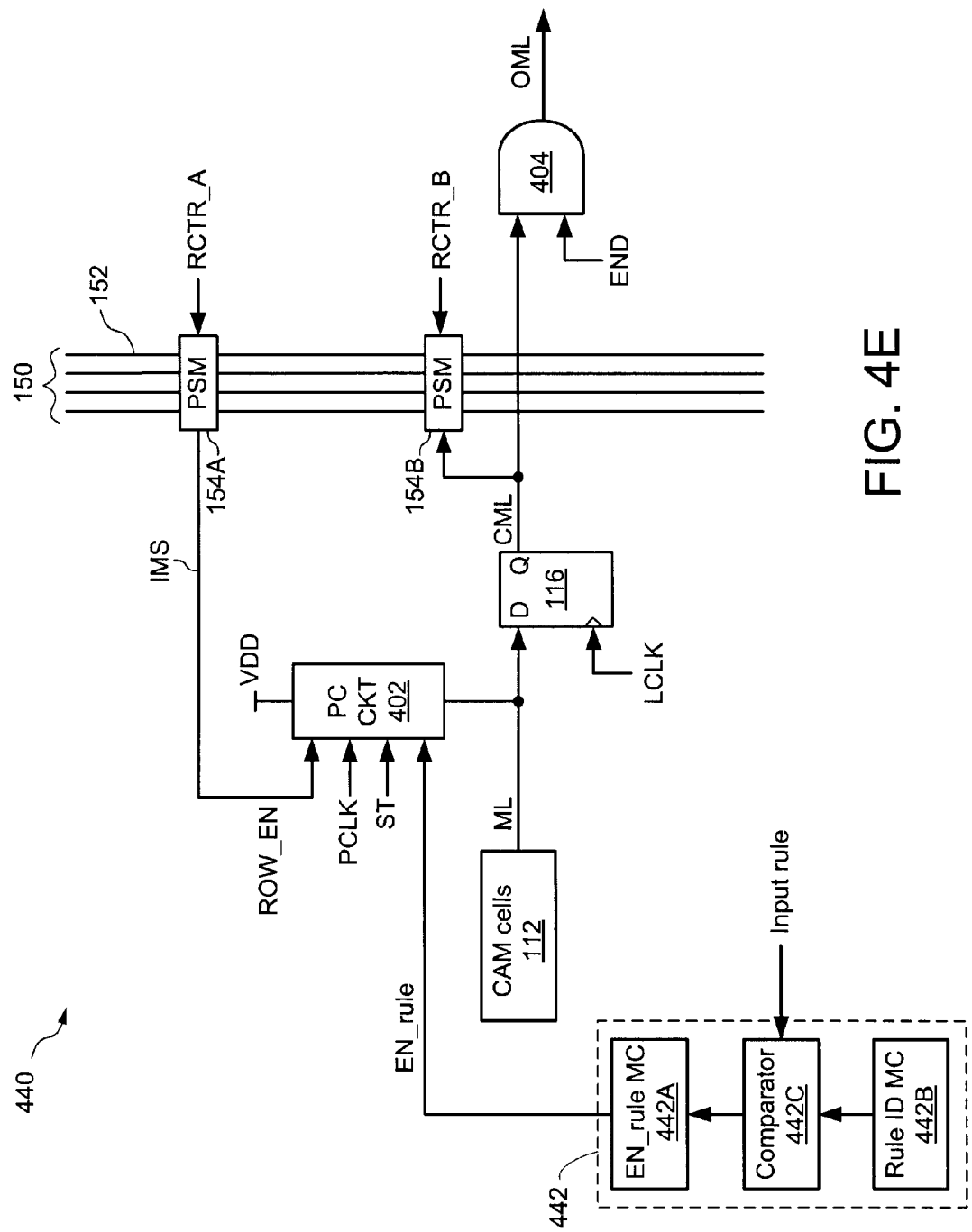
FIG. 4E shows a block diagram of another embodiment of the CAM rows of the CAM array of FIG. 1C.

FIG. 4E shows a CAM row 440 that is another embodiment of CAM row 110 of CAM array 101C of FIG. 1C. CAM row 440 includes all the elements of row 400 of FIG. 4A, and further includes a rule ID circuit 442 for storing a rule ID and/or for selectively enabling row 440 to participate in compare operations according to an input rule. Circuit 442 includes a first memory cell (MC) 442A, a second memory cell 442B, and a compare circuit 442C. Memory cell 442B stores a rule ID for the row 440, and has an output coupled to a first input of compare circuit 442C, which has a second input to receive an input rule and an output coupled to an input of memory cell 442A. Memory cell 442A stores an enable rule signal (EN_rule) generated by compare circuit 442B, and has an output to provide EN_rule to a fourth input of the pre-charge CKT 402. Memory cells 442A-442B can be any suitable type of storage element such as, for example, a register, a latch, an SRAM cell, DRAM cell, PROM cell, EEPROM cell, flash cell, fuse, and so on. Compare circuit 442C can be any suitable type of compare circuit, including a CAM cell.

The rule ID stored in memory cell 442B indicates which of a plurality of rules the data stored in CAM row 440 is associated with. During search operations, an input rule can be provided to all the rows 440 in the CAM array and used to selectively enable only those CAM rows 440 that store data associated with the input rule. For example, if there is a match between the rule ID stored in memory cell 442B and the input rule, then compare circuit 442C asserts EN_rule (e.g., to logic high), which allows the pre-charge circuit 402 to operate in a normal manner, for example, as described above with respect to FIG. 4A. Conversely, if there is not a match, compare circuit 442C de-asserts EN_rule (e.g., to logic low), which causes the pre-charge CKT 402 to not pre-charge ML, irrespective of the values of ST and ROW_EN, and thereby preventing CAM row 440 from participating in the compare operation. In this manner, only the CAM rows 440 that store data associated with the input rule ID participate in the compare operations. Further, because the match lines of CAM rows 440 that do not store data associated with the input rule ID are not pre-charged for the compare operation, power consumption associated with match line pre-charging is minimized.

For some embodiments, the comparison between the rule ID stored in memory cell 442B and the input rule can be performed prior to search operations, and the resulting value of EN_rule is stored in memory cell 442A. Then, during search operations, memory cell 442A provides the stored value of EN_rule as an enable signal to pre-charge circuit 402.

For other embodiments, the comparison between the rule ID stored in memory cell 442B and the input rule can be performed at run-time (e.g., along with the search operation). During search operations, the input rule is provided to CAM rows 440, and compare circuit 442C compares the rule ID stored in memory cell 442B and the input rule to generate EN_rule, which is then provided as an enable signal to pre-charge circuit 402. For such other embodiments, the first memory cell 442A can be eliminated.

Figure 4F:
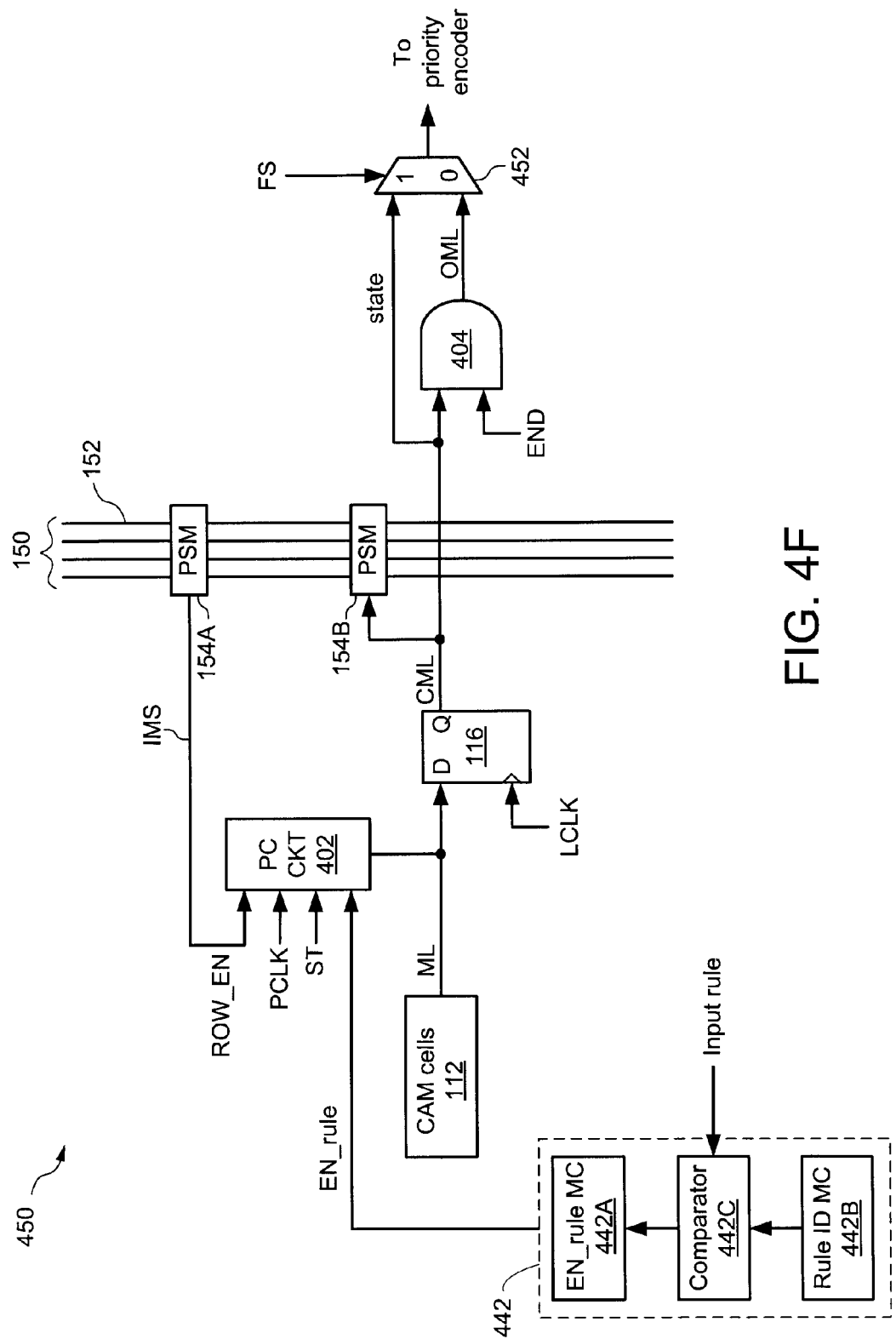
FIG. 4F shows a block diagram of yet another embodiment of the CAM rows of the CAM array of FIG. 1C.

FIG. 4F shows a CAM row 450 that is another embodiment of the CAM row 110 of the CAM array 101C of FIG. 1C. CAM row 450, which includes all the elements of row 440 of FIG. 4E, further includes a MUX 452 having a first input coupled to the OML extending from the output of AND gate 404, a second input to receive the match signal on CML from latch 116, an output coupled to the priority encoder 130 (not shown for simplicity in FIG. 4F), and a control terminal to receive a flow switch (FS) signal. When FS is de-asserted (e.g., to logic low), MUX 452 passes the match signal on OML to the priority encoder 130 so that row 450 operates in a normal manner (e.g., in a manner similar to that of row 440 of FIG. 4E). However, when FS is asserted (e.g., to logic high), MUX 452 passes CML to priority encoder 130 (e.g., irrespective of the state of END) so that the internal match signals of CAM row 450 can be flushed from the CAM array and saved in suitable flow memory (not shown for simplicity), which for some embodiments can be coupled to the output of MUX 452. In this manner, embodiments of FIG. 4F can flush one flow and then load another flow into the CAM device to be processed, for example, by loading the match states of the other flow into the latches 116 of the CAM rows 450. To switch back to the previous flow, the saved match states of CAM rows 450 are re-loaded from the flow memory into the latches 116 in the CAM rows using suitable techniques. For simplicity, signal routing lines used to re-load match states of a previous flow into latch 116 are not shown in FIG. 4F for simplicity. Further, for some embodiments, the PRS 150 can be re-programmed during flow switches so that different flows can be searched for different regular expressions.

Figure 5A:
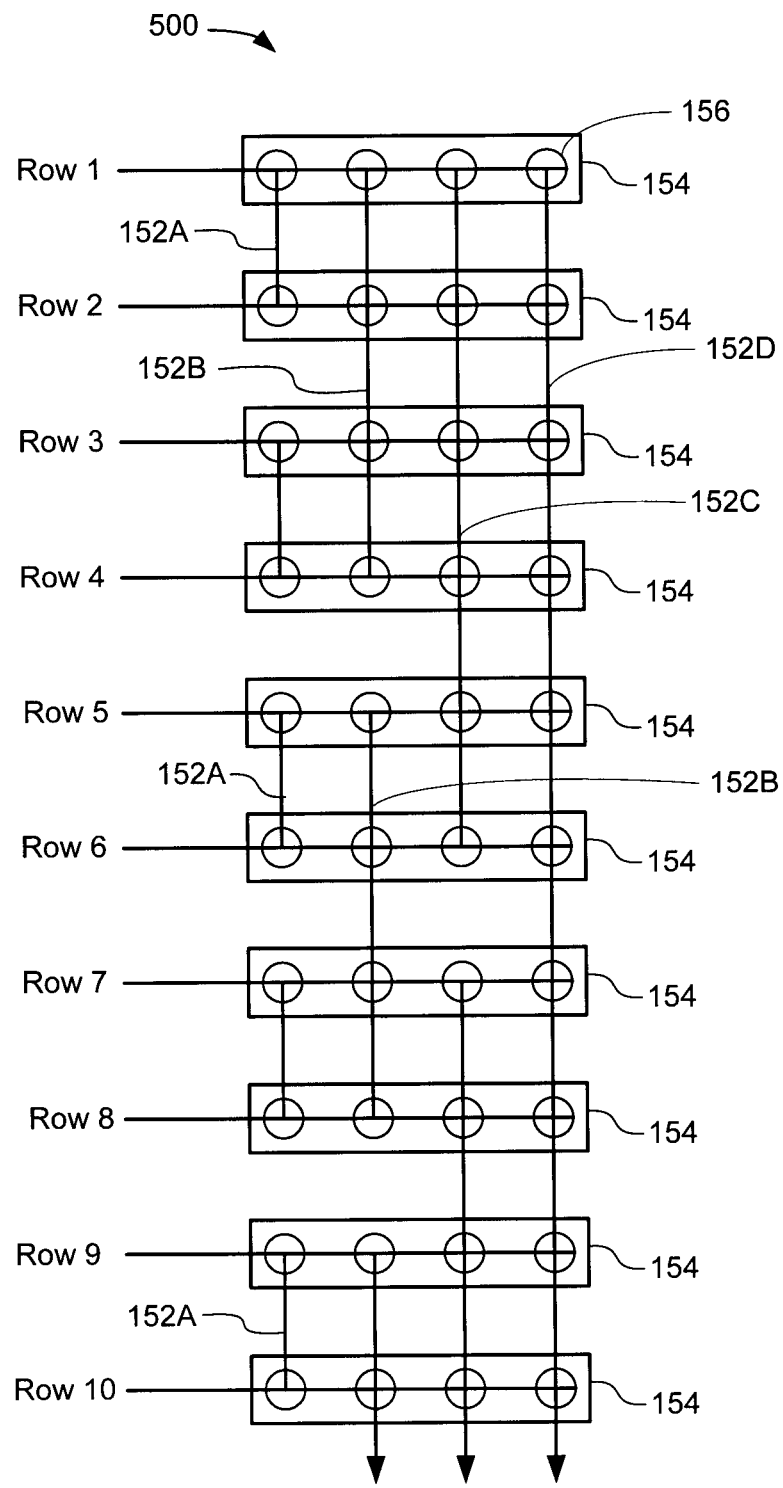
FIG. 5A shows a block diagram of one embodiment of the PRS of FIGS. 1A-1C having selectively configurable connections to signal lines in a plurality of CAM rows.

FIG. 5A shows a simplified block diagram of a PRS 500 that can be used to selectively, simultaneously, and independently route match signals from any CAM row in arrays 101 to one or more other arbitrarily selected CAM rows in CAM arrays 101 at the same time and independently of each other. PRS 500, which is an exemplary embodiment of the PRS 150 of FIGS. 1A-1C, is shown to include 4 sets of co-linear signal routing lines 152A-152D each spanning across various numbers of CAM rows 110, and to include a plurality of PSMs 154 each associated with a corresponding CAM row 110. For the simplified embodiment of FIG. 5A, each PSM 154 represents both the input PSM 154B and the output PSM 154A for a CAM row depicted in FIGS. 3 and 4A, and can selectively connect the signal lines 551 of the corresponding CAM row to one or more of the signal routing lines 152A-152D of the PRS 500 via programmable switches 156 in response to the routing configuration data. For exemplary embodiments of FIG. 5A, the signal lines 551 in each CAM row can be the ML, IMS, and/or OMS lines.

In accordance with some embodiments of the present invention, the signal routing lines 152A-152D each can be of various suitable lengths to provide a variety of different signal routing configurations for the PRS 150. For example, in the exemplary embodiment shown in FIG. 5A, each collinear set of signal lines 152A spans across two adjacent rows, and thus can be used to propagate the match signals from one CAM row to an adjacent CAM row. Each collinear set of signal lines 152B spans across four rows, and thus can be used to simultaneously route match signals from one CAM row to a selected number of 3 other CAM rows. Each collinear set of signal lines 152C spans across six rows, and thus can be used to simultaneously route match signals from one CAM row to a selected number of 5 other CAM rows. Finally, signal line 152D spans across the entire CAM array, thereby allowing match signals from any one row to be selectively and simultaneously propagated to all other CAM rows in the array via signal line 152D.

Although only four columns of signal routing lines 152 are shown in FIG. 5A, it is to be understood that in actual embodiments, the PRS 500 may include any number of collinear (columns) signal routing lines 152. Further, the particular length and arrangement of signal routing lines 152A-152D in FIG. 5A is merely illustrative; for actual embodiments, PRS 500 may include any combination of signal lines 152 of varying lengths, as may be suitable for a particular application.

Figure 5B:
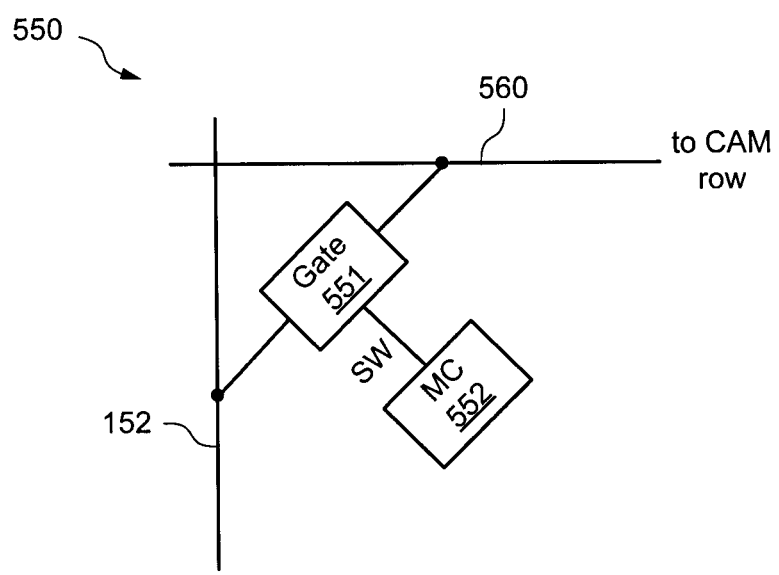
FIG. 5B shows a circuit diagram of one embodiment of a programmable switch employed in the PRS of FIG. 5A.

FIG. 5B shows a programmable switch 550 that is one embodiment of the programmable switch 156 of FIG. 5A. Programmable switch 550 includes a transmission gate 551 and a memory cell 552. Transmission gate 551 is coupled between a PRS signal line 152 and a CAM row signal line 560, and has a gate to receive a switch signal SW from memory cell 552. As mentioned above, row signal line 560 may be a match line ML, an input match signal (IMS) line, an output match signal (OMS) line, or any other signal line associated with one of CAM rows 110. Memory cell 552 can be any suitable type of memory element including, for example, a register, a latch, a DRAM cell, an SRAM cell, an EEPROM cell, a flash memory cell, a fuse, and so on. For other embodiments, the memory cells 552 can be formed as a configuration memory array that can be loaded during configuration of embodiments of CAM device 100. Transmission gate 551 can be any suitable circuit that selectively connects PRS signal line 152 and the CAM row signal line 560 in response to the switch signal (SW). For one embodiment, transmission gate 551 can be a CMOS gate including an NMOS transistor and a PMOS transistor (not shown for simplicity) connected in parallel between signal lines 152 and 560, with the gate of the NMOS transistor coupled to SW and the gate of the PMOS transistor coupled to receive a logical complement of SW. For another embodiment, transmission gate 551 can be an NMOS or a PMOS transistor. For other embodiments, other switching circuits or devices can be used to implement transmission gate 551.

As described above, because the PRS 150 of CAM device 100 of FIG. 1A allows match signals from one CAM row 110 to be simultaneously routed to any number of other arbitrarily selected and/or located CAM rows 110, embodiments of CAM device 100 can store regular expressions that include strings separated by the logical operators OR ("|"), AND ("."), and the Kleene star ("*") more efficiently (e.g., using fewer number of CAM rows) than prior CAM devices of the type disclosed in the '789 patent. For example, as described above with respect to FIG. 2C, CAM device 100 requires only 10 CAM rows to store REG1="ab(cd|ef|gh)uv," while prior CAM devices such as those disclosed in the '789 patent require 18 CAM rows (i.e., assuming that each CAM row includes 8 CAM cells to store one 8-bit ASCII-encoded character).

Further, by selectively pre-charging the match lines of the CAM rows for each compare operation in response to match signals from other CAM rows in one or more previous compare operations, embodiments of CAM array 101C employing CAM rows 400 consume less power during compare operations than prior CAM devices that always pre-charge the match lines of all CAM rows during search operations (e.g., such as the CAM devices disclosed in the '789 patents).

However, in addition to including logical operators such as "|," ".," and "*," many regular expressions also include character classes and quantifiers, which are typically represented as [C] and {m}, respectively. For example, the regular expression REG3="ab[c–f]{4}xy" contains a first string R1="ab," a second string R2="xy," and an intermediate expression R3= [c–f]{4} disposed between R1 and R2, wherein R3 can be any string containing m=4 instances of characters belonging to the specified set C=[c–f]. Thus, any input string having a prefix "ab" followed by 4 instances of any of the characters "c," "d," "e," or "f" followed by the suffix "xy" will match REG3.

To store regular expressions that include an intermediate portion R3 specifying a character class in embodiments of the CAM device 100 described above, the character class can be stored in a group of one or more CAM rows linked together by the PRS 150. However, for regular expressions that specify a quantified number {m} of a character, the character must be stored {m} times in the embodiments of the CAM device 100 described above. For example, storing the regular expression REG4="acid[w–z]{5000}rain" in embodiments of the CAM device 100 described above would require storing the character class [w–z] 5000 times (i.e., in 5000 corresponding groups of CAM rows), thereby consuming a large portion of the CAM device 100 to store a single regular expression. As a result, it may not be feasible to store regular expressions having quantifiers in the above-described embodiments of CAM device 100, particularly if the quantifiers are relatively large (e.g., compared to the number of available CAM rows available in the device).

Applicants note that a single character can be represented as a character class having only one specified character (e.g., the character "a" can be represented as the character class [a]).

Thus, in accordance with additional embodiments of the present invention, the CAM arrays described above with respect to FIGS. 1A-1C can be modified to include sequencing logic that can be programmed to count the number of sequential input characters associated with a quantifier provided in a regular expression, thereby eliminating the need to store multiple copies of the same character class in different CAM rows. More specifically, the sequencing logic and the CAM row that stores the character associated with the quantifier can be interconnected via the PRS 150 to form a loop that counts the number of sequential occurrences of the quantified character, thereby allowing the quantified character to be stored in only one CAM row, irrespective of the quantifier value {m}. Similarly, for regular expressions that include a quantified character class (e.g., that include an intermediate expression R3="[w–z]{5000}"), the sequencing logic and a group of CAM rows that store the character class can be connected via the PRS 150 to form a loop that counts the number of sequential occurrences of any of the characters specified by the character class, thereby allowing the character class [C] to be stored in only one group of CAM rows, irrespective of the quantifier value {m}. In this manner, the CAM arrays of the present invention can store and implement search operations for regular expressions that include a quantifier using a number of CAM rows that is unrelated to the quantifier value.

Figure 6A:
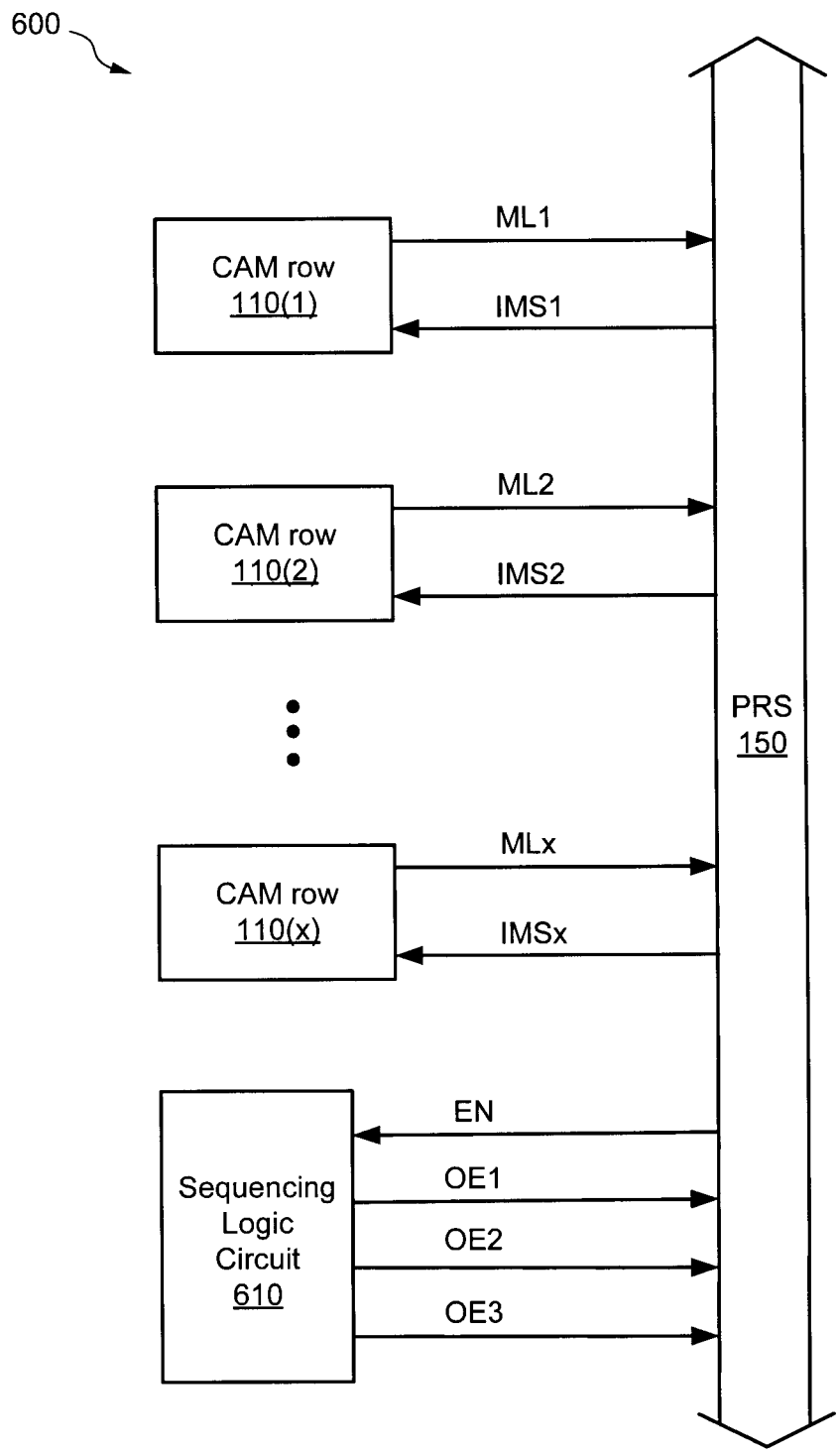
FIG. 6A shows a simplified block diagram of the CAM array of FIGS. 1A-1C modified to include a sequencing logic circuit row selectively connected to any arbitrarily selected CAM rows via the PRS.

FIG. 6A shows a CAM array 600 in accordance with additional embodiments of the present invention. CAM array 600 includes a plurality of CAM rows 110 and a sequencing logic circuit 610 that can be selectively connected to any number of arbitrarily located CAM rows 110 via the PRS 150. Each CAM row 110 is connected to PRS 150 via ML and IMS lines, for example, in the manner described above with respect to CAM array 101C of FIG. 1C. For simplicity, the OML and priority encoder 130 are not shown in FIG. 6A. For other embodiments, each CAM row of array 600 can also include OMS lines connected to the PRS 150, for example, in the manner described above with respect to CAM array 101B of FIG. 1B.

For the exemplary embodiments of CAM array 600 described herein with respect to FIG. 6A, CAM array 600 is configured to store and implement search operations for a regular expression having the format REG=R1R3R2, where R1 can be a prefix string having a varying number of characters, R3 is an intermediate expression defined by a sequence of {m} characters that match the specified character or character class [C], and R2 can be a suffix string having a varying number of characters.

The prefix string R1 is stored in first CAM rows 110(1) hereinafter referred to as the R1 CAM rows, the suffix string R2 is stored in second CAM rows 110(2) hereinafter referred to as the R2 CAM rows, and the character class is stored in third CAM rows 110(3) hereinafter referred to as the R3 or character class CAM rows. Of course, depending upon the character lengths of the R1 and R2 strings, as compared to the number of CAM cells 112 provided in each CAM row 110, multiple CAM rows 110 may need to be connected together using the PRS 150 to store the R1 string, the R2 string, and the R3 expression including the quantified character class. For example, in one exemplary embodiment, each CAM row 110 includes 9 CAM cells 112 to store a 9-bit binary-encoded ASCII character, and thus each CAM row stores only 1 ASCII-encoded character. Thus, for purposes discussion herein, the group of one or more CAM rows connected together via PRS 150 to store the regular expression prefix string R1 is denoted as the R1 CAM rows 110(1), the group of one or more CAM rows connected together via PRS 150 to store the regular expression suffix string R2 is denoted as the R2 CAM rows 110(2), and the group of one or more CAM rows connected together via PRS 150 to store the character class is denoted as the character class or R3 CAM rows 110(3).

For the exemplary embodiment shown in FIG. 6A, sequencing logic (SL) circuit 610 includes an enable input (EN) and three outputs (OE1-OE3) selectively connected to PRS 150, which can route match signals from any CAM row 110 in CAM array 600 to the enable input of SL circuit 610, and can route counter output signals generated at OE1-OE3 to any number of arbitrarily selected CAM rows 110 in CAM array 600. For some embodiments, SL circuit 610 receives match signals from a group of CAM rows 110 that store the character class via PRS 150 as a character class match signal (MAT_CC), and in response thereto selectively increments a count value (CNT) that indicates how many sequential characters of an input string match the character class stored in the character class CAM rows. The signals on OE1-OE3 can be used to indicate that CNT has not reached the minimum quantifier value $\{m\}$, to indicate that the input string matches the intermediate expression R3, to indicate that CNT exceeds the maximum quantifier value, and/or for other purposes, as described in more detail below.

Figure 6B:
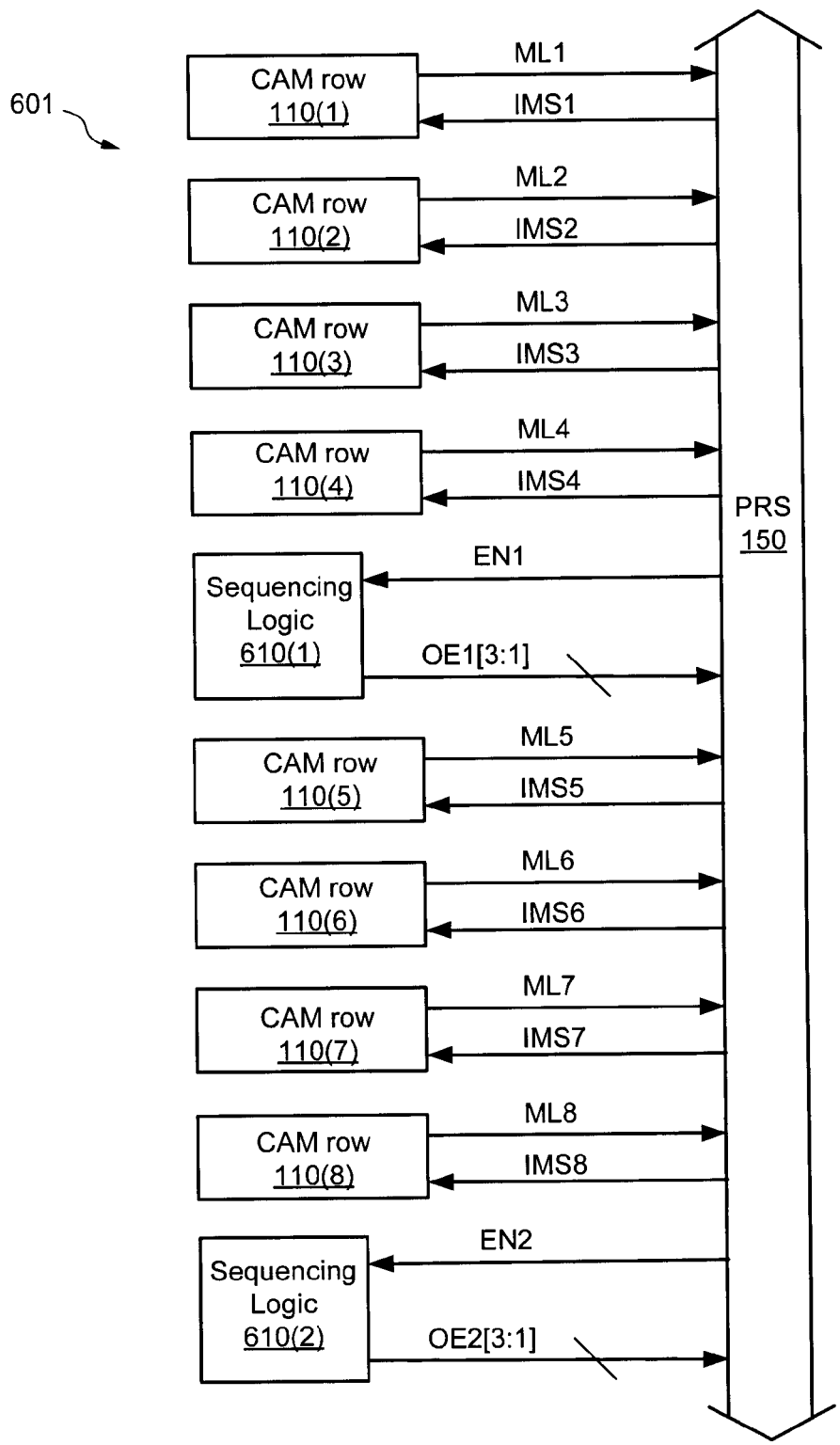
FIG. 6B shows a simplified block diagram of another embodiment of the CAM array of FIG. 6A.

Although only one SL circuit 610 is shown in FIG. 6A for simplicity, CAM array 600 can include any number of SL circuits 610 along with any number of CAM rows 110. For some embodiments, SL circuit 610 are positioned as row elements (e.g., between two rows 110 of CAM cells 112) within the CAM array, and the ratio between the number of rows of CAM cells and the number of SL circuit 610 can be selected by the device manufacturer, for example, depending upon customer needs. For example, although providing one SL circuit 610 for each row of CAM cells 110 maximizes the number and types of regular expressions that can be stored in the CAM device, it undesirably increases circuit size. Thus, for many embodiments, an SL circuit 610 is inserted as a row element between every N rows of CAM cells, where N is an integer (e.g., selected by the device manufacturer). For one embodiment, N=16. For other embodiments, SL circuit 610 can be included within selected rows 110 of the CAM array 600. For still other embodiments, SL circuit 610 can be located outside the CAM array 600. For one example, FIG. 6B shows a CAM array 601 including one SL circuit 610 inserted between four CAM rows 110.

Figure 7A:
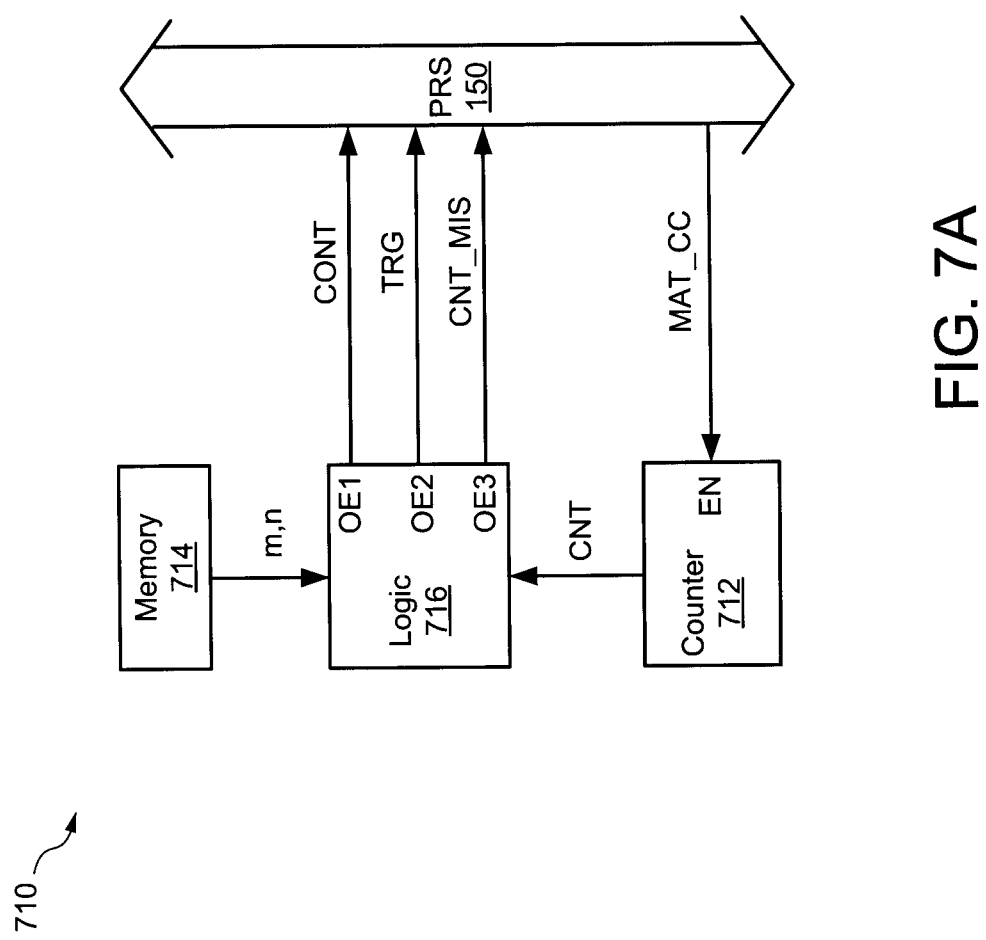
FIG. 7A shows a simplified block diagram of a first counter circuit that is one embodiment of the sequencing logic circuit of FIG. 6A.

FIG. 7A shows a counter circuit 710 that is one embodiment of SL circuit 610 of FIG. 6A. Counter circuit 710 includes a counter 712, a memory 714, and compare logic 716. Counter 712, which can be any suitable binary counter, has an enable input (EN) to receive the character class match signal (MAT_CC) from the character class CAM rows via PRS 150, and has an output to provide the count value (CNT) to logic 716. Memory 714, which can be any suitable type of memory, stores the quantifier values $\{m, n\}$ of an associated regular expression and is coupled to compare logic 716. The quantifier values $\{m, n\}$ can be loaded into memory 714 in any suitable manner, for example, during configuration of CAM array 600.

Compare logic 716 includes an input to receive CNT from counter 712, a control input to receive the quantifier values from memory 714, and outputs OE1-OE3 selectively connected to the signal routing lines of PRS 150. For some embodiments, the signal on OE1 may be provided as a continue signal (CONT) to the IMS lines of the character class CAM rows, the signal on OE2 may be provided as a trigger signal (TRG) to the IMS lines of the R2 CAM rows, and the signal on OE3 may be provided as a count mismatch (CNT_MIS) signal to indicate a mismatch condition between the input string and the regular expression.

More specifically, the CONT signal generated at OE1, which indicates whether CNT has reached the minimum quantifier value $\{m\}$, can be used to selectively enable the character class CAM rows (e.g., by selectively enabling its match line pre-charge circuit 402) to examine subsequent characters of the input string for matches with the specified character class. For one embodiment, compare logic 716 asserts CONT (e.g., to logic high) if CNT<m, and the asserted state of CONT enables the character class CAM rows to determine whether subsequent input characters match the character class. Conversely, if CNT>n, compare logic 716 de-asserts CONT (e.g., to logic low), which can be used to disable the character class CAM rows for subsequent compare operations.

The TRG signal generated at OE2, which indicates whether CNT=m for quantifiers specifying an exact number $\{m\}$ of input characters to match the character class or whether m≥CNT≥n for quantifiers specifying a range $\{m,n\}$ of characters, selectively triggers the R2 CAM rows for next compare operations, for example, by routing TRG as ROW_EN to the R2 CAM rows' pre-charge circuit 402 via the PRS 150. For one embodiment, compare logic 716 asserts TRG (e.g., to logic high) if CNT is within in the specified quantifier range, and the asserted state of TRG enables the R2 CAM rows for compare operations with the next input character. Conversely, compare logic 716 de-asserts TRG (e.g., to logic low) if CNT is not within in the specified quantifier range, and the de-asserted state of TRG disables the R2 CAM rows for subsequent compare operations.

The count mismatch signal (CNT_MIS) generated at OE3, which indicates whether CNT>m for quantifiers specifying an exact number $\{m\}$ of characters or whether CNT>n for quantifiers specifying a range $\{m,n\}$ of characters, can be used to indicate that the input string does not match the intermediate expression R3 of the regular expression, and therefore does not match the regular expression. For one embodiment, compare logic 716 asserts CNT_MIS (e.g., to logic high) if CNT has exceeded the maximum quantifier value, and the asserted state of CNT_MIS can be used to indicate a mismatch condition. For other embodiments, SL circuit 610 may not provide CNT_MIS.

Referring now to FIGS. 6A and 7A, to store a regular expression having the format R1[C]$\{m\}$R2 in CAM array 600, where R3=[C]$\{m\}$, a number of first CAM rows 110(1) are programmed and logically connected together via the PRS 150 to store the prefix string R1, a number of second CAM rows 110(2) are programmed and logically connected together via the PRS 150 to store the suffix string R2, a number of third CAM rows 110(3) are programmed and logically connected together via the PRS 150 to store the character class [C], and a value of m is stored in memory 714 of counter circuit 710. Further, the match signals of the last R1 CAM row 110(1) are provided via PRS 150 to the IMS line of the first character class CAM row 110(3), and the match signals of the last character class CAM row 110(3) are provided via PRS 150 as the character class match signal (MAT_CC) to the enable input EN of counter circuit 710. The counter circuit's output signal CONT at OE1 is provided via PRS 150 to the IMS line of the first character class CAM row 110(3), the counter circuit's output signal TRG at OE2 is provided to the IMS line of the first R2 CAM row (110(2), and the counter circuit's output signal CNT_MIS is connected to the PRS 150.

For some embodiments, when searching an input string for a match with a regular expression of the form R1R3R2 stored in CAM array 600, only the first R1 CAM row 110(1) is enabled for a first compare operation with the input string, and all other CAM rows are initially disabled. Then, if there is a match condition in the R1 CAM rows 110(1), the character class CAM rows 110(3) are enabled to detect a character class match with the next input character, and the R2 CAM rows 110(2) are subsequently enabled only if there is a character class match. Conversely, if a prefix string match is not detected in the R1 CAM rows 110(1), only the R1 CAM rows 110(1) are enabled for the next compare operation. Thus, by pre-charging the match lines of only those CAM rows that need to participate in each compare operation, power consumption is reduced over prior techniques in which all CAM rows involved in regular expression search operations are enabled (e.g., pre-charged) for each compare operation.

Figure 7B:
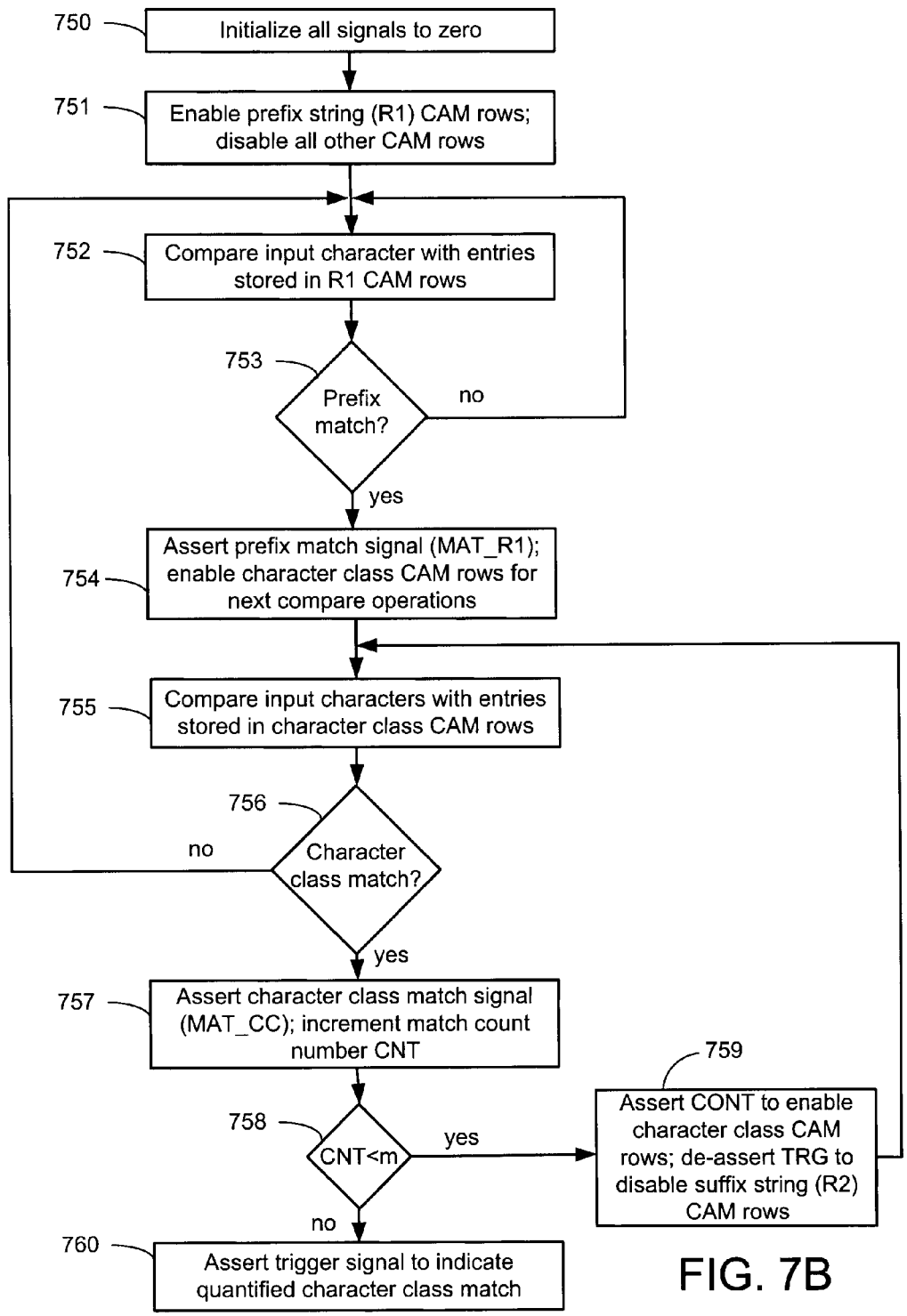
FIG. 7B is an illustrative flow chart depicting an exemplary search operation for embodiments of CAM array of FIGS. 1A-1C employing the counter circuit of FIG. 7A.

An exemplary search operation between an input string and a regular expression of the form R1[C]{m}R2 is described below with respect to the illustrative flow chart of FIG. 7B. Prior to search operations, all signals are initialized to logic zero (750). Then, the R1 CAM rows 110(1) storing the prefix string R1 are enabled (e.g., by pre-charging their match lines), and all other CAM rows are disabled (e.g., by not pre-charging their match lines) (751). Next, the current character of the input string is compared with the prefix string stored in the R1 CAM rows (752). If the R1 CAM rows 110(1) do not detect a match between the input string and the prefix string R1, as tested at 753, the R1 CAM rows 110(1) de-assert the prefix match signal (MAT_R1), which maintains the character class CAM rows 110(3) in their disabled state, and processing continues at 752. Disabling the character class rows 110(3) ensures the proper logical operation. Further, because the character class CAM rows are disabled, TRG remains de-asserted, which disables the R2 CAM rows for the next compare operation, thereby minimizing power consumption.

Conversely, if the R1 CAM rows 110(1) detect a match between the input string and the prefix string R1, as tested at 753, the R1 CAM rows 110(1) assert MAT_R1, which in turn enables the character class CAM rows 110(3) for the next compare operation (754). For some embodiments, the asserted MAT_R1 signal is routed from the R1 CAM row via PRS 150 as the row enable signal to the pre-charge circuit 402 in the character class CAM row, thereby enabling the character class CAM row for the next compare operation by pre-charging its match lines.

Note that after the initial compare operation between the first input character of the input string and data stored in embodiments of CAM device 100, the prefix string CAM rows 110(1) remain enabled so that they can detect the beginning of another potentially matching string, and all of the other CAM rows are no longer automatically disabled.

Then, the next input character is compared with the character class stored in the enabled character class R3 CAM rows (755). If the next input character matches the character class, as tested at 756, the character class CAM row asserts its match signal on ML to logic high, which causes counter circuit 710 to increment the character match count number CNT by 1 (757). For some embodiments, the asserted MAT_CC signal is routed from the R3 CAM row to the enable input of counter circuit 710 via PRS.

Conversely, if the next input character does not match the character class, as tested at 756, the R3 CAM row de-asserts MAT_CC (e.g., to logic low), and processing continues at 752.

If CNT is less than m, as tested at 758, then counter circuit 710 asserts CONT (e.g., to logic high) to enable the character class CAM rows for the next compare operation, and maintains the trigger signal (TRG) in a de-asserted (e.g., logic low) state to maintain the R2 CAM rows in a disabled state for the next compare operation (759). Thereafter, the character class CAM rows compare the next input character with the character class entries stored therein (755).

If CNT is equal to m (as tested at 758), which indicates that the specified number {m} of sequential input characters have matched the character class, counter circuit 710 asserts TRG (e.g., to logic high) to indicate the character class match, which in turn enables the R2 CAM rows for compare operations with the next input character (760). For some embodiments, the asserted MAT_CC signal is routed from the R3 CAM row as the row enable signal to the enable input of the pre-charge circuit 402 in the R2 CAM row via PRS 150. Once enabled, the R2 CAM rows determine if the input string matches the suffix string R2. Further, for some embodiments, counter circuit 710 also de-asserts CONT if CNT=m, which disables the character class CAM rows from subsequent compare operations, thereby minimizing power consumption.

Figure 7C:
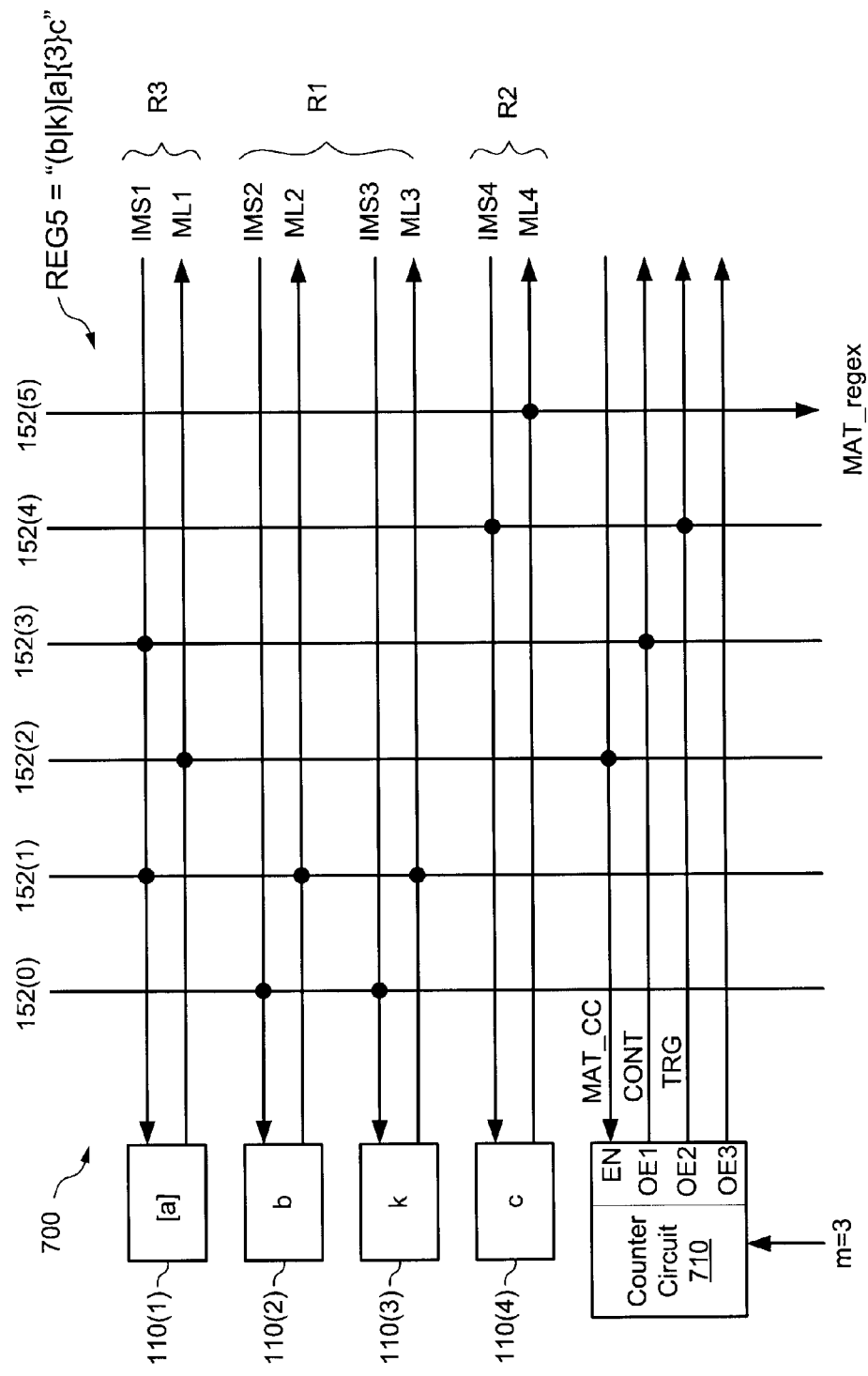
FIG. 7C shows an exemplary CAM array employing the counter circuit of FIG. 7B configured to store the regular expression REG5="(b|k)[a]{3}c"

For example, FIG. 7C shows a CAM array 700 including CAM rows 110(1)-110(4) and counter circuit 710 that are programmed and selectively interconnected via PRS 150 to store and implement search operations for the REG5="(b|k)[a]{3}c." CAM row 110(1) stores the character class [a], and is thus denoted as the character class CAM row for array 700. Of course, other character class that specify multiple characters (e.g., CC=[a–d]) can be stored in the character class row 110(1). Further, if the character class is too large to be stored in a single CAM row, then a number of CAM rows can be connected together via the PRS 150 to collectively store the character class.

CAM rows 110(2)-110(3) store the characters "b" and "k" of the prefix string R1="b|k", and are thus denoted as the R1 CAM rows for array 700. CAM row 110(4) stores the character "c," and is thus denoted as the R2 CAM row for array 700. The counter circuit 710 is programmed with m=3 so that TRG is asserted when CNT=3. Together, character class CAM row 110(1) and counter circuit 710 store and implement search operations for the intermediate expression R3="[a]{m}." Further, the signal lines 152 of PRS 150 are selectively connected to the ML and IMS lines of CAM rows 110(1)-110(4) and to the input and outputs of counter circuit 710, as indicated in FIG. 7C, to logically connect CAM rows 110(1)-110(4) and counter circuit 710 in a chain that embodies the regular expression REG5="(b|k)[a]{3}c."

More specifically, the prefix string R1="b|k" is implemented by connecting ML2 of CAM row 110(2) and ML3 of CAM row 110(3) together via PRS line 152(1) so that an input character matching either the "b" stored in CAM row 110(2) or the "k" stored in CAM row 110(3) will result in an asserted prefix match signal (MAT_R1) on PRS line 152(1). The match signal MAT_R1 on PRS line 152(1) is routed as the row enable signal to character class CAM row 110(1) via its input line IMS1 so that an input character matching either "b" or "k" will enable character class CAM row 110(1) to determine whether the next input character matches the character class [a] stored therein.

The character class CAM row 110(1) provides a character class match signal (MAT_CC) on its match line ML1, which is routed to the enable input of counter circuit 710 via PRS line 152(2). Counter circuit 710, which increments the character class match count CNT by 1 upon each consecutive assertion of MAT_CC by character class CAM row 110(1), asserts CONT while CNT<m (m=3 for this example), and then de-asserts CONT and asserts TRG when CNT=m=3. PRS line 152(3) routes CONT as the row enable signal to character class CAM row 110(1), and PRS line 152(4) routes TRG as the row enable signal to R2 CAM row 110(4). Thus, if CNT<m, counter circuit 710 asserts CONT to enable the character class CAM row 110(1) to determine if the next input character matches the character class, and if CNT=m, counter circuit 710 asserts TRG to enable the R2 CAM row 110(4) to determine if the next input character matches the suffix string R2.

In this manner, the prefix string R1="b|k" is logically connected to the intermediate expression R3="[a]{3}" by selectively enabling the character class CAM row 110(1) in response to a match condition in either of R1 CAM rows 110(2) or 110(3), and the intermediate expression R3 is logically connected to the suffix string R2 by selectively enabling R2 CAM row 110(4) in response to the trigger signal TRG generated by counter circuit 710.

For the exemplary CAM array 700 depicted in FIG. 7C, the character class CAM row 110(1) is not enabled for compare operations until a match with the prefix string is detected in the R1 CAM rows 110(2)-110(3), and the R2 CAM row 110(4) is not enabled for compare operations until a match with the intermediate expression is detected by counter circuit 710. For example, note that because ML2 and ML3 are not connected to the input line IMS4 of the R2 CAM row 110(4), a match with "blk" does not enable the R2 CAM row 110(4) for the next compare operation. In this manner, for any given compare operation associated with searching an input string for a regular expression, embodiments of the CAM device 100 enable only the CAM rows 110 which store data that needs to participate in the compare operation. For embodiments that enable the CAM rows 110 by pre-charging their match lines, pre-charging the match lines of only the CAM rows 110 which store data that needs to participate in the compare operation can reduce power consumption over CAM devices that pre-charge the match lines of all rows that store valid data for each compare operation.

An exemplary operation of CAM array 700 for performing string search operations between an input string and REG5 is as follows. If the first input character is "b" or "k," one of R1 CAM rows 110(2) or 110(3) asserts its match signal, which is routed to the IMS line of the character class CAM row 110(1) as MAT_R1. Then, if the next input character is an "[a]," CAM row 110(1) asserts the match signal on ML1, which is routed to the EN input of counter circuit 710 as MAT_CC and causes counter circuit 710 to increment CNT to 1. Because CNT<m, counter circuit 710 asserts CONT, which is routed as a row enable signal to the IMS line of the character class CAM row 110(1) and thereby enables CAM row 110(1) to compare the next input character with the character class [a]. If CAM row 110(1) detects a sequence of three "a's" in the input string, which causes three consecutive assertions of MAT_CC, counter circuit 710 asserts TRG, which is routed as a row enable signal to the IMS line of the R2 CAM row 110(4) and thereby enables the R2 CAM row 110(4) to compare the next input character with the string R2="c." Then, if the next input character is a "c," the R2 CAM row 110(4) asserts the match signal on ML4, which indicates that the input string matches the regular expression REG5. For some embodiments, the match signal on ML4 can be provided to the priority encoder 130 (not shown in FIG. 7C for simplicity).

Note that the strings and character classes for REG5 can be stored in the CAM array 700 of FIG. 7C in any suitable order, and do not need to occupy a block of contiguous CAM rows. Further, although the exemplary embodiment of CAM array 700 depicts PRS 150 as having 6 signal lines 152 that each span across all 4 CAM rows 110 and the counter circuit 710, for actual embodiments, PRS 150 can have other numbers of signal lines 152, and each signal line 152 can have any suitable length, for example, as described with respect to FIG. 5A.

Alternatively, REG5 can be implemented in present embodiment without a counter, for example, by storing REG5 in the CAM array in its unrolled form.

More complex regular expressions in which multiple characters in the input string can trigger separate search operations for the same character class can be difficult to efficiently store in embodiments of CAM array 700 that employ counter circuit 710. For example, the regular expression REG6="ab+([a-z]){4}xy" is more complex than REG5 because REG6's intermediate expression R3="[a-z]{4}" overlaps (e.g., includes the same characters as) its prefix string R1="ab+". More specifically, because R3 overlaps R1, it is possible that each of a sequence of input characters can trigger a separate character class sub-search operation for R3 while simultaneously matching the prefix string R1="ab+," which requires a separate instance of counter circuit 710 to perform each overlapping character class sub-search.

Figure 7D:
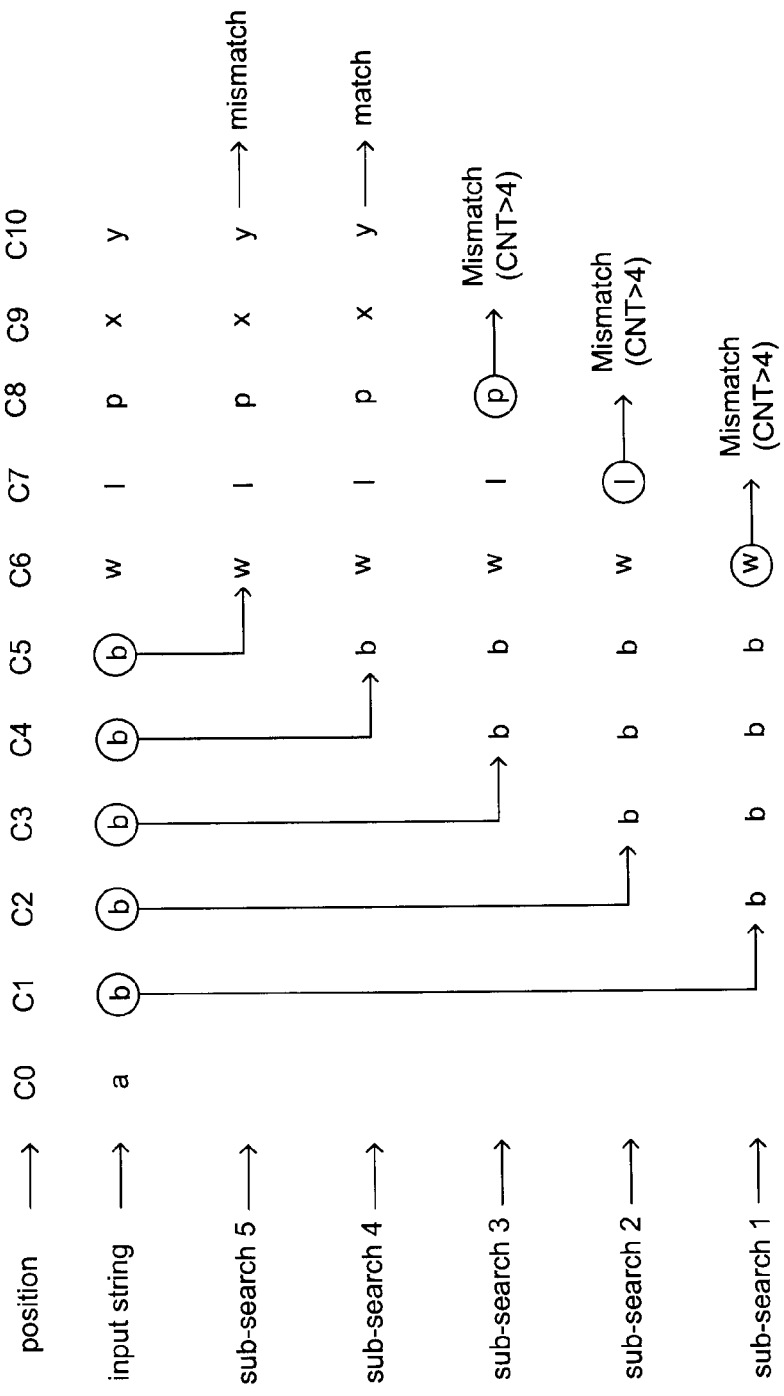
FIG. 7D illustrates a search operation between an input string and the regular expression REG6="ab+[a–z]{4}xy" using embodiments of CAM array of FIGS. 1A-1C employing the counter circuit of FIG. 7A.

For example, when searching an input string S4="abbbbbw|pxy" for the REG6="ab+([a-z]){4}xy" using CAM array 700 employing counter circuit 710, each instance of "b" in the input string constitutes a separate match with R1="ab+" that triggers a separate character class sub-search operation "[a-z]{4}," which results in a plurality of concurrent and overlapping character class sub-searches. More specifically, referring to FIG. 7D, the first instance of "b" at position C1 in the input string matches R1 and thus triggers a first sub-search for the character class [a-z] beginning with the "b" at position C2, the second instance of "b" at position C2 in the input string also matches R1 and thus triggers a second sub-search for the character class [a-z] beginning with the "b" at position C3 and is also a character match for the first sub-search, the third instance of "b" at position C3 in the input string also matches R1 and thus triggers a third sub-search for the character class [a-z] beginning with the "b" at position C4 and is also a character match for the second sub-search, the fourth instance of "b" at position C4 in the input string also matches R1 and thus triggers a fourth sub-search for the character class [a-z] beginning with the "b" at position C5 and is also a character match for the third sub-search, and the fifth instance of "b" at position C5 in the input string matches R1 and thus triggers a fifth sub-search for the character class [a-z] beginning with the "w" at position C7 and is also a character match for the fourth sub-search. Thus, because counter circuit 710 includes only one counter 712, five separate instances of counter circuit 710 are required to maintain separate character class match counts for the five different character class sub-searches when searching the input string S4 for REG6.

The first, second, and third sub-searches result in mismatches because the number of characters CNT matching [a-z] exceeds m=4 prior to a match with the suffix string R2="xy." The fourth sub-search results in a match because a first portion of the input string "abbbb" matches R1="ab+," a second portion of the input string "bw|p" matches R3="[a-z]{4}," and a third portion of the input string "xy" matches R3="xy." The fifth sub-search results in a mismatch because a first portion of the input string "abbbbb" matches R1="ab+," a second portion of the input string "w|px" matches R3="[a-z]{4}," and a third portion of the input string "y" does not match R3="xy."

As described above, using CAM array 700 to search input streams for REG6 requires a separate instance of counter circuit 710 for each instance of "b" appearing in a sequence after "a" in an input stream, which is not desirable because the input streams are not known in advance. As a result, in actual applications, a particular embodiment of CAM array 700 may not include enough instances of counter circuit 710 to search a given input stream. Further, even if there are sufficient numbers of counter circuits 710, connecting multiple instances of counter circuits 710 to various CAM rows 110 consumes valuable signal routing resources of PRS 150, and may therefore limit the number of CAM rows 110 that PRS 150 can selectively interconnect.

Further, although the regular expression REG6 can be unrolled and expressed as "ab+[a–z][a–z][a–z][a–z]xy" for storage in the CAM array 600 of FIG. 6A, regular expressions having large quantifier values, such as "ab+[a–z]{5000}xy," would consume an unacceptably large number of the CAM rows 110, and therefore simply unrolling a regular expression for storage in CAM array 600 may not result in an efficient use of the CAM storage area.

Figure 8A:
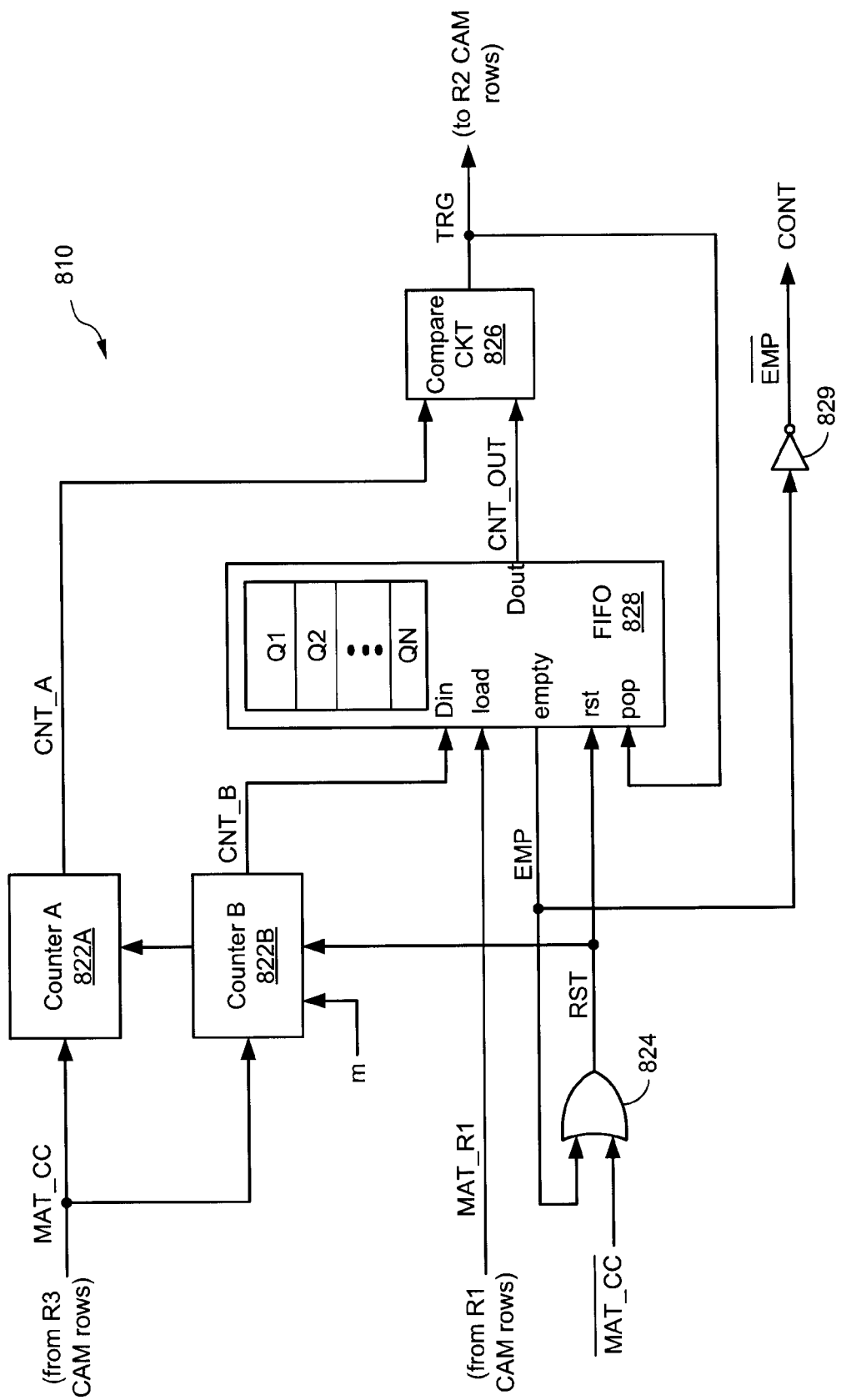
FIG. 8A shows a simplified block diagram of a second counter circuit that is another embodiment of the sequencing logic circuit of FIG. 6A.

Accordingly, FIG. 8A shows a counter circuit 810 that is another embodiment of the sequencing logic circuit 610 of FIG. 6A. The general operation of counter circuit 810 is similar to that of counter circuit 710 of FIG. 7A, except that counter circuit 810 of FIG. 8A includes a second counter and a FIFO memory element that allow character class match counts to be maintained for multiple overlapping sequences of input characters at the same time which, as described in more detail below, allows CAM arrays employing embodiments of counter circuit 810 to store and implement search operations for regular expressions containing an overlapping intermediate expression R3 and prefix string R1 string using only one instance of a counter circuit. In this manner, CAM arrays employing embodiments of counter circuit 810 can store regular expressions having an overlapping prefix string and intermediate expression [C]{m} in their rolled format, which as discussed above requires significantly less storage area that CAM arrays which are required to store regular expressions in their unrolled format.

As shown in FIG. 8A, counter circuit 810 includes a first counter 822A (counter A), a second counter 822B (counter B), a logic OR gate 824, a compare circuit 826, a counter FIFO queue 828, and a logical inverter 829. First counter 822A includes an input to receive match MAT_CC from the character class R3 CAM rows 110(3) via the PRS 150, a reset input to receive a reset signal RST generated by OR gate 824, and an output to provide a first counter value CNT_A to a first input of compare circuit 826. Second counter 822B includes an input to receive MAT_CC, a reset input to receive RST, and an output to provide a second count value CNT_B to a data input (Din) of FIFO register 828.

For some embodiments, CNT_A is initialized to 0, and CNT_B is initialized to the quantifier value {m} specified in the regular expression to be stored in the CAM array. Further, counters 822A and 822B are configured to increment CNT_A and CNT_B, respectively, by 1 upon each assertion of MAT_CC. Thus, during search operations, each time an input character matches the character class stored in the R3 CAM rows 110(3), CNT_A and CNT_B are both incremented by 1, and therefore the current values of CNT_A and CNT_B provided by counters 822A and 822B, respectively, are always offset by the specified quantifier value {m}. As described in more detail below, maintaining an offset between CNT_A and CNT_B equal to {m} can be used by FIFO queue 828 to determine whether each of a plurality of overlapping character class sub-searches results in a match condition between a corresponding portion of the input string and the R3 intermediate expression.

FIFO queue 828, which can be any suitable buffer, register, or other memory device, includes a number N of storage locations Q1-QN for storing up to N counter entries in a first-in, first-out (FIFO) manner. Thus, for some embodiments, FIFO queue 828 can be a well-known FIFO memory. For the exemplary embodiment shown in FIG. 7B, queue 828 includes a data input (Din) to receive CNT_B from counter 822B, a reset terminal (rst) to receive RST from OR gate 824, a load terminal (load) to receive a match signal (MAT_R1) from the R1 CAM rows 110(1) (see also FIG. 7A), a "pop" terminal (pop) to receive a pop signal, a data output terminal (Dout) to output the CNT_B entry stored at the top of queue 828 to a second input of compare circuit 826 as CNT_OUT, and a control output terminal (empty) to provide the empty signal EMP to a first input of OR gate 824, which includes a second input to receive $\overline{\text{MAT\_CC}}$.

Further, for exemplary embodiments described herein, queue 828 is configured to include a number of storage locations Q equal to the specified quantifier m (e.g., N={m}). Of course, for other embodiments, queue 828 can have any suitable number of storage locations or queues Q. Further, for some embodiments, well-known head and tail pointers can be used to indicate the head and tail, respectively, of the queue.

OR gate 824 logically combines $\overline{\text{MAT\_CC}}$ (which is the logical complement of MAT_CC) with EMP to generate the reset signal RST. Thus, for some embodiments, OR gate 824 asserts RST (e.g., to logic high) when either EMP is asserted (e.g., to logic high) to indicate that the queue 828 is empty, or when $\overline{\text{MAT\_CC}}$ is de-asserted to logic high to indicate that the current input character does not match the character class, and therefore the search operation results in a mismatch condition. The asserted state of RST resets the queue 828 to its initial state, causes counter 822A to reset CNT_A to 0, and causes counter 822B to reset CNT_B to m.

Further, for some embodiments, the signal EMP can be logically complemented by a logical inverter 829 to generate $\overline{\text{EMP}}$, which in turn can be used as the CONT signal and provided to the IMS line of the R3 CAM rows (e.g., as the row enable signal). Thus, for example, when queue 828 is not empty, EMP is de-asserted, and the asserted state of $\overline{\text{EMP}}$ provided as CONT enables the R3 CAM rows to continue character class compare operations.

During search operations, each time the R1 CAM rows assert MAT_R1 to indicate a match between a portion of the input string and the prefix string R1, the current value of CNT_B is loaded into the first available location of queue 828. For example, if queue 828 is empty and MAT_R1 is asserted, then the current value of CNT_B is loaded into the top location Q1 of the queue, if queue location Q1 already stores a value of CNT_B and then MAT_R1 is asserted, then the current value of CNT_B is loaded into the next available queue location Q2, and so on. In this manner, each CNT_B entry stored in queue 828 represents a corresponding one of a plurality of separate yet overlapping character class sub-searches to be performed by the R3 CAM rows. Further, because the current values of CNT_A and CNT_B are always offset by {m}, the value of each CNT_B entry stored in queue 828 indicates the relative position in the input string of the first character of the corresponding sequence of m input characters that can potentially match the R3 expression. Thus, as explained in more detail below, each CNT_B entry stored in queue 828 can be used as a marker to indicate which input character triggered the corresponding character class sub-search operation.

For purposes of discussion herein, the CNT_B entry located at the top of queue 828 and output to compare circuit 826 as CNT_OUT is also referred to herein as the top-of-queue entry (CNT_B_toq).

Compare circuit 826, which can be any well-known compare circuit, compares the value of CNT_A with CNT_B_toq to generate a trigger signal TRG that indicates whether a sequence of {m} input characters beginning with the input character corresponding to CNT_B_toq has matched the specified character class. The trigger signal TRG is provided as a pop signal to the pop input of queue 828. Further, referring also to FIG. 7A, the trigger signal TRG is output from counter circuit 810 at OE2 and is routed as the IMS signal to the R2 CAM rows 110(2) via PRS 150. Thus, when asserted, the trigger signal TRG triggers search operations for the suffix string R2, for example, by enabling the R2 CAM rows' pre-charge circuits 402 to pre-charge their match lines for compare operations.

As mentioned above, CNT_A is initialized to 0, CNT_B is initialized to m, CNT_B is loaded into the queue 828 each time MAT_R1 is asserted to indicate a prefix string match, and both CNT_A and CNT_B are incremented by 1 each time MAT_CC is asserted to indicate a character class match with an input character. Note that the assertion of MAT_R1 also enables the R3 CAM rows 110(3) to perform a character class search on the next input character. Thus, after the first CNT_B entry is loaded into queue 828 in response to the first R1 match, for each subsequent input character that forms another (e.g., overlapping) input string portion that matches R1, MAT_R1 is asserted and causes the current value of CNT_B to be loaded into the next available location in queue 828. Thus, in accordance with the present invention, each CNT_B entry stored in the counter queue 828 identifies a corresponding input character as the first in a sequence of m input characters that can potentially match the specified and quantified character class. Thus, for a selected CNT_B entry stored in the queue 828, if the next m input characters match the character class, then the corresponding m assertions of MAT_CC will increment CNT_A m times so that CNT_A becomes equal to CNT_B_toq, and thus the sequence of m input characters beginning with the character corresponding to the selected CNT_B entry will match R3.

In response to CNT_A=CNT_B_toq, compare circuit 826 asserts TRG (e.g., to logic high) to indicate that a portion of the input string has matched the R3 expression. The asserted state of TRG activates the R2 CAM rows 110(2) for compare operations with the next input characters to detect a match with the regular expression's suffix string R2. More specifically, referring also to FIG. 4A, the asserted TRG signal generated by counter circuit 810 and routed as an IMS signal to the R2 CAM rows 110(2) by PRS 150 forces the R2 CAM rows' pre-charge circuit 402 to turn on and pre-charge its match line ML2, thereby enabling the R2 CAM rows 110(2) for compare operations with the next input character.

The asserted state of TRG also causes queue 828 to "pop" or remove the CNT_B_toq entry from queue 828 because the sequence of input characters beginning with the input character corresponding to the popped CNT_B_toq entry has already matched the quantified character class Thereafter, the next oldest CNT_B entry is now set as the head of the queue, e.g., as CNT_B_toq, and the next input character is compared with the prefix stored in the R1 CAM rows and the character class stored in the R3 CAM rows. The next input character is also compared with the suffix stored in the R2 CAM rows because the R2 CAM rows were triggered by the earlier character class match.

If the next input character matches the character class, CNT_A and CNT_B are asserted, and CNT_A is compared with CNT_B_toq. If CNT_A=CNT_B_toq, TRG is asserted again to indicate another overlapping portion of the input string matches R3, the R2 CAM rows 110(2) are enabled, and CNT_B_toq is popped from the queue 828.

If the next input character also matches the R1 prefix string, MAT_R1 is asserted, and the current value of CNT_B is loaded into the next highest available location in queue 828, thereby indicating that this next character has triggered another character class sub-search in an overlapping portion of the input string.

Figure 8B:
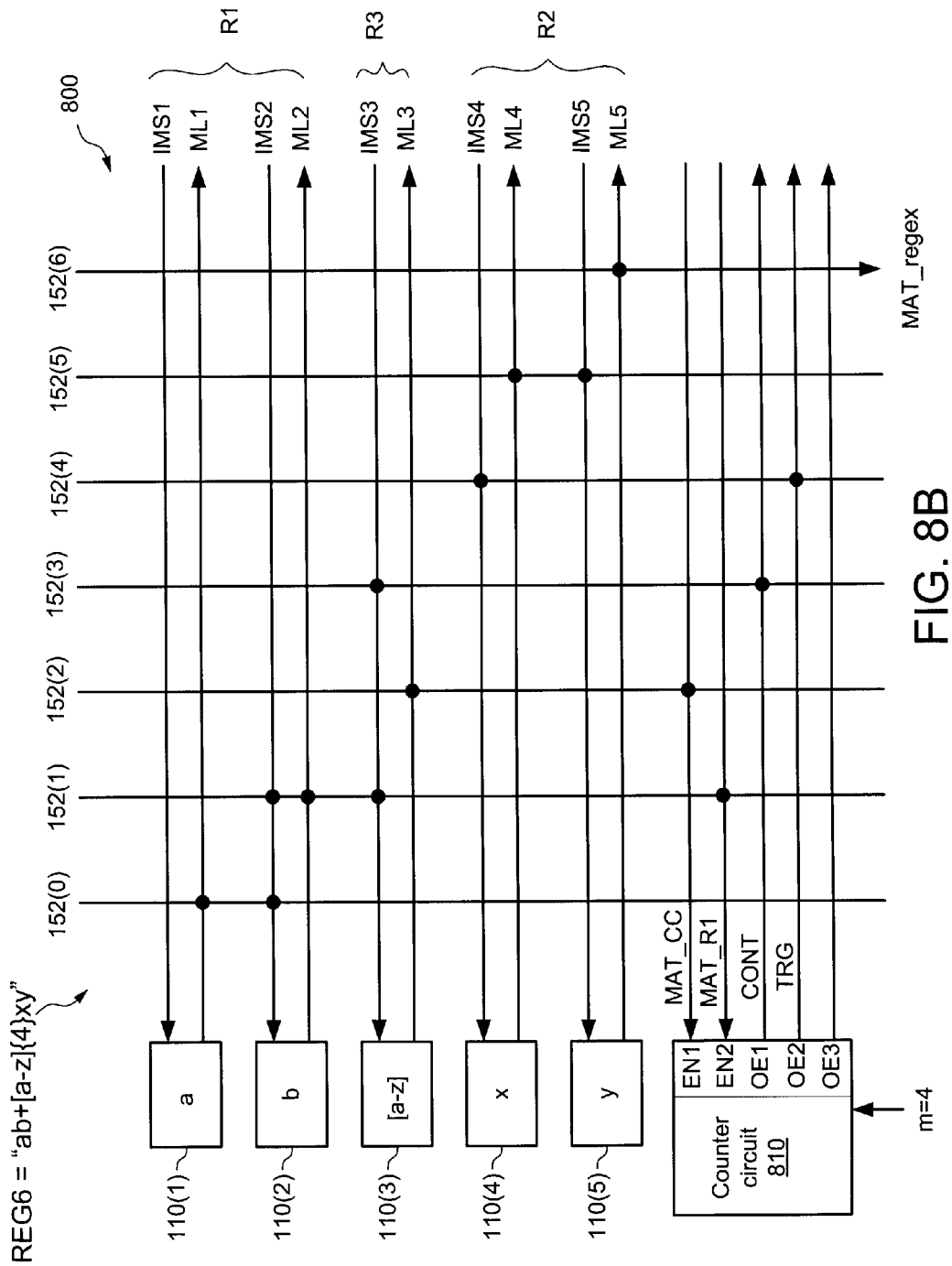
FIG. 8B shows an exemplary CAM array employing the counter circuit of FIG. 8A configured to store the regular expression REG6="ab+[a–z]{4}xy"

For example, FIG. 8B shows a CAM array 800 including CAM rows 110(1)-110(5) and counter circuit 810 that are programmed and selectively interconnected via PRS 150 to store and implement search operations for the REG6="ab+([a–z]){4}xy." CAM row 110(1) stores the character "a", CAM row 110(2) stores the character "b," CAM row 110(3) stores the character class [a–z], CAM row 110(4) stores the character "x," CAM row 110(5) stores the character "y," and the counter circuit 810 stores the quantifier value m=4.

More specifically, CAM rows 110(1)-110(2) are connected to together as the R1 CAM rows to store the prefix string R1="ab+," where the logical AND function "ab" is implemented by routing the match signal from CAM row 110(1) on ML1 as the row enable signal to CAM row 110(2) via its input line IMS2 and the PRS line 152(0), and the function "+" is implemented by routing the match signal from CAM row 110(2) on ML2 as its own row enable signal via the PRS line 152(1). Thus, the "b" CAM row 110(2) is enabled for a next compare operation if the previous input characters are "a," "ab," "abb," "abbb," and so on, and can assert its match signal MAT_R1 in sequential compare operations because after the prefix string "ab" is detected in the input string, each subsequent input character that is a "b" constitutes another (e.g., separate) prefix string match and thus triggers a separate character class match operation.

The prefix match signal MAT_R1 generated by CAM row 110(2) on ML2 is also routed to the input line IMS3 of CAM row 110(3) and to the EN2 input of counter circuit 810 via PRS line 152(1), and therefore enables the character class CAM row 110(3) and counter circuit 810 when asserted. The match signal of character class CAM row 110(3) on ML3 is routed as MAT_CC to the EN1 input of counter circuit 810 via PRS line 152(2), and the CONT signal generated by counter circuit 810 is routed as a row enable signal to character class CAM row 110(3) via its input line IMS and PRS line 152(3). In this manner, character class CAM row 110(3) and counter circuit 810 store and implement search operations for the intermediate expression R3="[a–z]{4}." For some embodiments, character class CAM row 110(3) can also be enabled by its output match signal MAT_CC.

Further, the TRG signal generated by counter circuit 810 is routed as a row enable signal to CAM row 110(4). The match signal for CAM row 110(4) on ML4 is routed to the input line IMS5 of CAM row 110(5) via PRS line 152(5), thereby connecting CAM rows 110(4) and 110(5) together in an AND configuration to store the suffix string R2="xy." The match signal from CAM row 110(5) on ML5 indicates whether there is a match condition between the input string and REG6, and can be accessed from anywhere in the CAM array on PRS line 152(6). The match signal on ML5 can also be output as the match result.

Thus, by programming the CAM cells of rows 110(1)-110(5) with the character values "a," "b," [a–z], "x," and "y," respectively, programming the counter circuit 810 with the specified quantifier value m=4, and configuring the signal lines 152 of the PRS 150 to selectively interconnect the match lines (ML) and the input match signal (IMS) lines of CAM rows 110(1)-110(5) with each other and to the counter circuit 810 in the manner depicted in FIG. 8B, CAM array 800 is configured to store and implement search operations for the regular expression REG6="ab+[a–z]{4}xy" using only hardware components. This is in contrast to other regular expression search engines that delegate multiple overlapping character class search operations to processors that execute microcode embodying the character class and quantifier numbers.

As discussed above, delegating portions of a regular expression search operation to a processor that executes microcode embodying sub-expressions of the regular expression is problematic. First, employing a processor to perform selected aspects of a regular expression search operation (e.g., such as character class sub-searches) involves various latencies associated with locating and retrieving the correct microcode from an associated memory, loading the retrieved microcode into the processor, and executing the code. These latencies can degrade performance. Second, breaking a regular expression into separate components and then delegating the separate components to various hardware and software solutions is cumbersome and difficult to manage. Accordingly, by implementing regular expression search operations using only configurable hardware components (e.g., that do not have to execute code embodying any portion of the regular expression), embodiments of the present invention may achieve better performance than software-based regular expression search techniques.

Referring again to FIGS. 8A-8B, an exemplary search operation between REG6="ab+[a–z]{4}xy" and an input string S7="abbbbbabbbbbxyxy" using the CAM array 800 configured according to FIG. 8B is summarized below in Table 3.

TABLE 3

REG6 = ab + [a – z]{4}xy

| input character | cycle | CNT_A | CNT_B | queue contents | TRG signal | R2 state |
|---|---|---|---|---|---|---|
| a | 1 | 0 | 4 | | | |
| b | 2 | 0 | 4 | 4 | 0 | |
| b | 3 | 1 | 5 | 5,4 | 0 | |
| b | 4 | 2 | 6 | 6,5,4 | 0 | |
| b | 5 | 3 | 7 | 7,6,5,4 | 0 | |
| b | 6 | 4 | 8 | 8,7,6,5 | 1 | active |
| a | 7 | 5 | 9 | 8,7,6 | 1 | active |
| b | 8 | 6 | 10 | 10,8,7 | 1 | active |
| b | 9 | 7 | 11 | 11,10,8, | 1 | active |
| b | 10 | 8 | 12 | 12,11,10, | 1 | active |
| b | 11 | 9 | 13 | 13,12,11,10 | 0 | inactive |
| b | 12 | 10 | 14 | 14,13,12,11 | 1 | active |
| x | 13 | 11 | 15 | 14,13,12 | 1 | active |
| y | 14 | 12 | 16 | 14,13 | 1 | detected |
| x | 15 | 13 | 17 | 14 | 1 | active |
| y | 16 | 0 | 4 | | 0 | detected |

Streams detected: ab bbbb xy
abbbb bbxy xy

For the search operation depicted above in Table 3, note that CNT_A is initialized to 0, and CNT_B is initialized to m=4. During cycle 1, input character "a" matches CAM row 110(1), which asserts ML1 and enables CAM row 110(2). During cycle 2, input character "b" matches CAM row 110(2), which asserts MAT_R1. The asserted state of MAT_R1 enables R3 CAM rows 110(3), and causes CNT_B=4 to be loaded into queue 828 of counter circuit 820. Then, during each of cycles 3-6, the input character "b" matches both R1="ab+" and the previously triggered character class [a–z], and therefore results in the assertion of both MAT_R1 and MAT_CC. Thus, in each of cycles 3-6, the asserted state of MAT_R1 loads the current CNT_B into the queue 828, and the asserted MAT_CC increments CNT_A and CNT_B by 1, as depicted in Table 3.

Then, in cycle 6, CNT_A=4 and therefore matches the top queue entry, CNT_B_toq=4. In response thereto, compare circuit 826 asserts TRG, which enables R2 CAM rows 110(4)-110(5) for compare operations to match R2="xy," and pops CNT_B=4 from the top of the queue 828. Then, in cycle 7, the input character "a" does not match the "b" CAM row 110(2), which in response thereto de-asserts MAT_R1. The de-asserted state of MAT_R1 does not enable the R3 CAM rows 110(3), and does not load the current value of CNT_B=9 into queue 828, as indicated in Table 3. The remaining cycles 8-16 proceed in a similar manner. Note that in cycle 11, the trigger signals are not asserted. Further, for the above example, the states and values in Table 3 are indicated for the completion of each cycle.

As described above, counter circuit 810 of FIG. 8B is able to detect a plurality of overlapping sequences of input characters at the same time for a specified quantifier value {m}. However, if the quantifier is a range {m,n}, which means that any input pattern having at least m character class matches but no more than n character class matches will match R3, the counter circuit 810 of FIG. 8B can only detect the matching input patterns that have exactly m character class matches. More specifically, when compare circuit 826 determines the CNT_A=CNT_B_toq, TRG is asserted to indicate the match, and CNT_B_toq is popped from the queue 828. As a result, there is no way to tell if an overlapping pattern having m+1 character class matches also exists using compare circuit 826.

Thus, in accordance with another embodiment of the present invention, a counter circuit is disclosed that can determine whether a portion or multiple overlapping portions of an input string match a range {m,n} of instances of specified characters.

Figure 8C:
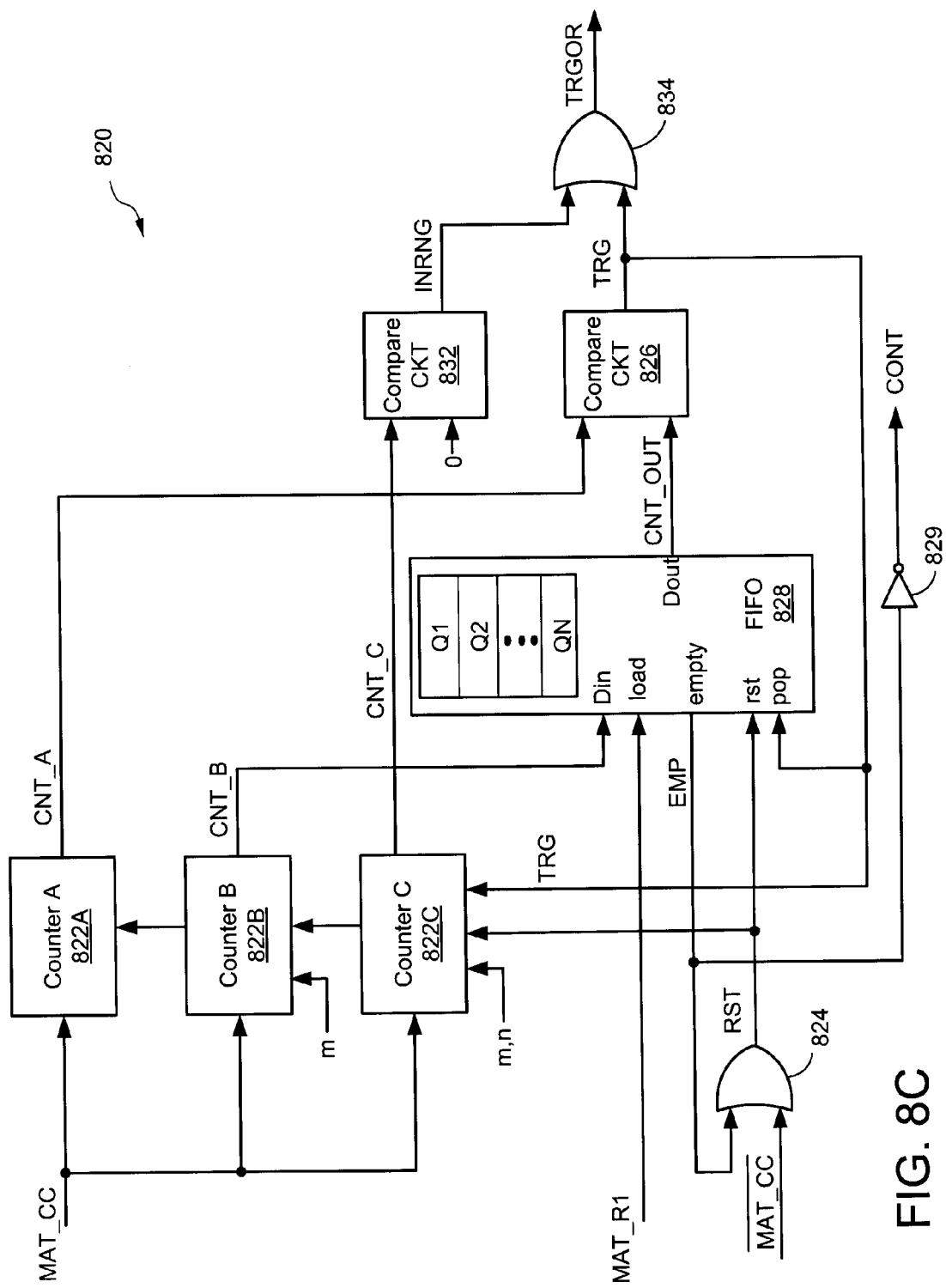
FIG. 8C shows a simplified block diagram of a third counter circuit that is yet another embodiment of the sequencing logic circuit of FIG. 6A.

More specifically, FIG. 8C shows a counter circuit 820 that is yet another embodiment of the sequencing logic circuit 610 of FIG. 6A. The general architecture and operation of counter circuit 820 is similar to that of counter circuit 810 of FIG. 8A, except that counter circuit 820 additionally includes a third counter 822C, a second compare circuit 832, and a second OR gate 834 that allow counter circuit to maintain character class match counts for overlapping sequences of input strings when the character class quantifier is a range {m,n}.

Third counter 822C includes an input to receive the character class match signal (MAT_CC), a data terminal to receive the quantifier values {m,n}, a reset terminal to receive RST, a set terminal to receive TRG from compare circuit 826, and an output to provide a third count signal CNT_C. For exemplary embodiments of FIG. 8C, third counter 822C is configured to initialize CNT_C to 0, and to increment CNT_C by 1 upon each assertion of MAT_CC until CNT_C equals n–m. When CNT_C=n–m, counter 822C resets CNT_C to 0. Thus, for some embodiments, third counter 822C includes compare logic (not shown for simplicity) that resets CNT_C to 0 if CNT_C becomes equal to n–m. Note that the value n–m represents the difference in length between the shortest input string (e.g., having m input characters) that matches R3=[C]{m,n} and the longest input string (e.g., having n input characters) that matches R3=[C]{m,n}. Further, note that the assertion of TRG, which indicates that a sequence of m input characters has matched the character class, also causes third counter 822C to set CNT_C to 1.

More specifically, when a sequence of m input characters is determined to match the character class, the third counter 822C sets CNT_C to 1 in response to the asserted state of TRG, and then begins incrementing CNT_C by 1 upon each subsequent assertion of MAT_CC to ensure that input sequences having more than m characters are detected (e.g., when CNT_C>0), compare circuit 832 forces OR gate 834 to assert the trigger signal, which in turn enables the R2 CAM rows and indicates additional possible matches). Then, when CNT_C becomes equal to n–m, counter 822C resets CNT_C to 0, which causes compare circuit 832 to de-assert an in-range signal (INRNG). Thus, by allowing CNT_C to increment only to a maximum value given by n–m, counter 822C and compare circuit 832 also ensure that sequences of matching input characters do not include more characters than the quantified limit {n}.

Compare circuit 832, which can be any suitable or well-known compare circuit, includes a first input to receive CNT_C, a second input to receive a logic 0, and an output to generate the in-range signal (INRNG). For some embodiments, compare circuit 832 asserts INRNG to logic high when CNT_C>0, and de-asserts INRNG to logic low when CNT_C=0. The in-range signal INRNG is provided to the first input of OR gate 834, which includes a second input to receive TRG from compare circuit 826, and includes an output to generate a wired-OR trigger signal TRGOR that is provided as the trigger signal to enable the R2 CAM rows for compare operations. During search operations, OR gate 834 asserts TRGOR to logic high if either TRG or INRNG is asserted (e.g., to logic high). Thus, if compare circuit 826 detects a sequence of m input characters that match the character class, TRG is asserted and thereby also asserts TRGOR to trigger the R2 string search. Also, if CNT_C>0, which indicates that the number of additional matching input characters in the sequence does not exceed the limit $\{n-m\}$, compare logic 832 asserts INRNG, which in turn asserts TRGOR.

As mentioned above, overall operation of counter circuit 820 of FIG. 8C is similar to that of counter circuit 810 of FIG. 8A, except for the function of the third counter 822C and its associated compare circuit 832. Initially, CNT_A is set to 0, CNT_B is set to m, and CNT_C is set 0. During search operations between an input string of characters and one or more regular expressions stored in CAM device 700, each assertion of MAT_CC increments CNT_A, CNT_B, and CNT_C by 1, and each assertion of MAT_R1 loads the current value of CNT_B into the highest available location in queue 828, and also enables the R3 CAM rows 110(3) to perform a character class search on the next input character.

For example, during a search operation between an input string and a regular expression of the format R1[C]{m,n}R2, when a first portion of the input string matches R1, MAT_R1 is asserted and the initial value of CNT_B is loaded into queue 828. For this example, assume that each of the next m input characters matches the character class, but does not match R1. Thus, because there is no R1 match, MAT_R1 is not subsequently asserted, and additional values of CNT_B are not loaded into the queue 828. However, in response to the sequence of m character class matches, MAT_CC is asserted m times, which causes CNT_A, CNT_B, and CNT_C to be incremented m times. Thus, because CNT_A=CNT_B_toq=m, compare circuit 826 asserts TRG to indicate the matching string of m input characters. The asserted state of TRG causes OR gate 834 to assert TRGOR, which in turn enables the R2 CAM rows. The asserted state of TRG also pops CNT_B_toq from the queue 828, and resets CNT_C to 1. Because CNT_B_toq=m is no longer in the queue, CNT_A≠CNT_B_toq, and thus compare circuit 826 de-asserts TRG. However, because CNT_C was set to 1 in response to the assertion of TRG, compare circuit 832 asserts INRNG, and thus OR gate 834 maintains TRGOR in the asserted state.

However, if the next input character matches the character class, MAT_CC is asserted, and increments CNT_C by 1. In response thereto, compare circuit 834 asserts INRNG to indicate that the sequence of m+1 matching input characters is still within the specified range {m,n}, which causes OR gate 834 to assert TRGOR and thereby enable the R2 CAM rows for compare operations with the next input character. Counter circuit 820 allows incrementally longer sequences of input characters that match the character class to trigger the R2 CAM rows until CNT_C reaches n-m, which indicates that n input characters have matched the character class. Thus, when CNT_C=n-m, counter 822C resets CNT_C to 0, and in response thereto compare circuit 832 de-asserts INRNG to indicate that the sequence of matching input characters exceeds the quantified limit {n}. Because compare circuit 826 detects only a sequence of exactly {m} matching input characters, TRG remains de-asserted, and thus OR gate 834 forces TRGOR to a de-asserted state and disables the R2 CAM rows for compare operations with the next input character.

An exemplary search operation between REG7="ab[a–z]{2,4}xy" and an input string S7="abbbbbabbbbbxyxy" using counter circuit 820 employed in the CAM array 600 is depicted below in Table 4.

| REG7 = ab[a – z]{2,4}xy | | | | | | |
|---|---|---|---|---|---|---|
| input character | cycle | CNT_A | CNT_B | CNT_C | queue contents | R2 TRGOR state |
| a | 1 | 0 | 2 | 0 | | 0 |
| b | 2 | 0 | 2 | 0 | 2 | 0 |
| a | 3 | 1 | 3 | 0 | 2 | |
| b | 4 | 2 | 4 | 0 | 4 | 1 active |
| a | 5 | 3 | 5 | 1 | | 1 active |
| b | 6 | 4 | 6 | 2 | 6 | 1 active |
| x | 7 | 5 | 7 | 1 | 6 | 1 active |
| y | 8 | 6 | 8 | 2 | | 1 detected |
| x | 9 | 7 | 9 | 1 | | 1 active |
| y | 10 | 8 | 10 | 2 | | 1 detected |
| x | 11 | 0 | 2 | 0 | | active |
| y | 12 | 0 | 2 | 0 | | detected |
| x | 13 | | | | | inactive |

Streams Detected: ab ab xy
ab abab xy
ab abxy xy
ab xy xy
ab xyxy xy

For other embodiments of the present invention, the counter circuits described above with respect to FIGS. 8A-8C may be replaced with shift-register circuits that can detect multiple overlapping sequences of input characters that match the intermediate expression R3=[C]{m} specified in a regular expression.

Figure 9A:
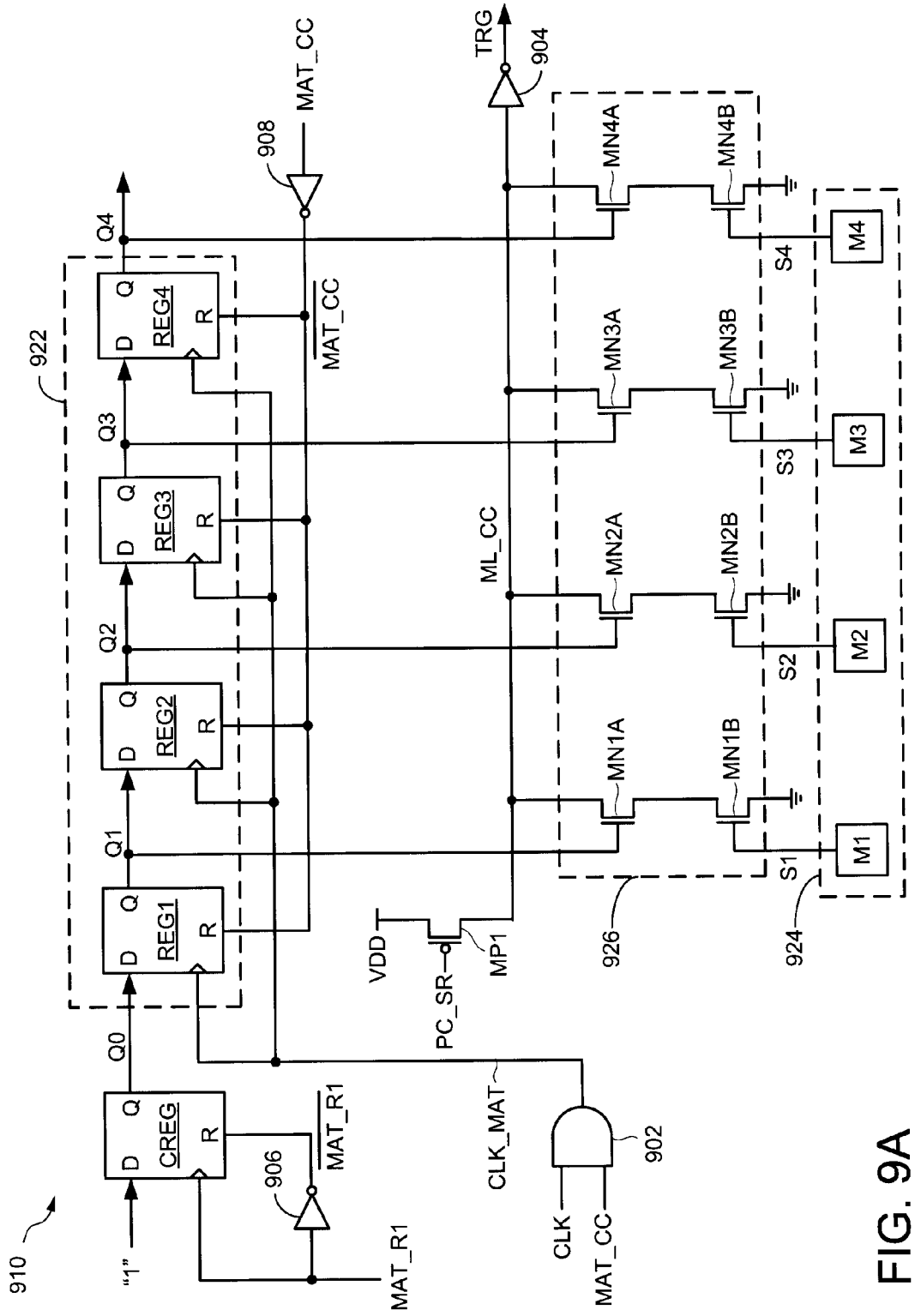
FIG. 9A shows a simplified block diagram of a first shift register circuit that is still another embodiment of the sequencing logic circuit of FIG. 6A.

For example, FIG. 9A shows a shift register circuit 910 that is another embodiment of the sequencing logic circuit 610 of FIG. 6A. As described below, shift register circuit 910 can maintain separate character match counts for multiple overlapping sequences of input characters at the same time, thereby allowing CAM arrays of present embodiments to store and implement search operations for regular expressions containing an overlapping intermediate expression R3=[C]{m} and a prefix string R1 using only one instance of a shift register circuit and without having to unroll the regular expression and store each instance of the character class in a separate group of CAM rows 110.

For the exemplary embodiment shown in FIG. 9A, shift register circuit 910 includes a 4-bit shift register 922, a 4-bit quantifier memory 924, and a 4-bit compare circuit 926 for simplicity only. For other embodiments, shift register 922 can be of any suitable length, quantifier memory 924 can have any suitable storage capacity, and compare circuit 926 can have any suitable number of comparators. Thus, the embodiment of shift register circuit 910 depicted in FIG. 9A is merely illustrative.

Shift register 922 is formed by the connection of four registers REG1-REG4 in a chain, where the output (Q) of each register is connected to the data input (D) of the next register. The Q output of the last register REG4 provides a data output terminal for the circuit 910. The clock input (>) of the shift registers REG1-REG4 are driven by a clocked match signal CLK_MAT that is generated as the logical AND combination of CLK and MAT_CC by AND gate 902. The reset input (R) of each register REG1-REG4 is driven by the signal $\overline{MAT\_CC}$, which is generated as the logical complement of MAT_CC by an inverter 908. The data input of the first register REG1 is coupled to the Q output of a control circuit GREG, which includes a data input (D) hardwired to logic "1." The control circuit GREG includes a clock input to receive MAT_R1, and a reset input (R) to receive $\overline{MAT\_R1}$, which is generated as the logical complement of MAT_R1 by inverter 906. As discussed above, MAT_R1 is generated by the R1 CAM rows to indicate a match with a regular expression's prefix string R1, and MAT_CC is generated by the R3 CAM rows to indicate a character class match.

Control circuit GREG and registers REG1-REG4 can be any suitable circuit element that can load an input signal in response to a clock signal. For some embodiments, registers REG1-REG4 can be flip-flops, or other well-known circuits. Further, as mentioned above, the shift register 922 shown in FIG. 9A is exemplary; for actual embodiments, shift register 922 can include any suitable numbers of registers or stages.

Quantifier memory 924 includes four memory elements M1-M4 for storing four quantifier state bits S1-S4, respectively. Memory elements M1-M4 can be any suitable type of storage element including, for example, EEPROM, EPROM, flash memory, SRAM cells, DRAM cells, fuses, and so on. Further, although depicted in FIG. 9A as individual storage elements, for other embodiments, storage elements M1-M4 can be organized in an array.

In accordance with some embodiments of the present invention, state bits S1-S4 can be programmed to embody a character class quantifier value {m} or range {m,n} specified by a regular expression. More specifically, in accordance with embodiments of FIG. 9A, the character class quantifier {m} is programmed as a decoded value into the memory cells M1-M4. For one example, if m=2, then the memory cells M1-M4 are programmed with the values "0," "1," "0," and "0," respectively, so that the memory 924 provides a decoded quantified number S[1:4]="0100" to the compare circuit 926. For another example, if m=4, then the memory cells M1-M4 are programmed with the values "0," "0," "0," and "1," respectively, so that the memory 924 provides a decoded quantified number S[1:4]="0001" to the compare circuit 926. To program a quantified range {m,n} into circuit 910, the value of "m" is programmed as a decoded value, as described above, and the remaining bits m+1 to n are set to logic "1."

Shift register circuit 910 includes a match line ML_CC that is selectively connected to the power rail VDD by a PMOS pre-charge transistor MP1 having a gate to receive an active low shift register pre-charge signal (PC_SR). For some embodiments, when PC_SR is asserted (e.g., to logic low), MP1 turns on and quickly pulls ML_CC high towards VDD, thereby pre-charging the ML_CC for compare operations, as described below. ML_CC is also coupled to the input of a logical inverter 904, which logically complements the signal on ML_CC to generate a trigger signal TRG at the OE terminal. For some embodiments, assertion of TRG (e.g., to logic high) indicates a character class match and enables the R2 CAM rows for compare operations with the next input character, for example, in a manner similar to that described above with respect to CAM arrays 600 and 700.

Compare circuit 926 includes four pairs of NMOS pull-down transistors MN1-MN4 connected in parallel with each other between ML_CC and ground potential, as shown in FIG. 9A. Each pull-down transistor pair includes a first gate coupled to the Q output of a corresponding one of the register registers REG1-REG4, and includes a second gate coupled to a corresponding one of the four memory elements M1-M4. Each pair of pull-down transistors compares the logic states of a corresponding register Q output and a corresponding quantifier state bit to selectively discharge ML_CC.

For example, pull-down transistors MN1A and MN1B are coupled in series between ML_CC and ground potential, with the gate of transistor MN1A coupled to the output Q1 of register REG1 and the gate of transistor MN1B coupled to receive bit S1 from memory cell M1. During search operations, if Q1 and S1 are both logic high (i.e., logic "1"), then pull-down transistors MN1A and MN1B turn on and discharge ML_CC towards ground potential. The resulting logic low state of ML_CC is logically inverted by inverter 904, which asserts TRG to logic high to indicate a quantifier character class match. Conversely, if either if Q1 and S1 is logic low (i.e., logic "0"), then one of pull-down transistors MN1A or MN1B turns off and does not discharge ML_CC towards ground potential. Thus, if none of the pairs of pull-down transistors discharge ML_CC, then ML_CC remains in its charged state, and in response thereto inverter 904 drives TRG to logic low to indicate a mismatch condition.

In general, the control circuit GREG drives the input of shift register 922 with an asserted logic "1" signal upon each assertion of MAT_R1, and drives the input of shift register 922 with a de-asserted logic "0" signal upon each de-assertion of MAT_R1. Each stage of shift register 922 latches its input signal upon assertion of MAT_CC, thereby shifting the data stored in shift register 922 by one position upon each assertion of MAT_CC. Thus, each time an input string matches the prefix string of a regular expression, an asserted character match bit is provided to the input of the shift register 922, and thereafter for each consecutive character class match, the asserted character match bit is shifted by one position in shift register 922. In this manner, each of a plurality of overlapping sequences of input characters that may possibly match the R1R3 portion of the regular expression is represented by a corresponding asserted character match bit stored in shift register 922. Compare circuit 926 compares the character match bits stored in shift register with corresponding bits of the decoded quantified number, and if there is a match asserts TRG (e.g., to logic high) to indicate that a corresponding sequence of m input characters matches the character class specified by the regular expression.

Figure 9B:
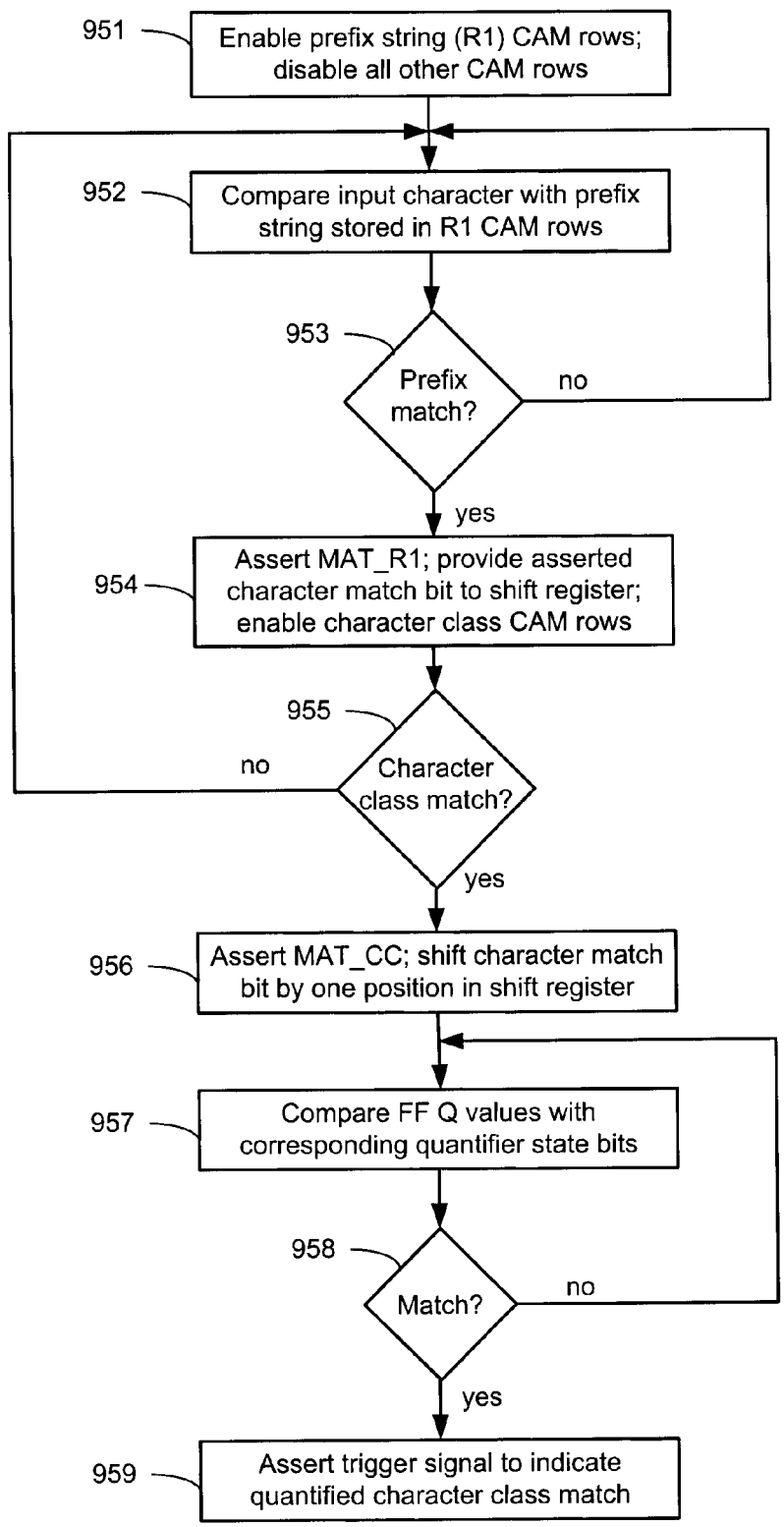
FIG. 9B is an illustrative flow chart depicting an exemplary search operation for embodiments of CAM array of FIGS. 1A-1C employing the shift register circuit of FIG. 9A.

An exemplary search operation performed using CAM array 600 employing shift register circuit 910 is described in more detail below with respect to the illustrative flow chart of FIG. 9B. It should be noted that a non-deterministic finite automata (NFA) can have several simultaneously active states, and that the NFA does not have to follow the sequential nature of the exemplary flow chart of FIG. 9B. First, all signals and nodes are initialized to zero, and the state bits are programmed into the state memory cells. More specifically, prior to string search operations, all register outputs Q0-Q4 are initialized to logic "0", TRG is set to logic low, the character class quantifier number {m} is programmed into state memory cells M1-M4, and PC_SR is pulsed to logic low so that transistor MP1 pre-charges ML_CC.

For the initial compare operation, the R1 CAM rows storing the prefix string are enabled, and all other CAM rows in the array are disabled (e.g., in the manner described above with respect to FIG. 4A) (951). Then, the current character of the input string is compared with the prefix string stored in the R1 CAM rows (952). If there is not a match, as tested at 953, the next input character is compared with data stored in the R1 CAM rows (952). More specifically, in response to the mismatch condition, the R1 CAM rows de-assert MAT_R1, which disables the character class CAM rows for the next compare operation. Further, because the character class CAM rows are disabled, TRG remains de-asserted, which disables the R2 CAM rows for the next compare operation, thereby minimizing power consumption.

Conversely, if the R1 CAM rows detect a match between a sequence of input characters and the prefix string, as tested at 953, MAT_R1 is asserted (e.g., to logic high), which causes the control circuit GREG to provide an asserted (e.g., logic high) character match bit to the input of shift register 922, and also enables the character class CAM rows for the next compare operation (954). More specifically, the assertion of MAT_R1 drives the clock input of control circuit GREG to logic high and the complemented signal $\overline{MAT\_R1}$ drives the reset input of control circuit GREG to logic low, which causes control circuit GREG to latch the "1" input signal at its D input and drive its output Q0 to logic high (e.g., to Q0=1). In this manner, assertion of MAT_R1 provides an asserted (e.g., "1") character match bit to the input of shift register 922.

Then, if the next input character matches the character class, the character class CAM rows assert MAT_CC (e.g., to logic high), which causes the asserted character match bit at Q0 to be latched by the first register REG1 of shift register 922 and drive the first register stage output Q1 to logic 1, thereby loading an asserted character match bit into the first stage of the shift register (954). More specifically, when MAT_CC is asserted to logic high, AND gate 902 drives CLK_MAT high on the next CLK transition, which in turn causes each register in the shift register 922 to latch its input signal (D) as the output signal (Q), thereby shifting all the match bits loaded therein by one register location. Otherwise, if the input character does not match the specified character class, processing continues at 952.

Thereafter, each time the character class CAM rows detect a match between an input character and the character class, as tested at 955, the character class CAM rows assert MAT_CC (e.g., to logic high), which causes the character match bits previously loaded into shift register 922 to shift by one position (e.g., to the next register) (956). More specifically, when MAT_CC is asserted to logic high, AND gate 902 drives CLK_MAT high on the next CLK transition, which in turn causes each register in the shift register 922 to latch its input signal (D) as the output signal (Q), thereby shifting all the match bits loaded therein by one register location. Otherwise, if the current input character does not match the specified character class, processing continues at 952.

Compare circuit 926 continually compares the register output values Q1-Q4 with the quantifier state bits S1-S4, respectively (956). If no pair of corresponding values of Q1-Q4 and S1-S4 are both equal to logic "1," as tested at 957, compare circuit 926 does not turn on and ML_CC remains in its charged state, which in turn drives the trigger signal TRG to a de-asserted state (958) Conversely, if corresponding values of Q1-Q4 and S1-S4 are both equal to logic "1," as tested at 957, compare circuit 926 discharges ML_CC towards ground potential, and in response thereto, inverter 904 asserts TRG to logic high to indicate that the quantified character class has been matched (958). Also, the asserted state of the trigger signal TRG, which is routed to the match input of the R2 CAM row, enables the R2 CAM rows for compare operations with the next input character.

For one example, if the quantifier m=2, the memory cells M1-M4 are programmed to store the decoded signal "0100." Because S2=1, transistor MN2B is conductive, while the logic low states of S1, S3, and S4 maintain transistors MN1B, MN3B, and MN4B in non-conductive states. Prior to search operations, Q1-Q4 are all set to "0," and thus pull-down transistors MN1A, MN2A, MN3A, and MN4A, respectively, are non-conductive and ML_CC is not discharged. During search operations, if MAT_CC is asserted twice in response to two character class matches, the logic "1" at Q0 is shifted twice through shift register 922 so that Q2=1 (e.g., and Q0-Q1 and Q3-Q4=0). Thus, because after two match cycles Q2=1, transistor MN2A turns on and discharges ML_CC to logic low. In response thereto, inverter 904 asserts TRG to logic high, thereby indicating the quantified character class match.

For another example, if the quantifier m=4, the memory cells M1-M4 are programmed to store the decoded signal "0001." Because S4=1, transistor MN4B is conductive, while the logic low states of S1, S2, and S3 maintain transistors MN1B, MN2B, and MN3B in non-conductive states. Prior to search operations, Q1-Q4 are all set to "0," and thus pull-down transistors MN1A, MN2A, MN3A, and MN4A, respectively, are non-conductive and ML_CC is not discharged. During compare operations, if MAT_CC is asserted four times in response to four character class matches, the logic "1" at Q0 is shifted four times through shift register 922 so that Q4=1 (e.g., and Q0-Q3=0). Thus, because after four match cycles both Q4=1 and S4=1, transistor MN4A turns on and discharges ML_CC to logic low. In response thereto, inverter 904 asserts TRG to logic high, thereby indicating the quantified character class match.

Conversely, if any input character does not match the character class prior to assertion of TRG by inverter 904, MAT_CC is de-asserted to logic low to indicate the mismatch condition between the input string and the regular expressions stored in the CAM array. In response to the logic low state of MAT_CC, inverter 908 asserts $\overline{MAT\_CC}$ to logic high, which resets all register output signals Q1-Q4 to logic "0."

Further, multiple overlapping character class sub-searches can be performed by register circuit 910 by latching and shifting multiple instances of logic "1" into the shift register 922 in a sequential manner. For example, as described above, an initial match between the input string and the R1 string of the regular expression results in an initial assertion of MAT_R1, which causes control circuit GREG to load a logic "1" as an input signal to the shift register 922, and if the next input character matches the character class, MAT_CC is asserted and causes the logic "1" value to shift by one register stage. If the next input character does not result in another R1 match, MAT_R1 is de-asserted, and in response thereto, MAT_R1 is asserted by inverter 906 and causes the output Q0 of the control circuit GREG to reset to logic "0" so that the next assertion of MAT_CC shifts a logic "0" into the first register REG1. However, if the next input character results in another R1 match, MAT_R1 is asserted and causes the control circuit GREG to drive its output Q0 to logic "1" so that the next assertion of MAT_CC shifts another logic "1" into the first register REG1. In this manner, multiple overlapping character class sub-searches triggered in response to multiple input characters resulting in simultaneously R1 string and R3 character class matches are represented by corresponding logic "1" values stored in shift register 922.

Figure 9C:
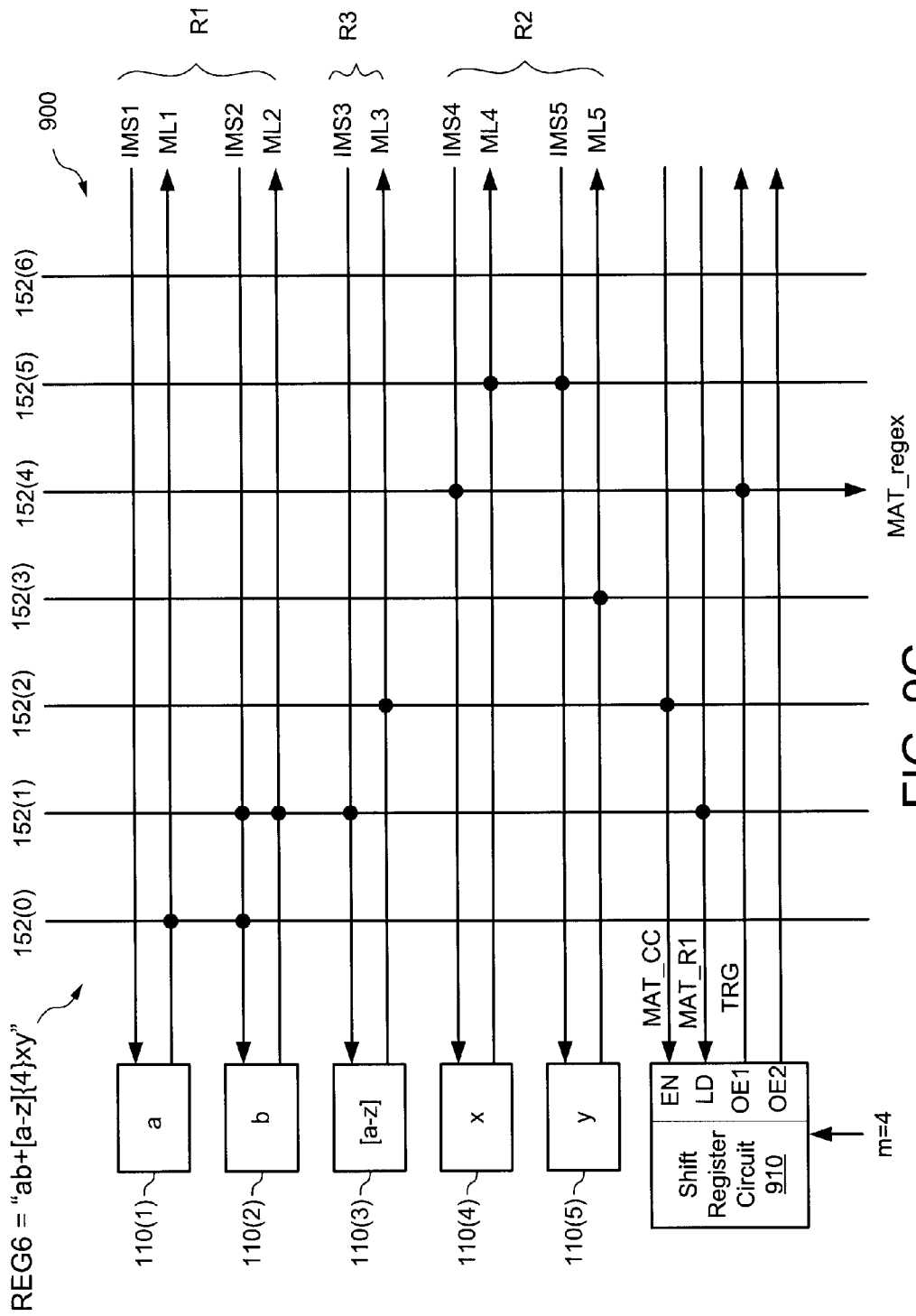
FIG. 9C shows an exemplary CAM array employing the shift register circuit of FIG. 9A configured to store the regular expression REG6="ab+[a–z]{4}xy"

FIG. 9C illustrates a CAM array 900 employing shift register circuit 910 and configured to store and implement search operations for REG5="ab+([a-z]){4}xy." For the exemplary configuration shown in FIG. 9C, CAM row 110(1) stores the character "a", CAM row 110(2) stores the character "b," CAM row 110(3) stores the character class [a-z], CAM row 110(4) stores the character "x," CAM row 110(5) stores the character "y," and the shift register circuit 910 stores the quantifier value m=4.

More specifically, CAM rows 110(1)-110(2) are connected together to form the R1 CAM rows that store the prefix string R1="ab+," where the "+" is implemented by routing the match signal from CAM row 110(2) on ML2 as a row enable signal to its input line IMS2 via PRS line 152(1). Also, the match signals from CAM row 110(2) are routed as a match signal MAT_R1 to enable character class CAM row 110(3) via IMS3 and PRS line 152(1), and is routed as MAT_R1 to the LD terminal of shift register circuit 910 via PRS line 152(1). CAM row 110(3) and shift register circuit 910 store and implement the intermediate expression R3=[a-z]{4}, where CAM row 110(3) is enabled by assertion of MAT_R1 from CAM row 110(2). CAM rows 110(4)-110(5) are connected to together as the R2 CAM rows that store the suffix string R2="xy." CAM row 110(4) is enabled for compare operations by assertion of TRG, which is provided from shift register circuit 910 to CAM row 110(4) via PRS line 152(4) and IMS4. Match signals from CAM row 110(4) on ML4 are provided as a row enable signal to "y" CAM row 110(5) via PRS line 152(5) and IMS5. CAM row 110(5) provides match signals indicative of a match condition between the input string and REG6, which can be accessed from anywhere in the CAM array on PRS line 152(6).

Thus, by programming the CAM cells of rows 110(1)-110 (5) with the character values "a," "b," [a-z], "x," and "y," respectively, programming the shift register circuit 910 with the specified quantifier value m=4, and configuring the signal lines 152 of the PRS 150 to selectively interconnect the match lines (ML) and the input match signal (IMS) lines of CAM rows 110(1)-110(5) with each other and to the I/O signal lines of shift register circuit 910 in the manner depicted in FIG. 9C, CAM array 900 is configured to store and implement search operations for the regular expression REG6="ab+[a-z]{4}xy" using only hardware components (e.g., thereby not requiring processors executing code that embodies a portion of the regular expression).

As described above, there are many types and forms of regular expressions. For purposes of discussion herein, regular expressions are classified into 4 types or levels according to their complexity. Regular expressions that include only strings and logical operators (e.g., such as ".", "|", and "*"), and that do not include any quantifiers, are classified as type-I or complexity level-I regular expressions. Regular expressions that include logical operators and specify a quantified number {m} of characters of a character class that does not overlap a preceding prefix string are classified as type-II or complexity level-II regular expressions. Regular expressions that include logical operators and specify a quantified number {m} of characters of a character class that overlaps a preceding prefix string are classified as type-III or complexity level-III regular expressions. Regular expressions that include logical operators and specify a quantified range {m,n} of characters of a character class that may overlap a preceding prefix string are classified as type-IV or complexity level-IV regular expressions.

For example, the regular expressions REG1="ab(cd|ef|gh) uv" and REG8="abc*de" are complexity level-I regular expressions because REG1 and REG8 include only logical operators (e.g., they do not include quantifier values {m} or {m,n}). The regular expression REG5="(b|k)[a]{3}c" is a complexity level-II regular expression because REG5 includes the quantifier {3} and the quantified character class [a] does not overlap or include the same characters as the preceding prefix string "b|k." The regular expression REG6="ab+([a-z]){4}xy" is a complexity level-III regular expression because REG6 includes the quantifier {4} and the quantified character class [a-z] overlaps the preceding prefix string "ab+". The regular expression REG7="ab+([a-z]){2,4}xy" is a complexity level-IV regular expression because REG7 includes a quantified range {2,4}.

Complexity level-I regular expressions can be stored in and searched for using embodiments of CAM device 100 that include the programmable interconnect structure (PRS) without the use of any of the sequencing logic circuits. Complexity level-II regular expressions can be stored in and searched for using embodiments of CAM device 100 that also include counter circuits 710, which as described above can be used to count the number of sequential characters of an input string that match a specified character class. Complexity level-III regular expressions can be stored in and searched for using embodiments of CAM device 100 that also include counter circuits 810 and/or shift register circuit 910, which as described above can be used to simultaneously maintain multiple counts of the number of sequential characters of an input string that match a specified character class. Complexity level-IV regular expressions can be stored in and searched for using embodiments of CAM device 100 that also include counter circuits 820, which as described above can be used to determine whether an input string includes a range of sequences of characters that match a specified character class.

Thus, in accordance with yet another embodiment of the present invention, a single integrated circuit device is disclosed that can implement search operations for regular expressions using a plurality of different CAM-based search engines, wherein each CAM-based search engine is dedicated or optimized to store and implement search operations for regular expressions of a corresponding complexity level. In this manner, the resources of each of the search engines can be optimized so that the resources are fully used, rather than idle. For example, because search operations for complexity level-I regular expressions can be performed using embodiments of CAM device 100 that do not include sequencing logic circuits, complexity level-I regular expressions are stored in a search engine implemented using embodiments of CAM arrays 101 that do not include any embodiment of sequencing logic circuits 610. Thus, although embodiments of CAM array 600 that include counters 810 or 820 can store and implement search operations for complexity level-I regular expressions, the counter circuits 810 or 820 would not be used during such search operations, and would therefore result in a less than optimum use of circuit area.

Figure 10A:
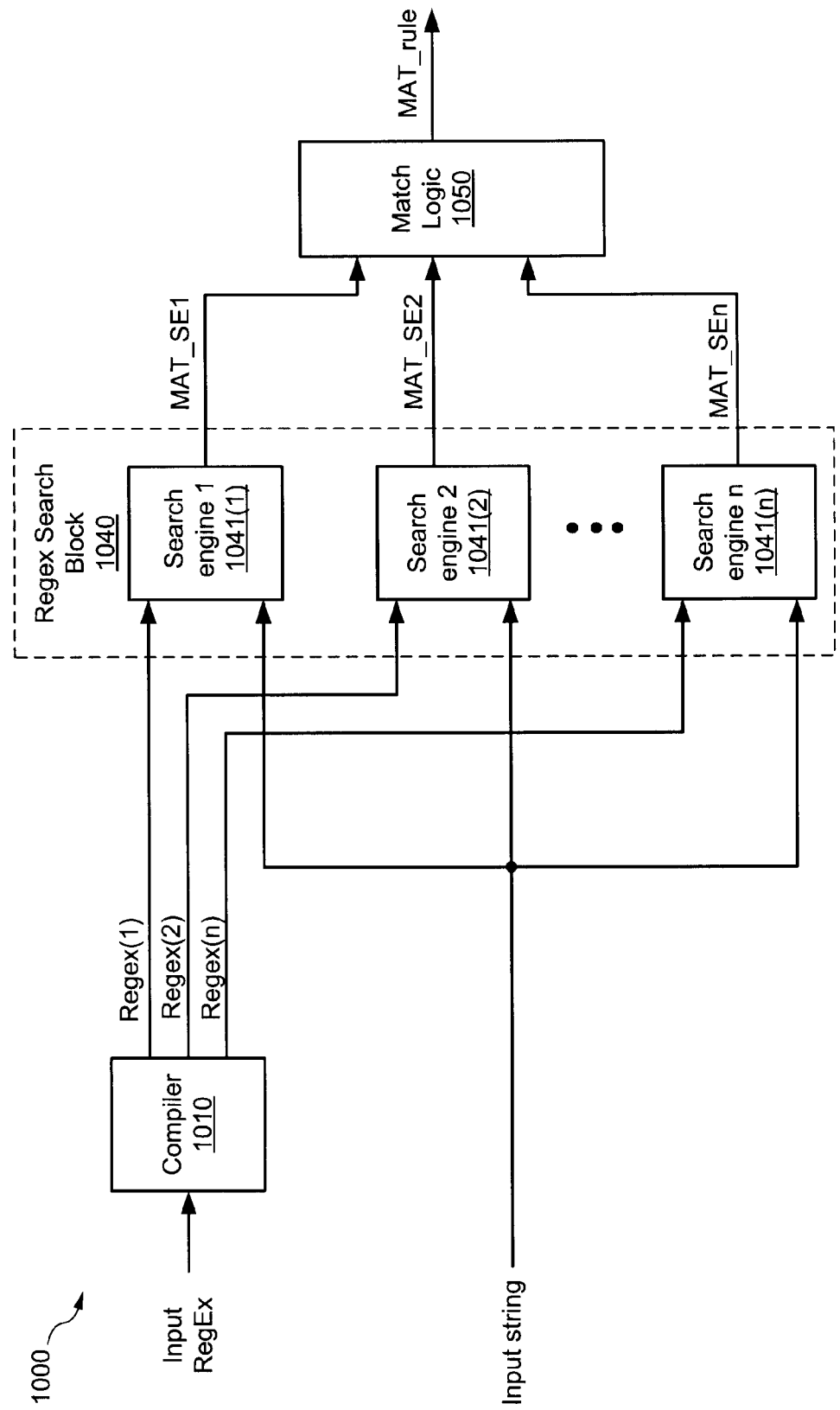
FIG. 10A shows a simplified functional diagram of an IC chip including a regular expression search block including a plurality of search engines in accordance with some embodiments of the present invention.

For example, FIG. 10A shows an integrated CAM-based search system 1000 that can store and implement search operations for various types or complexity levels of regular expressions. In accordance with some embodiments of the present invention, search system 1000 is formed as a single IC chip and includes a compiler 1010, a regular expression search block 1040, and match logic 1050.

Regular expression search block 1040 includes a plurality of search engines 1041(1)-1041(n), each of which is configured to store one or more regular expressions of a particular type or complexity level. Each search engine 1041 includes first inputs to receive one more regular expressions to be stored therein, second inputs to receive input strings to be compared with the regular expressions stored therein, and outputs to generate string search match signals (MAT_SE). For some embodiments, a first search engine 1041(1) is configured to store and implement search operations for complexity level-I regular expressions (e.g., REG1="ab (cd|ef|gh|)uv" and REG2="ab(c|d)"), a second search engine 1041(2) is configured to store and implement search operations for complexity level-II regular expressions (e.g., REG5="(b|k)[a]{3}c"), a third search engine 1041(3) is configured to store and implement search operations for complexity level-III regular expressions (e.g., REG6="ab+([a-z]){4}xy"), and a fourth search engine 1041(4) is configured to store and implement search operations for complexity level-IV regular expressions (e.g., REG7="ab+([a-z]){2,4}xy"). Further, for one embodiment, the search system 1000 can also include a fifth search engine 1041(5) that is configured to perform only exact string matches.

Figure 10B:
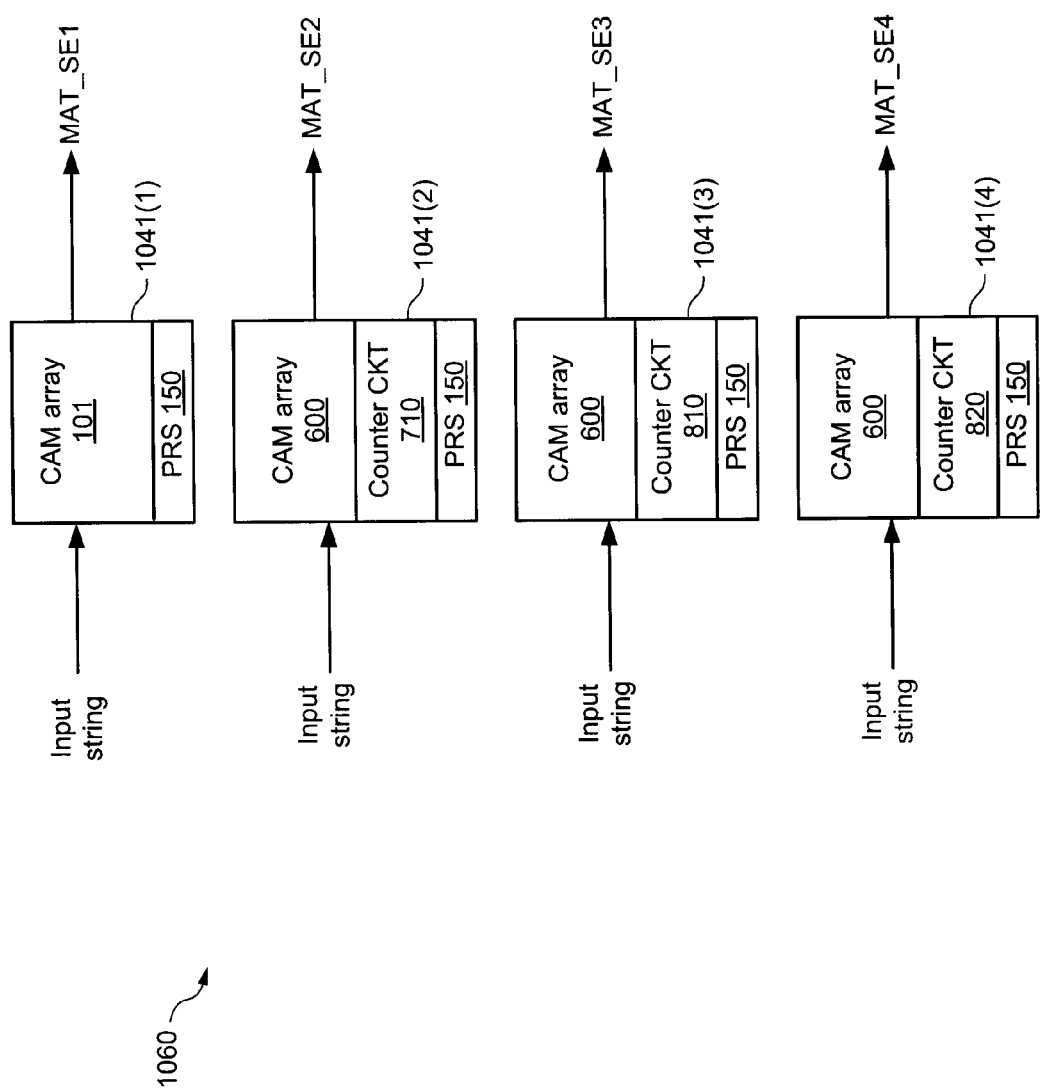
FIG. 10B shows block diagram of one exemplary embodiment of the search block of FIG. 10A.

For example, FIG. 10B shows a search block 1060 that is one embodiment of search block 1040 of FIG. 10A. For the regular expression search block 1060, the first search engine 1041(1) employs an embodiment of CAM array 101 having the PRS 150 in accordance with embodiments of the present invention, and is dedicated to store and implement search operations for complexity level-I regular expressions. CAM array 101 of search engine 1041(1) does not include any counter circuits or shift registers, and therefore consumes a minimal amount of circuit area and power. Thus, for example, regular expressions such as REG1="ab(cd|ef|gh|)uv" and REG2="ab(c|d)" can be stored and searched in CAM array 100 of search engine 1041(1).

The second search engine 1041(2) employs an embodiment of CAM array 600 having the PRS 150 and counter circuits 710 in accordance with embodiments of the present invention, and is dedicated to store and implement search operations for complexity level-II regular expressions. Because CAM array 600 of search engine 1041(2) includes one or more counter circuits 710, search engine 1041(2) can be dedicated to store and implement search operations for complexity level-II regular expressions such as REG5="(b|k)[a]{3}c." Thus, although search engine 1041(2) is larger and more complex than search engine 1041(1), the inclusion of counter circuits 710 within search engine 1041(2) allows search engine 1041(2) to store and implement search operations for complexity level-II regular expressions, which are more complex than complexity level-I regular expressions. Further, although search engine 1041(2) can store and implement search operations for complexity level-I regular expressions, the counter circuit 710 would not be used during such search operations, and therefore would not result in an optimal use of resources.

The third search engine 1041(3) employs an embodiment of CAM array 600 having the PRS 150 and counter circuits 810 in accordance with embodiments of the present invention, and is dedicated to store and implement search operations for complexity level-III regular expressions. Because CAM array 600 of search engine 1041(3) includes one or more counter circuits 810, search engine 1041(3) can be dedicated to store and implement search operations for complexity level-III regular expressions such as REG6="ab+([a-z]){4}xy." Thus, although search engine 1041(3) is larger and more complex than search engines 1041(1)-1041(2), the inclusion of counter circuits 810 within search engine 1041(3) allows search engine 1041(3) to store and implement search operations for complexity level-III regular expressions, which are more complex than complexity level-II regular expressions. Note that complexity level-III regular expressions cannot be stored in search engine 1041(1) or 1041(2) because embodiments of counter circuit 810 are required to implement search operations for complexity level-III regular expressions which have a quantified character class that overlaps the preceding prefix string. Further, although search engine 1041(3) can store and implement search operations for complexity level-II regular expressions, the counter circuit 810 is larger and more complex than counter circuit 710, which is sufficient for searching complexity level-II regular expressions.

The fourth search engine 1041(4) employs an embodiment of CAM array 600 having the PRS 150 and counter circuit 820 in accordance with embodiments of the present invention, and is dedicated to store and implement search operations for complexity level-IV regular expressions. Because CAM array 600 of search engine 1041(4) includes one or more counter circuits 820, search engine 1041(4) can be dedicated to store and implement search operations for complexity level-IV regular expressions such as REG7="ab+([a-z]){2,4}xy." Thus, although search engine 1041(4) is larger and more complex than search engines 1041(1)-1041(3), the inclusion of counter circuits 820 within search engine 1041(4) allows search engine 1041(4) to store and implement search operations for complexity level-IV regular expressions, which are more complex than complexity level-III regular expressions, complexity level-II regular expressions, and complexity level-I regular expressions. Note that complexity level-IV regular expressions cannot be stored in search engines 1041(1) or 1041(2) or 1041(3) because embodiments of counter circuit 820 are required to implement search operations for complexity level-IV regular expressions which have a quantified range {m,n} of characters of a specified character class. Further, although search engine 1041(4) can store and implement search operations for regular expressions of lower complexity levels, its resources would not be fully utilized.

Further, although not shown for simplicity, for some embodiments, the search block 1060 can also include a fifth search engine 1041(5) that is configured to perform only string matches. For such embodiments, the fifth search engine 1041(5) can employ a conventional CAM device (e.g., that does not include the PRS 150), thereby minimizing circuit area and power consumption.

Referring again to FIG. 10A, compiler 1010 includes an input to receive regular expressions that are to be stored in the search block 1040, and has dedicated outputs connected to each of the search engines 1041(1)-1041(n). In accordance with embodiments of the present invention, compiler 1010 examines each input regular expression to determine the type (e.g., the complexity level) of the regular expression, determines which of search engines 1041 can most efficiently store and implement search operations for each regular expression, and in response thereto forwards each regular expression to the search engine 1041 that is configured (e.g., dedicated) to store and implement search operations for regular expressions of the same type or complexity level. For example, for the exemplary embodiment of FIG. 10B, compiler 1010 forwards complexity level-I regular expressions (e.g., that include only strings and logical operators) as regex(1) to first search engine 1041(1), forwards complexity level-II regular expressions (e.g., that include only strings, logical operators, and character classes that do not overlap with the prefix string) as regex(2) to second search engine 1041(2), forwards complexity level-III regular expressions (e.g., that include only strings, logical operators, and character classes that overlap with the prefix string) as regex(3) to third search engine 1041(3), and forwards complexity level-IV regular expressions (e.g., that include strings, logical operators, and character classes having any quantifier value or ranges that can overlap with the R1 prefix string) as regex(4) to fourth search engine 1041(4).

During search operations, the input string is provided to the search engines 1041, each search engine 1041 searches the input string for the regular expressions stored therein, and outputs the match signals (MAT_SE) to match signal logic 1050. In response thereto, match signal logic 1050 combines the match information provided by the search engines 1041 to generate match results for the corresponding rule (MAT_rule).

As described above with respect to FIGS. 1A-1C, each CAM row 110 generates a match signal on ML that can be selectively provided to priority encoder 130 and/or selectively provided as an input match signal to any number of arbitrarily selected CAM rows 110 at the same time via PRS 150. In this manner, the CAM rows 110 can be selectively connected together in a chain having any number of parallel branches and connected to various embodiments of sequencing logic circuit 610 via PRS 150 in a manner that allows embodiments of the CAM device described above with respect to FIGS. 1A-1C to store and implement search operations for regular expressions of various complexities in a more efficient manner (e.g., using fewer numbers of CAM rows) than conventional CAM devices that do not employ a programmable interconnect structure in accordance with present embodiments. However, because the signal routing resources of the PRS 150 are limited (e.g., each signal line of the PRS 150 consumes valuable silicon area and also requires dedicated switching circuitry to connect the signal line to various numbers of CAM rows in the array), relying upon the PRS 150 to interconnect all the CAM rows in the array can undesirably limit the number of possible configurations of the CAM array, and therefore also undesirably limit the number of regular expressions stored therein.

Figure 12:
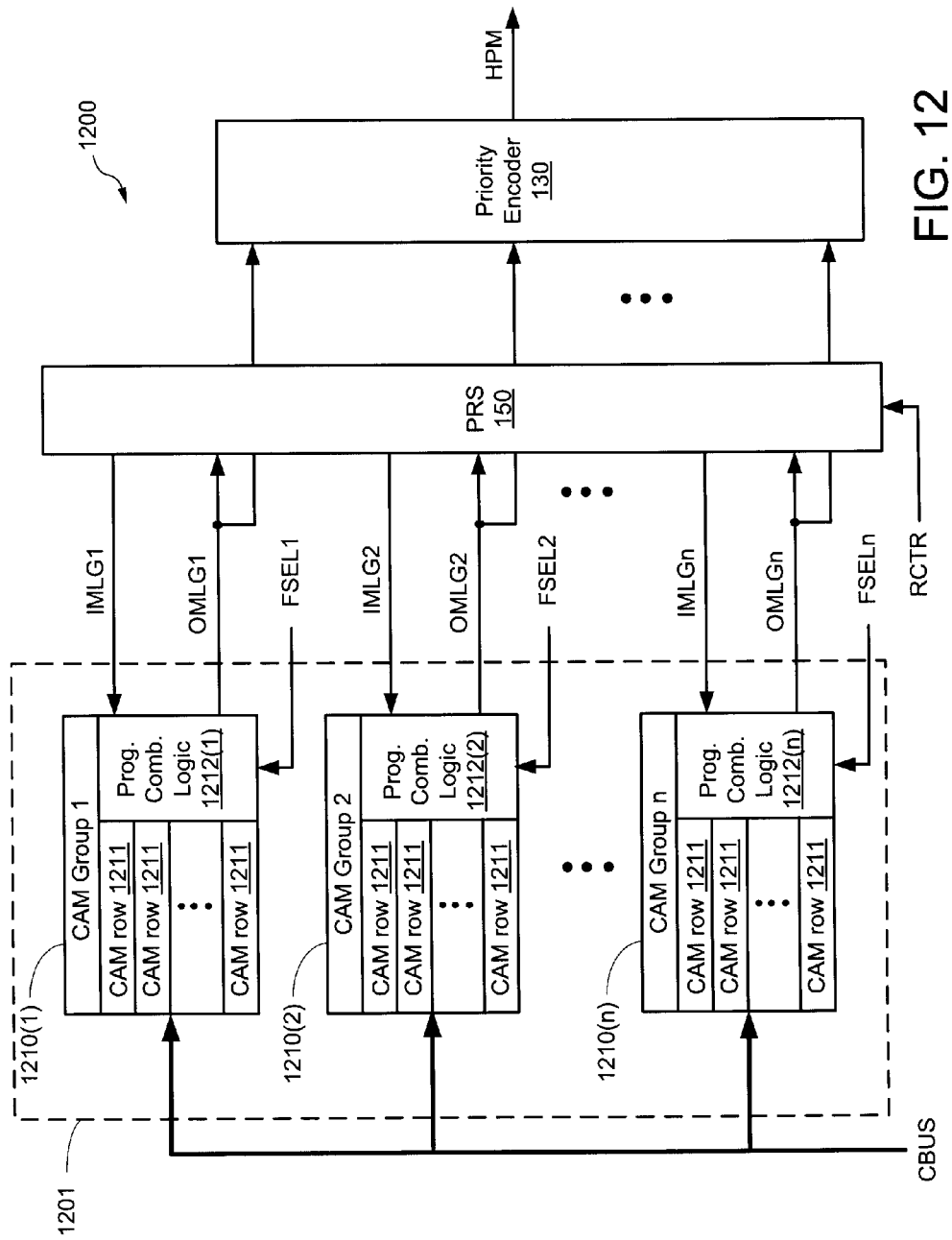
FIG. 12 shows a simplified block diagram of a content addressable memory (CAM) device having a plurality of independently configurable CAM blocks and the PRS in accordance with other embodiments of the present invention.

Therefore, FIG. 12 shows a CAM device 1200 in accordance with other embodiments of the present invention. CAM device 1200 is shown as including a CAM array 1201 having a plurality of independently configurable CAM groups 1210(1)-1210(n), with each CAM group 1210 including a number of CAM rows 1211 and a programmable combinational logic circuit 1212. The group's CAM rows 1211 can be selectively cascaded to each other using local routing lines and associated cascade enable circuits (not shown in FIG. 12 for simplicity) provided within the group, and the programmable combinational logic circuit 1212 can logically combine the match signals of its associated CAM rows 1211 to generate a group output match signal OMLG according to a selected one of a plurality of logical expressions, where each logical expression can include any combination of logic AND, logic OR, and/or logic NOT functions. Thus, each CAM group 1210 can be configured to store a corresponding one of a plurality of sub-expressions of a regular expression without using the resources of the PRS 150, and the CAM groups 1210 can be selectively interconnected by the PRS 150 in response to routing control signals (RCTR) that embody the logical relationships between the sub-expressions of the regular expression. In this manner, embodiments of CAM device 1200 can store and implement search operations for regular expressions using less resources of the PRS 150 than embodiments described above with respect to FIGS. 1A-1C.

For example, the regular expression REG9="acid (rain|trip)" can be represented as three sub-expressions SXP1="acid," SXP2="rain," and SXP3="trip," where the result of the logic OR function of "rain" and "trip" is logically combined with "acid" using the logic AND function. Thus, assuming each CAM row 1211 stores a binary encoded representation of a single alphanumeric character (e.g., such as the well-known ASCII-encoded characters), a first CAM group 1210(1) including four locally interconnected CAM rows 1211 can be configured to store SXP1="acid," a second CAM group 1210(2) including four locally interconnected CAM rows 1211 can be configured to store SXP2="rain," a third CAM group 1210(3) including four locally interconnected CAM rows 1211 can be configured to store SXP3="trip," and the PRS 150 can be configured to route the group match signal from the first CAM group 1210(1) as the input match signal to the second and third CAM groups 1210(2)-1210(3) simultaneously so that a prefix match with "acid" in the first CAM group 1210(1) can trigger simultaneous searches for "rain" and "trip" in the second and third CAM groups 1210(2)-1210(3), respectively. In this manner, the regular expression REG9="acid(rain|trip)" can be stored in CAM device 1200 using only one signal routing line of the PRS 150 that provides the match signal of "acid" as a trigger signal to "rain" and "trip." In contrast, to store REG9 in the embodiments described above with respect to FIGS. 1A-1C, 3 signal lines are required to interconnect the CAM rows storing the string "acid," 3 signal lines of the PRS 150 are required to interconnect the CAM rows storing the string "rain," 3 signal lines of the PRS 150 are required to interconnect the CAM rows storing the string "trip," and 1 signal line of the PRS 150 is required to connect the match signal of "acid" as the input match signal to the first row storing "rain" and to the first row storing "trip," thereby requiring a total of 3+3+3+1=10 signal routing lines of the PRS 150.

More specifically, CAM device 1200 includes a CAM array 1201, PRS 150, and priority encoder 130. CAM array 1201 includes a plurality of CAM groups 1210(1)-1210(n), each having a data input to receive a search key from the comparand bus CBUS, a match input coupled to the PRS 150 via a group input match line IMLG, a match output coupled to PRS 150 and to priority encoder 130 via a group output match line OMLG, and a control input to receive a corresponding function select signal FSEL. For simplicity, other components of CAM device 1200, such as instruction decoder 120, read/write circuit 125, and configuration circuit 160 described above with respect to FIG. 1A are not shown in FIG. 12.

Each CAM group 1210 includes a plurality of CAM rows 1211 and a programmable combinational logic (PCL) circuit 1212. Each CAM row 1211 includes a plurality of CAM cells (not shown in FIG. 12) for storing a data word (e.g., such as a binary encoded character), and provides a row match signal to PCL circuit 1212 during compare operations between the search key and data stored in the CAM rows. In response to the corresponding function select signal FSEL, PCL circuit 1212 selects one of a plurality of logical expressions to employ to logically combine the row match signals to generate the corresponding group match signal, wherein the plurality of selectable logical expressions can include a combination of logic AND functions, logic OR functions, and/or logic NOT functions performed on the row match signals. In this manner, each CAM block 12010 can store virtually any simple sub-expression (e.g., regular expressions including logical operators but no quantified character classes). The group match signals generated locally within the CAM groups 1210(1)-1210(n) are provided on corresponding group output match lines OMLG1-OMLGn, respectively.

The PRS 150 includes inputs to receive the group match signals, and in response to the routing control signal RCTR selectively routes the group match signal from each CAM group 1210 as an input match signal to any number of other arbitrarily selected CAM groups 1210(1)-1210(n) via group input match lines IMLG1-IMLGn, respectively. The architecture and operation of PRS 150 is described above with respect to the embodiments of FIGS. 1A-1C, and thus its description is not repeated again. The input match signal provided to each CAM group 1210 can participate in the generation of the group match signal for the CAM group. For some embodiments, the group output match signal generated by one CAM group 1210 in a previous compare operation can be used as the input match signal to selectively enable one or more CAM rows 1211 of other CAM groups 1210 to participate in a next compare operation.

Priority encoder 130 includes inputs to receive the group match signals from CAM groups 1210(1)-1210(n), and in response thereto generates the index of the highest priority matching (HPM) CAM group 1210. Although not shown in FIG. 12 for simplicity, for some embodiments, the PCL circuit 1212 provided within each CAM group 1210 can include gating logic that selectively provides the group match signal to priority encoder 130. For example, if the strings stored in CAM groups 1210(1) and 1210(2) are logically connected together in a cascaded chain by PRS 150 to implement a logic AND function of the two strings, then the PCL circuit 1212(1) of CAM group 1210(1) can prevent its group match signal from being provided to priority encoder 130, while the PCL circuit 1212(2) of CAM group 1210(2) can allow its group match signal to be provided to priority encoder 130 to participate in the generation of the HPM index.

Although not shown in FIG. 12 for simplicity, CAM device 1200 can include any number of the various embodiments of the sequencing logic circuits 610 described above, for example, to store quantified character classes included in many regular expressions.

Figure 13:
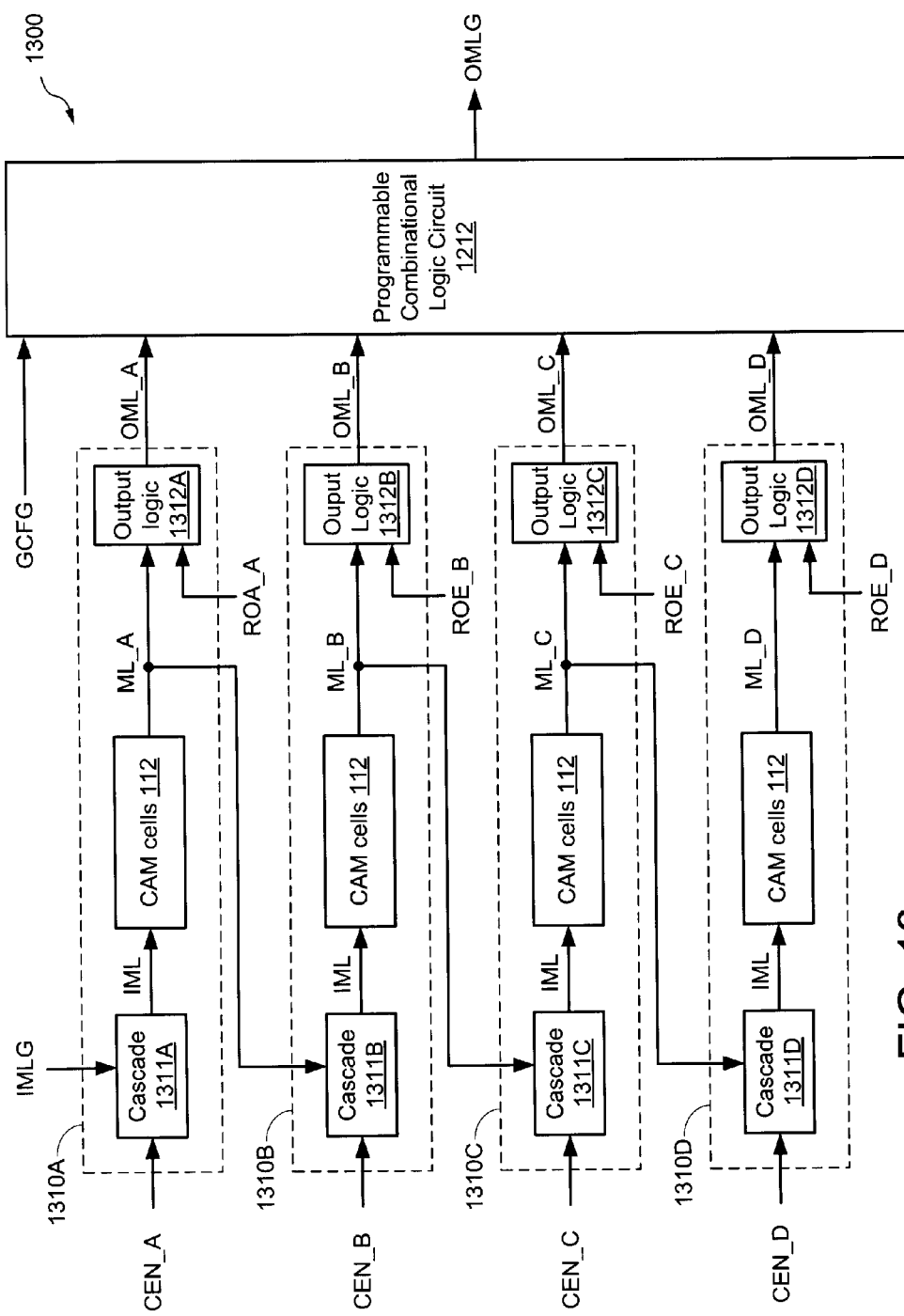
FIG. 13 shows a simplified block diagram of one embodiment of the independently configurable CAM block of FIG. 12.

FIG. 13 shows a CAM group 1300 that is one embodiment of CAM groups 1210 of FIG. 12. For the exemplary embodiment of FIG. 13, CAM group 1300 is shown to include 4 CAM rows 1310A-1310D. Of course, for actual embodiments, CAM group 1300 can include any suitable number of CAM rows 1310. Further, for some embodiments, each CAM group 1300 includes a predetermined number N of CAM rows 1310, for example, so that a regular expression can be stored in embodiments of CAM device 1200 by segmenting the regular expression into a number of N-character sub-expressions, storing each sub-expression in a corresponding CAM group 1300, and configuring the PRS 150 to selectively interconnect the CAM groups 1300 in a manner that allows CAM device 1200 to implement search operations for regular expressions. For other embodiments, each CAM group 1300 can be configured to include a selectable number of CAM rows 1310.

Each CAM row 1310 includes a cascade enable circuit 1311, a plurality of CAM cells 112, and an output logic circuit 1312. CAM cells 112, which can be any suitable CAM cells including binary CAM cells, ternary CAM cells, or quaternary CAM cells, are coupled to a row match line ML that generates a row match signal during compare operations between a search key and data stored in the CAM cells 112.

Cascade enable circuit 1311 includes a match input to receive the match signal from a previous CAM row in CAM group 1300, a control terminal to receive a corresponding cascade enable (CEN) signal, and an output coupled to CAM cells 112. As shown in FIG. 13, the control terminal of cascade enable circuit 1311A in the first CAM row 1310A receives a group match signal from another CAM group 1300 (e.g., via the PRS 150). For each CAM row 1310, the cascade enable circuit 1311 selectively enables its CAM cells 112 to participate in compare operations in response to a logical combination of CEN and its input match signal (e.g., the match signal from the previous CAM row). For example, if CEN is de-asserted, cascade enable circuit 1311 enables CAM cells 112 to participate in a compare operation regardless of its input match signal, and if CEN is asserted, cascade enable logic 1311 selectively enables CAM cells 112 to participate in the compare operation only if the input match signal is asserted. Thus, when CEN is asserted, the previous CAM row is cascade connected to form a data word that spans both rows. For regular expression searching, the characters stored in the two CAM rows are logically ANDed together. For some embodiments, cascade enable circuit 1311 can be the match line pre-charge circuit 402, for example, described above with respect to FIG. 4A.

Output logic 1312 includes a data input to receive the row match signal on ML, a control terminal to receive a corresponding row output enable (ROE) signal, and an output to provide a latched match signal to PCL circuit 1212 via a corresponding row output match line OML. The row output enable signal controls whether output logic 1312 forwards the row match signals received from CAM cells 112 on ML to the PCL circuit 1212 via the OML. For example, if ROE is asserted, output logic 1312 forwards the row match signal to PCL circuit 1212, and if ROE is de-asserted, output logic 1312 does not forward the row match signal to PCL circuit 1212. For some embodiments, output logic 1312 can be an AND gate. For other embodiments, output logic 1312 can be any suitable latch or register circuit that selectively forwards the row match signal to PCL circuit 1212 in response to ROE.

Thus, for the exemplary embodiment of FIG. 13, the CEN and ROE signals form row configuration data for each CAM row 1310 that allows CAM rows 1310A-1310D to be selectively connected together in a chain. In this manner, adjacent CAM rows 1310 of CAM group 1300 can be cascaded together to implement logic AND functions of data stored therein. For one example, CAM group 1300 can store the string "acid" without using resources of the PRS 150 by storing the characters "a," "c," "i," and "d" in the CAM cells 112 of rows 1310A-1310D, respectively, asserting all cascade enable signals CEN_A-CEN_D, asserting the last row output enable signal ROE_D, and de-asserting the other row output enable signals ROE_A-ROE_C. In this manner, the match signal of each of CAM rows 1310A-1310C selectively enables the match signals of the next CAM row, with the last CAM row 1310D generating a match signal on OML_D indicating whether an input string matches the string "acid" stored in CAM group 1300.

PCL circuit 1212 logically combines the row match signals received from CAM rows 1310A-1310D to generate the group output match signal on OMLG using logical operations selected by a group configuration signal GCFG. For some embodiments, GCFG can cause PCL circuit 1212 to logically combine the row match signals using logic AND, logic OR, and/or logic NOT functions, as described in more detail below. Together, the row configuration signals represented by CEN and ROE and the group configuration signal (GCFG) form the function select signal (FSEL) of FIG. 12, which as described above determines which logical operations CAM group 1300 employs to logically combine the row match signals to generate the group match signal.

For some embodiments, each CAM row 1310 is configured to store a suitably binary-encoded alphanumeric character (e.g., using the ASCII encoding technique), and thus the CAM group 1300 of FIG. 13 can store any 4-character sub-expression that employs logic AND functions, logic OR functions, and/or logic NOT functions, and during search operations the group output match signal generated by PCL circuit 1212 on OMLG can indicate a match condition between an input string and the corresponding sub-expression. Further, the PRS 150 can selectively route the group match signal from each CAM group 1300 as the input match signal to any number of other arbitrarily selected CAM groups at the same time in response to a routing control signal that embodies the logical relationship between the plurality of sub-expressions that form the regular expression.

Figure 14:
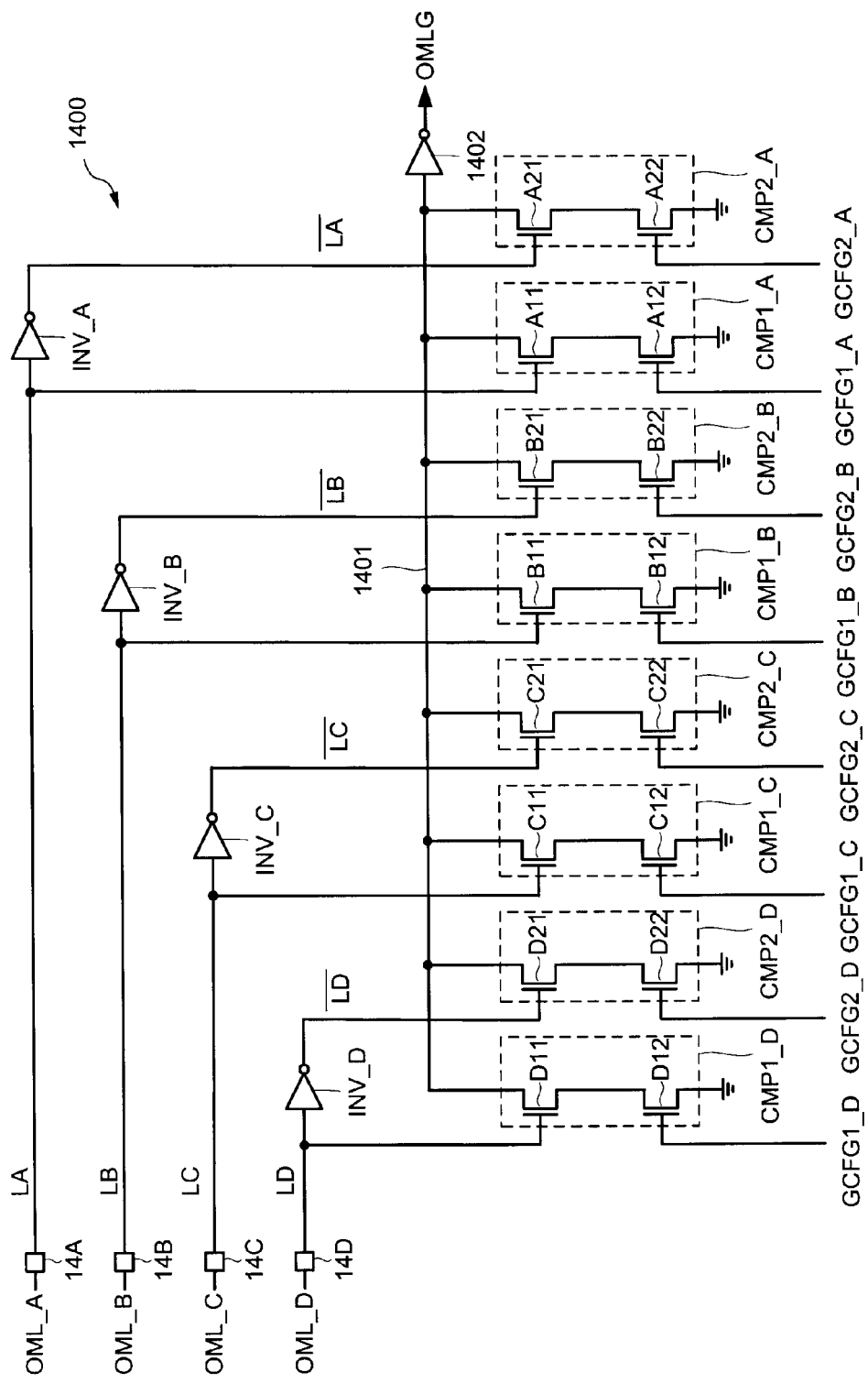
FIG. 14 shows a circuit diagram of one embodiment of the programmable combinational logic circuit of FIGS. 12-13.

FIG. 14 shows a PCL circuit 1400 that is one embodiment of the PCL circuit 1212 of FIGS. 12 and 13. PCL circuit 1400 includes a plurality of inputs 14A-14D, a plurality of invertors INV_A-INV_D and inverter 1402, a plurality of first comparators CMP1, a plurality of second comparators CMP2, a group match line 1401, and a group output match line OMLG. Inputs 14A-14D receive corresponding latched row match signals LA-LD from row output match lines OML_A-OML_D, respectively, of CAM group 1300 of FIG. 13. Invertors INV_A-INV_D, which are well-known, logically complement signals LA-LD to generate complemented match signals LA-LD, respectively. Each of the first comparators CMP1 includes a pair of NMOS pull-down transistors connected in series between the group match line 1401 and ground potential, with the gate of one transistor receiving the latched match signal from a corresponding CAM row 1310 of FIG. 13, and the gate of the other transistor receiving a corresponding first bit (GCFG1) of the group configuration signal. Each of the second comparators CMP2 includes a pair of pull-down NMOS transistors connected in series between the group match line 1401 and ground potential, with the gate of one transistor receiving the complemented match signal from a corresponding inverter, and the gate of the other transistor receiving a corresponding second bit (GCFG2) of the group configuration signal.

For example, comparator CMP1_D includes pull-down transistors D11 and D12 connected in series between group match line 1401 and ground potential, with the gate of transistor D11 coupled to receive the row match signal LD from row 1310D of FIG. 13 and the gate of transistor D12 coupled to receive a first configuration bit GCFG1_D, while comparator CMP2_D includes pull-down transistors D21 and D22 connected in series between group match line 1401 and ground potential, with the gate of transistor D21 coupled to receive the complemented row match signal LD from inverter INV_D and the gate of transistor D22 coupled to receive a second configuration bit GCFG2_D. Together, CGFG1_D and CFG2_D form a group configuration bit pair for a corresponding CAM row of FIG. 13.

In operation, each of the first comparators CMP1 compares a corresponding row match signal and a corresponding first group configuration bit to selectively discharge group match line 1401, and each of the second comparators CMP2 compares a corresponding complemented row match signal and a corresponding second group configuration bit to selectively discharge the group match line 1401. Thus, for comparator CMP1_D, if LD and GCFG1_D are both logic high (i.e., logic "1"), then both pull-down transistors D11 and D12 turn on and discharge group match line 1401 towards ground potential, and if either LD or GCFG1_D is logic low (i.e., logic "0"), then one of pull-down transistors D11 and D12 turns off and prevents comparator CMP1_D from discharging the group match line 1401 to ground potential. Inverter 1402 complements the logic state on the group match line 1401 to generate the group output match signal on OMLG. For exemplary embodiments described herein, an asserted (e.g., logic high) group match signal on OMLG indicates a group match condition, and a de-asserted (e.g., logic low) group match signal on OMLG indicates a group mismatch condition.

The first and second sets of configuration bits GCFG1 and GCFG2, which collectively form the group configuration signal GCFG of FIG. 13, selectively determine which of a plurality of different logic operations PCL circuit 1400 uses to logically combine the row match signals LA-LD to generate the group match signal OMLG. As mentioned above, embodiments of PCL circuit 1400 can logically combine the row match signals from a corresponding CAM group according to various combinations of logic AND functions, logic OR functions, and logic NOT functions.

More specifically, referring to FIGS. 13-14, to store and implement search operations for a 4-character sub-expression using CAM group 1300, each character is stored in the CAM cells 112 of a corresponding CAM row 1310, the row configuration bits CEN and ROE are driven to suitable states to selectively connect the CAM rows together in a chain and to selectively provide the row match signals to the PCL circuit 1212, and the group configuration signal is driven to a state that causes the PCL circuit to combine the row match signals using a logic expression indicative of the sub-expression.

For one example, to store and implement search operations for the regular expression REG10="a|b|c|d" in CAM group 1300, the binary encoded representations of the characters "a," "b," "c," and "d" are stored in CAM cells 112 of rows 1310A-1310D, respectively, CEN_A-CEN_D are all de-asserted so that the CAM rows 1310 are not connected together, and ROE_A-ROE_D are asserted so that all row match signals LA-LD are provided to PCL circuit 1212. Then, referring to FIG. 14, all of the corresponding first bits of the group configuration signal (GCGF1) are asserted to logic high to enable the first comparators CMP1, and all of the corresponding second bits of the group configuration signal (GCGF2) are de-asserted to logic low to disable the second comparators CMP2. In this manner, if an input character matches any of the characters stored in rows 1310A-1310D, its match line is asserted and causes the corresponding first comparator to discharge match line 1401, which in turn drives OMLG to logic high via inverter 1402.

For another example, to store and implement search operations for the regular expression REG11="ā|b|c|d" in CAM group 1300, the binary encoded representations of the characters "a," "b," "c," and "d" are stored in CAM cells 112 of rows 1310A-1310D, respectively, CEN_A-CEN_D are all de-asserted so that the CAM rows 1310 are not connected together, and ROE_A-ROE_D are asserted so that all row match signals LA-LD are provided to PCL circuit 1212. Then, referring to FIG. 14, GCFG1_A is de-asserted, GCFG1_B-GCFG1_D are asserted, GCFG2_A is asserted, and GCFG2_B-GCFG2_D are de-asserted. In this manner, if an input character matches any of the characters "b," "c," or "d" stored in rows 1310B-1310D, its match line is asserted and causes the corresponding first comparator to discharge match line 1401, which in turn drives OMLG to logic high via inverter 1402. Further, if there is a mismatch condition in first CAM row 1310A storing "a," the logic low signal on OML_A is inverted by inverter INV_A and turns on pull-down transistor A21. Because GCFG_2A is asserted, comparator CMP2_A discharges match line 1401, which in turn drives OMLG to logic high via inverter 1402, thereby implementing the logic NOT function.

Further, if it desired to store an expression of less than 4 characters in CAM block 1300, the group configuration bit pair corresponding to each un-occupied CAM row 1310 can be de-asserted to disable the corresponding comparators of PCL circuit 1400. For example, to store the string "a|b|c" in CAM block 1300, the binary encoded representations of the characters "a," "b," and "c" can be stored in CAM cells 112 of rows 1310A-1310C, respectively, and CAM row 1310D is un-occupied. The CEN signals, the ROE signals, and the first three group configuration bit pairs can be set as described above with respect to the REG10 example. To ensure that CAM row 1300D does not participate in the compare operation, both GCFG1_D and GCFG2_D are de-asserted to disable comparators CMP1_D and CMP2_D, thereby preventing CAM row 1310D from participating in the compare operation.

Although not shown in FIG. 14 for simplicity, the group configuration bits GCFG1 and GCFG2 can be stored in a suitable memory element, and/or can be provided to PCL circuit 1400 during configuration of embodiments of the CAM device of FIG. 12.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative sense rather than a restrictive sense. For example, although the PRS 150 is described above as being programmed with configuration data, for other embodiments, the PRS 150 can be hardwired to implement a number of regular expressions, and each rule can be mapped to different portion of the CAM array.

What is claimed is:

1. A search system including a shift register circuit for detecting whether one or more overlapping sequences of input characters match a regular expression including a prefix string preceding an intermediate expression having a quantified number m of characters belonging to a specified character class, the shift register circuit comprising:
    a control circuit having an input responsive to a prefix match signal indicative of whether an input character sequence matches the prefix string, and having an output, wherein the control circuit is configured to produce an output signal that varies based on whether the input character sequence matches the prefix string;
    a shift register having an input connected to the output of the control circuit and including a number of registers connected in a chain, each register having a data output connected to a data input of the next register in the chain and each having a clock input to receive a clocked match signal that represents a logic combination of a clock signal and a character class match signal, the clocked match signal indicating whether a current input character matches the character class;
    a compare circuit having a first input to receive a bitwise decoded version of the quantified number, having second inputs coupled to the shift register, and having an output for generating a trigger signal indicating that a sequence of m input characters matches the character class; and
    a programmable quantifier memory configured to be programmed with the bitwise decoded version of the quantified number and to output the bitwise decoded version of the quantified number to the first input of the compare circuit.

2. The search system of claim 1, wherein each assertion of the prefix match signal causes the control circuit to provide an asserted character match bit to the shift register input, and each assertion of the character class match signal shifts the character match bits by one position in the shift register.

3. The search system of claim 2, wherein de-assertion of the prefix match signal causes the control circuit to provide a de-asserted character match bit to the shift register input.

4. The search system of claim 3, wherein the control circuit includes a reset terminal to receive a logical complement of the prefix match signal.

5. The search system of claim 2, wherein each overlapping sequence of input characters that matches the character class is represented by a corresponding asserted character match bit stored in the shift register.

6. The search system of claim 1, wherein the compare circuit asserts the trigger signal if the asserted character match bit is shifted into the $m^{th}$ register of the shift register.

7. The search system of claim 1, wherein each of the registers includes a reset terminal to receive a logical complement of the character class match signal.

8. The search system of claim 7, wherein de-assertion of the character class match signal resets the shift register to an initial state and forces de-assertion of the trigger signal.

9. The search system of claim 1, wherein the programmable quantifier memory comprises an array of storage elements, and wherein the bitwise decoded version of the quantified number is programmed into the array of storage elements.

10. The search system of claim 9, wherein the compare circuit comprises:
    a number of comparators, each comparator having a first input to receive a corresponding one of the state bits, a second input coupled to the output of a corresponding register, and an output coupled to a character class match line that generates the trigger signal.

11. The search system of claim 10, wherein each comparator discharges the character class match line to logic low to assert the trigger signal only if the corresponding character match bit and the corresponding state bit are both asserted.

12. The search system of claim 10, wherein each comparator comprises:
    first and second pull-down transistors connected in series between the character class match line and ground potential, wherein the first transistor has a gate coupled to the output of the corresponding register, and the second transistor has a gate to receive the corresponding state bit.

13. The search system of claim 10, wherein the shift register circuit further comprises:
    a pre-charge transistor connected between a voltage supply and the character class match line and having a gate to receive a shift register pre-charge signal.

14. The search system of claim 1, further including a content addressable memory (CAM) device comprising:
    a first row of CAM cells configured to store the prefix string and to generate the prefix match signal; and
    a second row of CAM cells configured to store the character class and to generate the character class match signal.

15. The search system of claim 14, wherein assertion of the character class match signal enables the second row of CAM cells in a next compare operation to detect a subsequent character class match.

16. The search system of claim 14, wherein the regular expression further includes a suffix string following the intermediate expression, and the CAM device further comprises:
    a third row of CAM cells configured to store the suffix string.

17. The search system of claim 16, wherein the third row of CAM cells is enabled for a next compare operation to detect a suffix string match in response to assertion of the trigger signal.

18. The search system of claim 10, wherein the trigger signal represents a logic compliment of the character class match line.

19. A method for detecting whether one or more overlapping sequences of input characters match a regular expression including a prefix string preceding an intermediate expression having a quantified number m of characters belonging to a specified character class, comprising:

receiving, at a control circuit, a prefix match signal indicative of whether an input character sequence matches the prefix string;

generating an output signal based on the prefix match signal;

receiving the output signal at a shift register having a plurality of registers connected in a chain;

receiving, at each of the plurality of registers, a clocked match signal that represents a logic combination of a clock signal and a character class match signal, the clocked match signal indicating whether a current input character matches the character class;

programming a quantifier memory with a bitwise decoded version of the quantified number;

receiving, at a compare circuit, the bitwise decoded version of the quantified number and an output signal from the shift register; and generating, at the compare circuit, a trigger signal indicating that a sequence of m input characters matches the character class.

20. The method of claim 19, further comprising:

providing, by the control circuit, an asserted character match bit to the shift register upon each assertion of the prefix match signal; and shifting the character match bits by one position in the shift register upon each assertion of the character class match signal.

* * * * *